(12) United States Patent
Noguchi et al.

(10) Patent No.: US 7,084,063 B2
(45) Date of Patent: Aug. 1, 2006

(54) FABRICATION METHOD OF SEMICONDUCTOR INTEGRATED CIRCUIT DEVICE

(75) Inventors: Junji Noguchi, Ome (JP); Shoji Asaka, Hanno (JP); Nobuhiro Konishi, Ome (JP); Naohumi Ohashi, Hanno (JP); Hiroyuki Maruyama, Ome (JP)

(73) Assignee: Hitachi, Ltd., Tokyo (JP)

( * ) Notice: Subject to any disclaimer, the term of this patent is extended or adjusted under 35 U.S.C. 154(b) by 69 days.

(21) Appl. No.: 10/742,932

(22) Filed: Dec. 23, 2003

(65) Prior Publication Data

US 2004/0147127 A1    Jul. 29, 2004

Related U.S. Application Data

(63) Continuation of application No. 09/965,220, filed on Sep. 28, 2001, now Pat. No. 6,723,631.

(30) Foreign Application Priority Data

Sep. 29, 2000    (JP)    ............................ 2000-300853

(51) Int. Cl.
*H01L 21/302*    (2006.01)

(52) U.S. Cl. ...................... 438/691; 438/710; 438/715; 134/1.2

(58) Field of Classification Search ................ 438/623, 438/624, 691, 692, 704, 710, 715; 134/1.1, 134/12

See application file for complete search history.

(56) References Cited

U.S. PATENT DOCUMENTS

| | | | |
|---|---|---|---|
| 5,989,353 A * | 11/1999 | Skee et al. ...................... 134/2 |
| 6,048,789 A | 4/2000 | Vines et al. | |
| 6,136,680 A | 10/2000 | Lai et al. | |
| 6,143,658 A | 11/2000 | Donnelly, Jr. et al. | |
| 6,159,857 A | 12/2000 | Liu et al. | |
| 6,165,894 A | 12/2000 | Pramanick et al. | |
| 6,171,957 B1 | 1/2001 | Maekawa | |
| 6,174,810 B1 | 1/2001 | Islam et al. | |
| 6,181,012 B1 | 1/2001 | Edelstein et al. | |
| 6,191,007 B1 | 2/2001 | Matsui et al. | |
| 6,242,349 B1 | 6/2001 | Nogami et al. | |
| 6,274,923 B1 * | 8/2001 | Mikagi ........................ 257/642 |
| 6,291,007 B1 | 9/2001 | White et al. | |
| 6,303,505 B1 * | 10/2001 | Ngo et al. .................... 438/687 |
| 6,348,402 B1 | 2/2002 | Kawanoue et al. | |
| 6,355,571 B1 | 3/2002 | Huang et al. | |

(Continued)

FOREIGN PATENT DOCUMENTS

JP    06-037038    2/1994

(Continued)

OTHER PUBLICATIONS

Process Focus; Semiconductor World 1998, 10; pp. 62-63 and 70-72.

*Primary Examiner*—Lan Vinh
(74) *Attorney, Agent, or Firm*—Antonelli, Terry, Stout and Kraus, LLP.

(57) ABSTRACT

The copper interconnect formed by the use of a damascene technique is improved in dielectric breakdown strength (reliability). During post-CMP cleaning, alkali cleaning, a deoxidizing process due to hydrogen annealing or the like, and acid cleaning are carried out in this order. After the post-CMP cleaning and before forming an insulation film for a cap film, hydrogen plasma and ammonia plasma processes are carried out on the semiconductor substrate. In this way, a copper-based buried interconnect is formed in an interlayer insulation film structured of an insulation material having a low dielectric constant.

12 Claims, 79 Drawing Sheets

U.S. PATENT DOCUMENTS

| | | |
|---|---|---|
| 6,482,755 B1 | 11/2002 | Ngo et al. |
| 6,521,532 B1 | 2/2003 | Cunningham |
| 6,534,397 B1 | 3/2003 | Okada et al. |
| 2001/0052351 A1* | 12/2001 | Brown et al. ............ 134/2 |
| 2002/0102834 A1 | 8/2002 | Yang |
| 2002/0119651 A1 | 8/2002 | Noguchi et al. |

FOREIGN PATENT DOCUMENTS

| | | |
|---|---|---|
| JP | 06-224194 | 8/1994 |
| JP | 09-082798 | 3/1997 |
| JP | 10-261715 | 9/1998 |
| JP | 11-016912 | 1/1999 |
| JP | 11-330246 | 11/1999 |

* cited by examiner

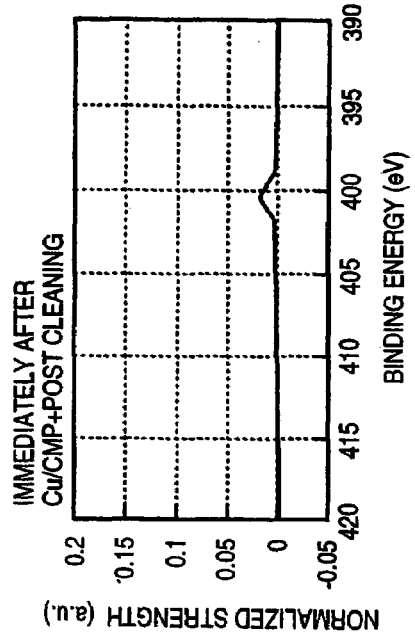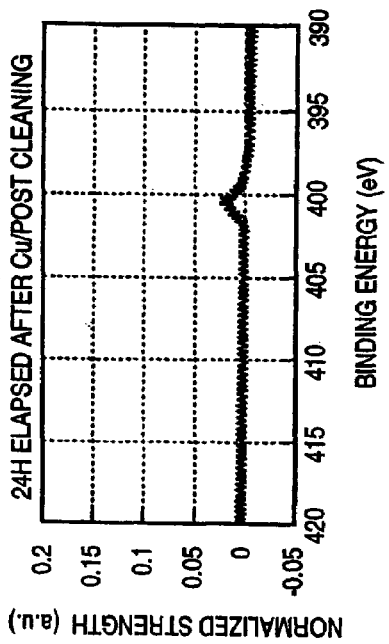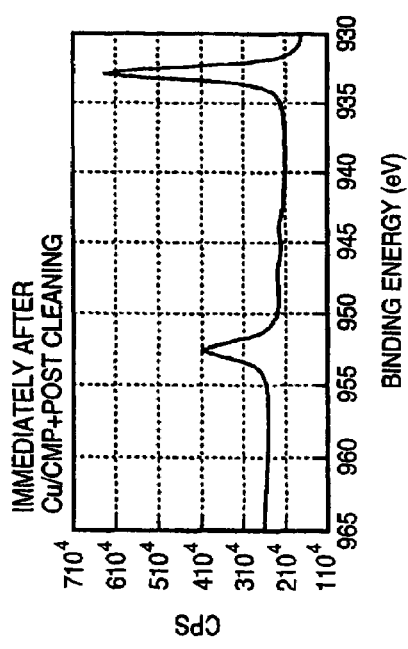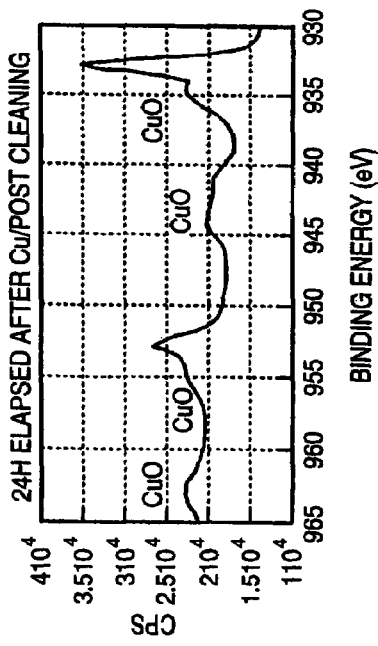

FIG. 13 (a)
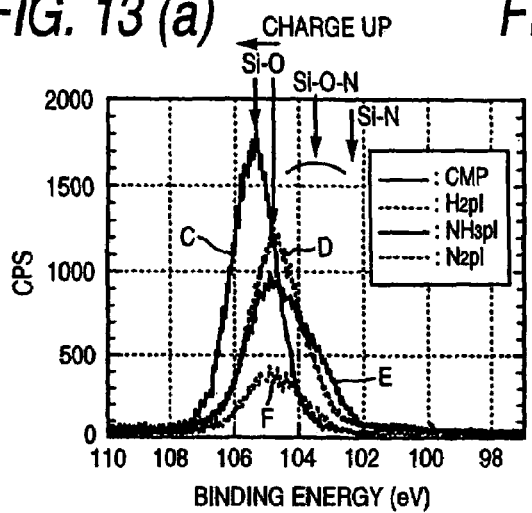
FIG. 13 (b)
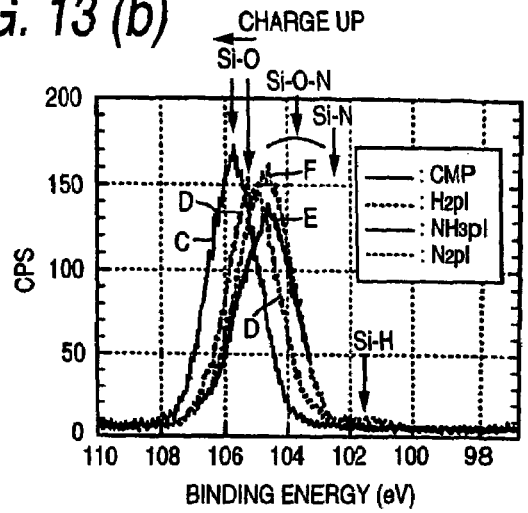
FIG. 13 (c)
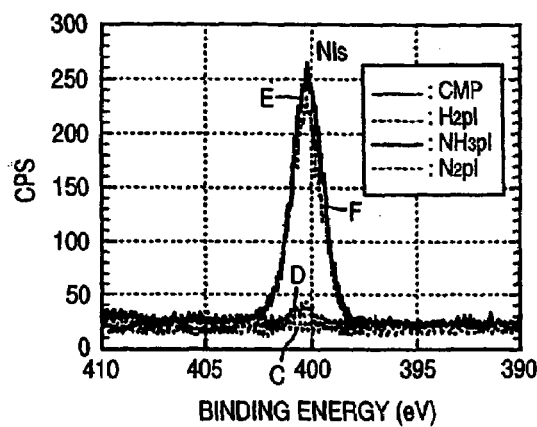
FIG. 13 (d)
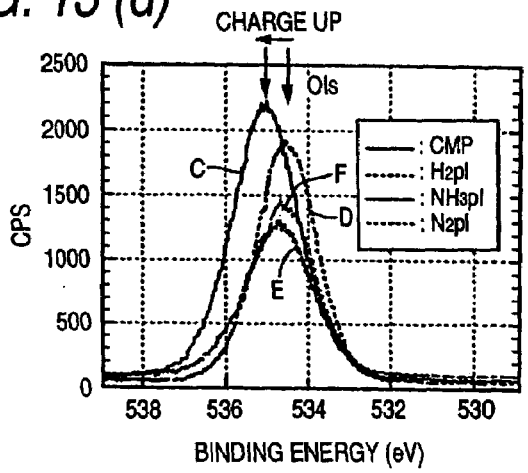
FIG. 13 (e)
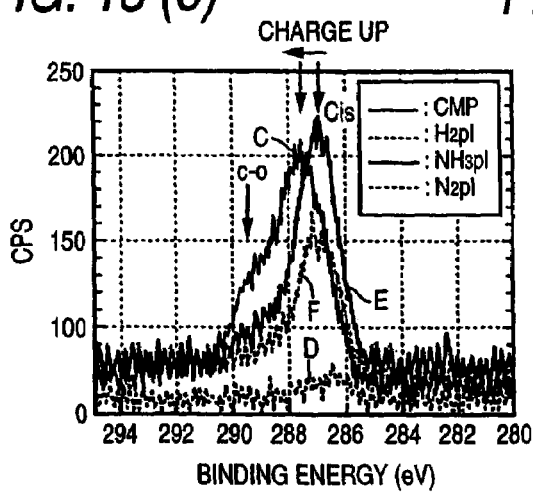
FIG. 13 (f)
| CONDITION | Si3Nx |
|---|---|
| CMP | — |
| H2pl | Si3N1.08 |
| NH3pl | Si3N4.22 |
| N2pl | Si3N3.81 |

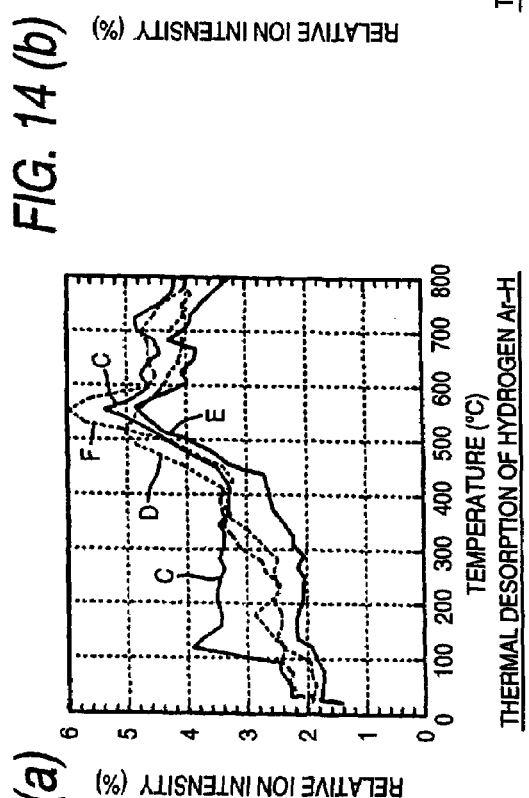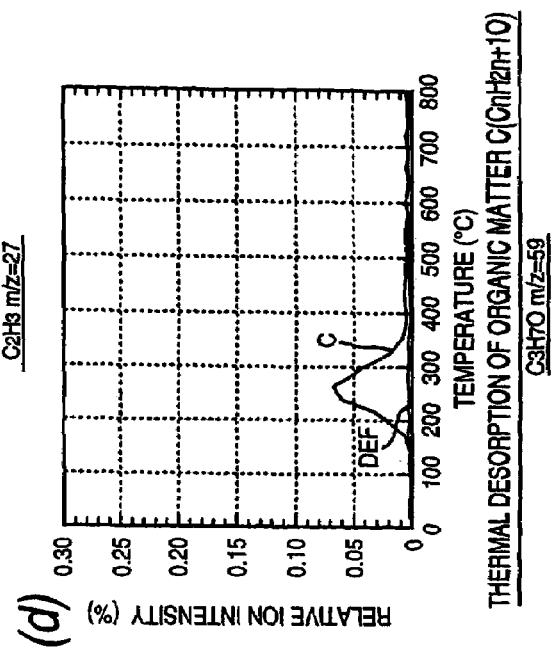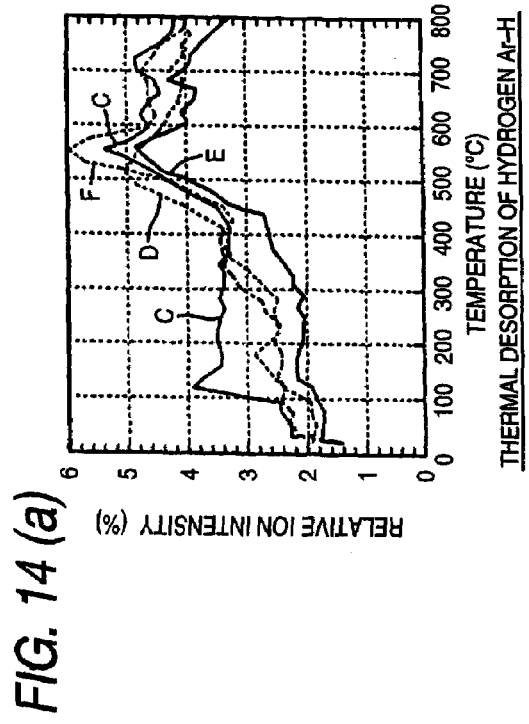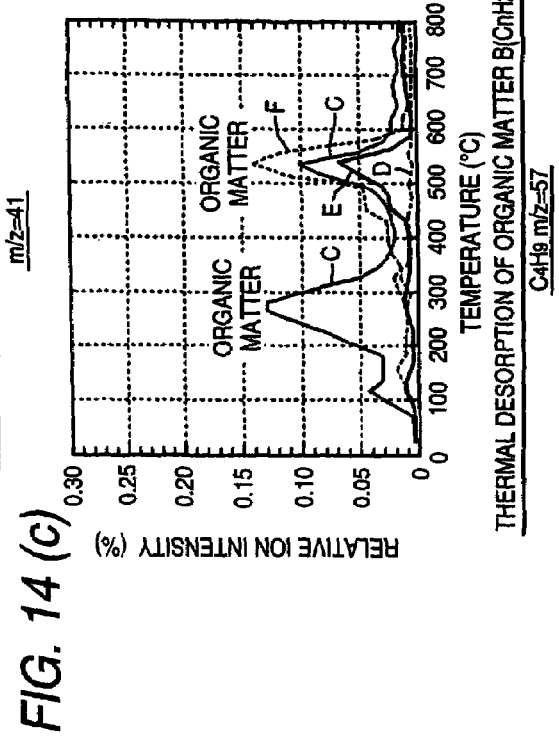

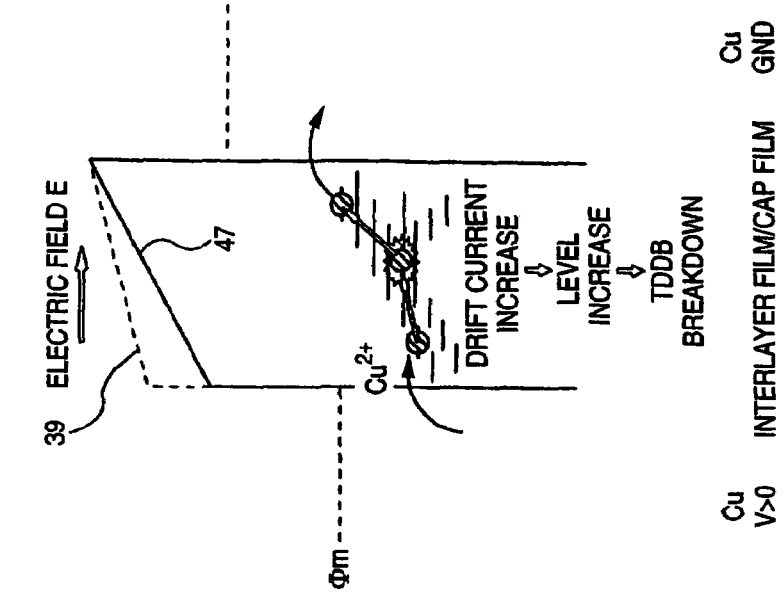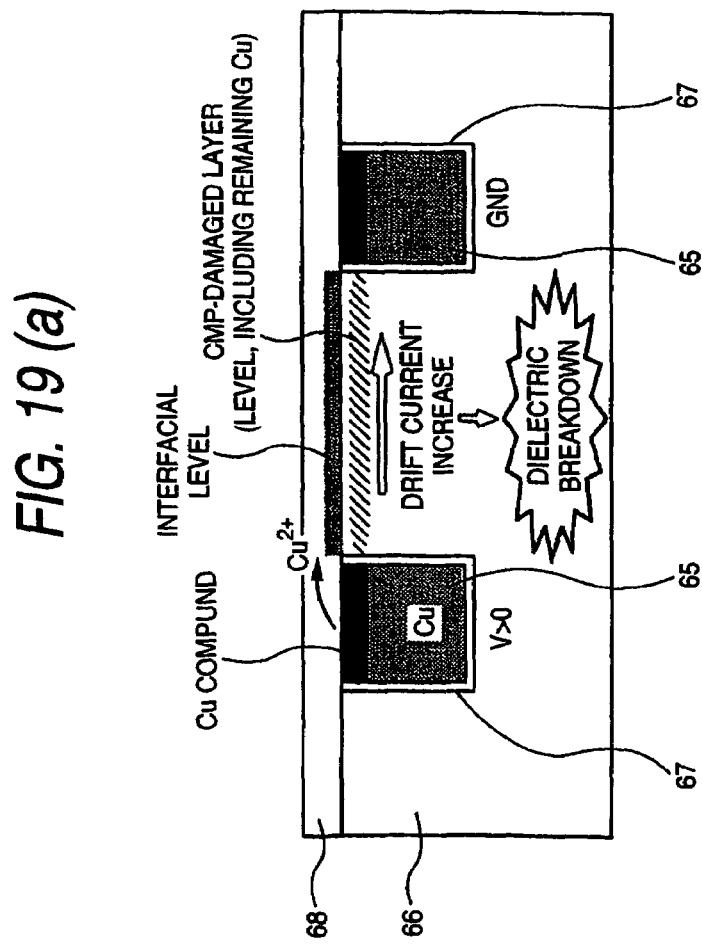

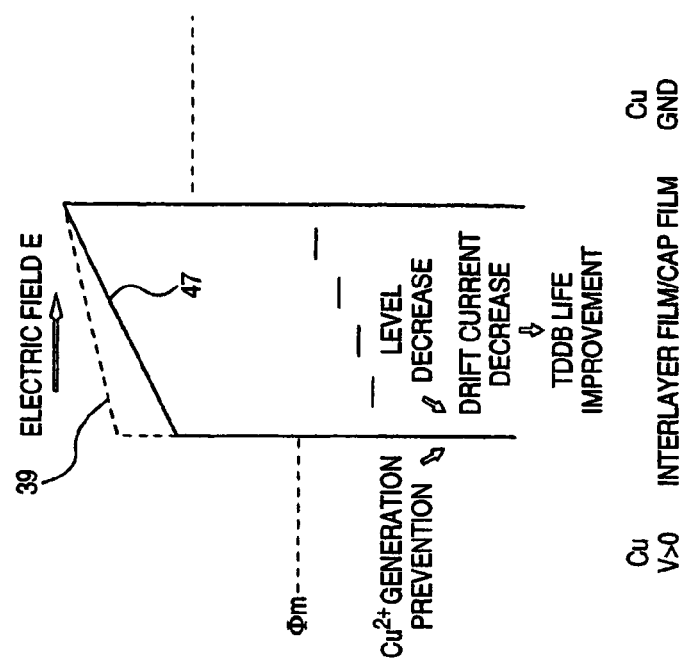
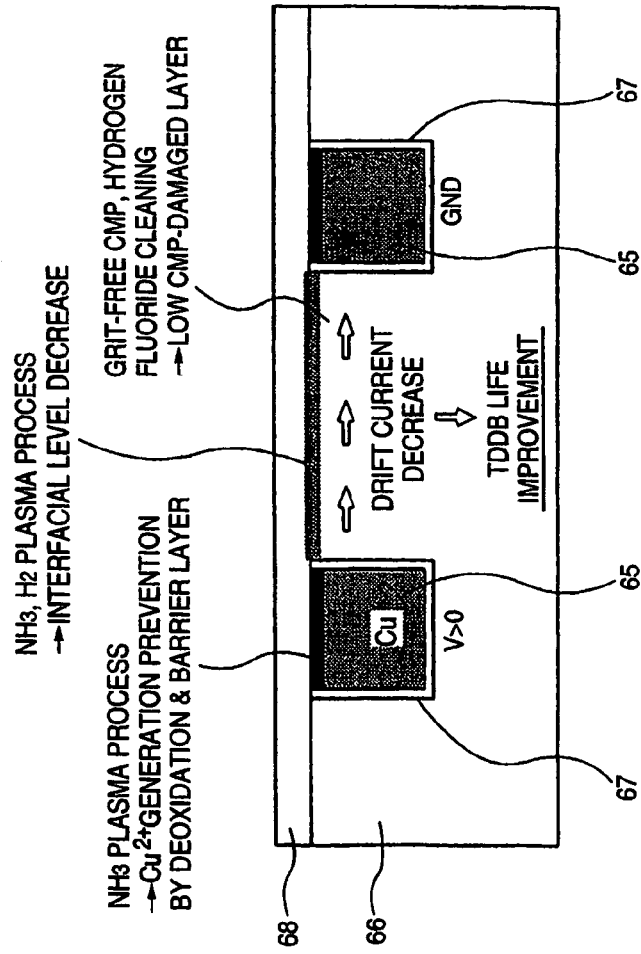
FIG. 20 (a)
FIG. 20 (b)

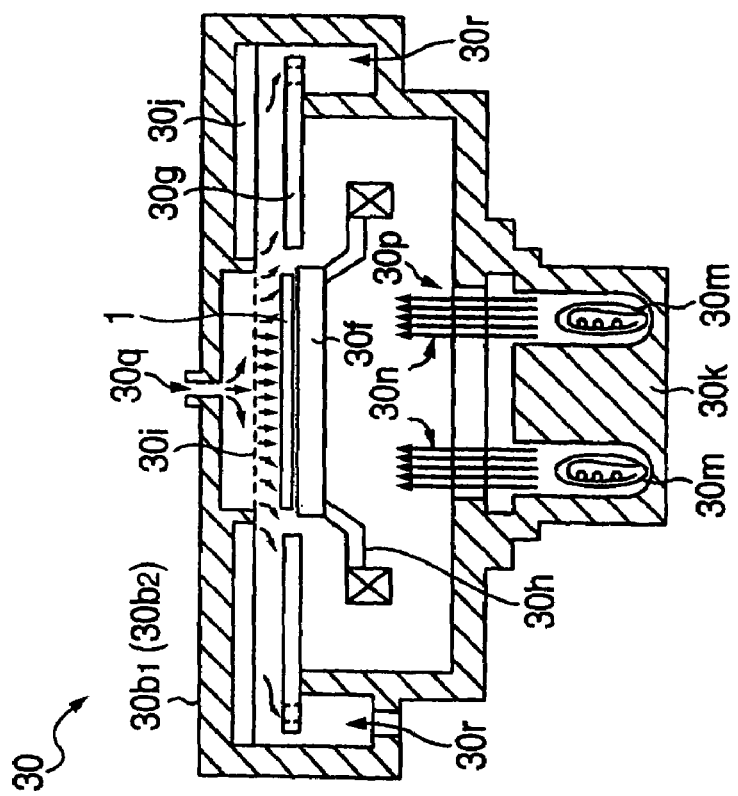
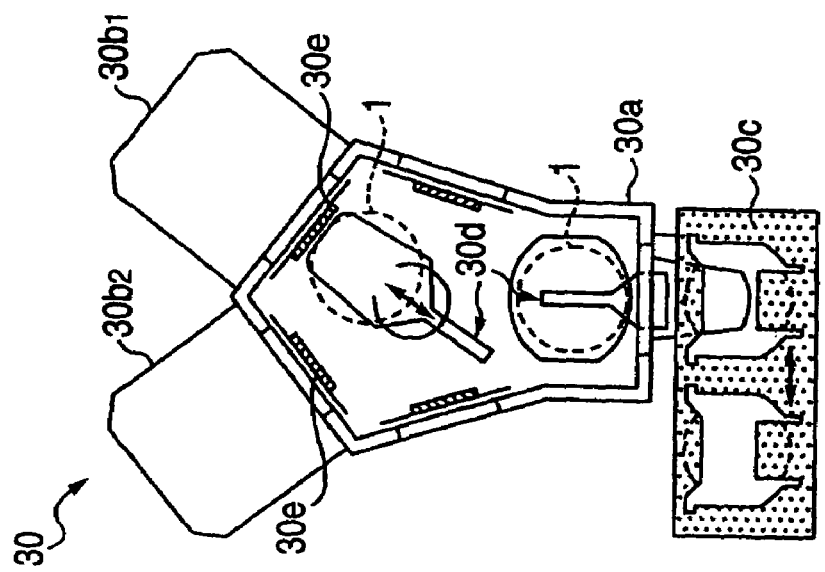
FIG. 42 (a)
FIG. 42 (b)

FIG. 70
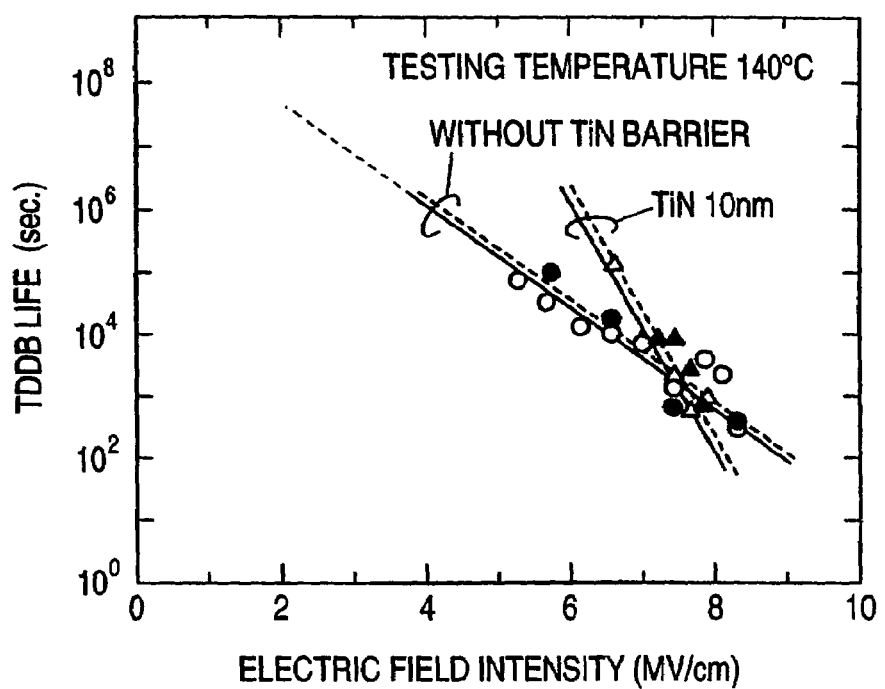
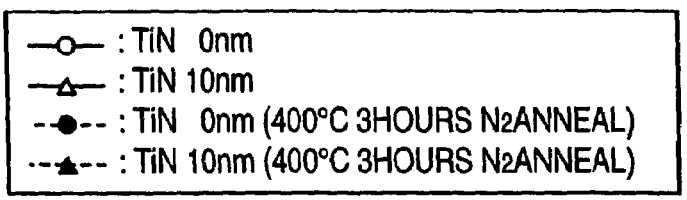

FABRICATION METHOD OF SEMICONDUCTOR INTEGRATED CIRCUIT DEVICE

This application is a Continuation application of application Ser. No. 09/965,220, filed Sep. 28, 2001 now U.S. Pat. No. 6,723,631, the contents of which are incorporated herein by reference in their entirety.

BACKGROUND OF THE INVENTION

This invention relates to a method of fabrication of a semiconductor integrated circuit device; and, more particularly, the invention relates to a technique applicable effectively to a method of fabrication of a semiconductor integrated circuit device having buried interconnects with copper in the main conductor layers thereof.

In semiconductor integrated circuit devices, electronic devices, etc., a technique has been established to form interconnects as an interconnect-forming technology, wherein a conductor film, e.g., aluminum or tungsten, is deposited on an insulation film, and then the film is patterned by the usual photolithography and dry-etch technique, thereby being formed into an interconnect.

In the above interconnect-forming technique, however, there is a conspicuous increase in interconnect resistance resulting from scale-down of the devices and interconnects forming semiconductor integrated circuit devices or the like, resulting in occurrence of an interconnect delay. Thus, there is a limitation to further improvement in the performance of a semiconductor integrated circuit device or the like. For this reason, in recent years studies have been made on an interconnect-forming technology called "damascene", for example. The damascene technology can be roughly divided into a single-damascene technique and a dual-damascene technique.

The single damascene technique is a method in which, after forming an interconnect trench in an insulation film, a main conductor layer for interconnect formation is deposited in the interconnect trench; and, then, the main conductor layer is polished so as to be left only at the inside of the interconnect trench, using chemical mechanical polishing (CMP), for example, thereby forming a buried interconnect at the inside of the interconnect trench.

Meanwhile, the dual damascene technique is a method in which, after forming an interconnect trench and a hole for connection to the lower-leveled interconnect in an insulation film, a main conductor layer for interconnect formation is deposited on the insulation film and in the interconnect trench and hole; and, then, the main conductor layer is polished so as to be left only at the inside of the interconnect trench and hole, using CMP or the like, thereby forming a buried interconnect at the inside of the interconnect trench and hole.

In any of the techniques, the interconnect main conductor material comprises, for example, a low-resistance material, such as copper, from a viewpoint of improving the performance of the semiconductor integrated circuit device or the like. Copper, having the advantage of lower resistance and greater allowable current in reliability by two orders of magnitude than that of aluminum, requires a smaller film thickness for the same interconnect resistance, and, hence, results in a reduced capacitance between adjacent interconnects.

However, copper tends to more readily diffuse into an insulation film as compared to other metals, such as aluminum and tungsten. For this reason, it is considered that, when using copper as an interconnect material, there is a need to form a copper-diffusion-preventing thin conductive barrier film on a surface of a copper main-conductor layer (bottom and side surfaces), i.e. on an inner wall of the interconnect trench. Meanwhile, there is a technique in which a cap film, for example, of silicon nitride, is deposited over the entire upper surface of an insulation film formed with an interconnect trench in a manner covering the upper surface of a buried interconnect, thereby preventing copper in the buried interconnect from diffusing into the insulation film through the upper surface of the buried interconnect.

The buried interconnect technology having a copper main-conductor layer is described, for example, in JP-A-11-330246. This technique is such that, after forming a copper interconnect in an interconnect opening formed in a dielectric layer, a barrier layer is formed; and, then, a plasma process is carried out using only ammonia as a source gas, thereby improving the adhesion between the copper interconnect and the copper barrier layer. Meanwhile, JP-A-11-16912, for example, discloses a technique to eliminate an oxide layer formed in an interconnect part exposed at a bottom of a connection hole by carrying out a heat plasma or ultraviolet-ray illumination process in a deoxidizing atmosphere.

Meanwhile, a post-CMP cleaning technique is described, for example, in "Monthly Semiconductor World, published Oct. 1998" Sep. 20, 1998, by Press Journal, pp 62–72.

SUMMARY OF THE INVENTION

According to the result of study by the present inventors, it has been found that the following problems are inherent in the buried interconnect technique using copper in a main conductor layer thereof.

Firstly, there exists a problem in that, when using copper as an interconnect material, the TDDB (Time Dependence on Dielectric Breakdown) life is conspicuously short as compared to other metal materials (e.g. aluminum, tungsten). Moreover, in addition to the scale-down in interconnect pitch and the trend toward increasing the effective electric field intensity, there is a recent tendency to use, as an interlevel insulation film, an insulation material having a lower dielectric constant than that of silicon dioxide, in view of the decreasing interconnect capacitance. However, because the low-dielectric-constant dielectric material generally is low in dielectric strength, there is still more difficulty in securing sufficient a TDDB life.

Incidentally, a TDDB test is one of the acceleration test methods used to determine an interlevel dielectric breakdown strength, i.e., a test method for presuming a dielectric breakdown time (life) in the usual-use environment from a time until dielectric breakdown under a high electric field at a predetermined temperature higher than that in the usual-use environment. The TDDB life is a life to be presumed from such a TDDB test. The TDDB life will be referred to later.

Secondly, if a silicon nitride film is used as a cap film on a buried interconnect having a copper main-conductor layer, silicide or copper oxide is formed at the interface of the copper and the silicon nitride film during formation of a cap film, causing a problem of increased resistance of the buried interconnect. The experiment by the present inventors has first found that such silicide or copper oxide is one of the major causes of copper diffusion, as will be referred to later.

Thirdly, there is a problem in that strip-off occurs between the interconnect layer of the buried interconnect and an insulation film (e.g. the cap film) formed in the upper level thereof.

Fourthly, there is a problem in that the interconnect resistance increases due to the cleaning process after a CMP process for forming a buried interconnect (hereinafter, referred also to as post-CMP cleaning). It has been found that this problem is particularly conspicuous where a buried interconnect is formed by a plating method.

It is an object of the invention to provide a technique which is capable of improving the dielectric breakdown strength between interconnects having copper in the main conductor layers thereof.

Another object of the invention is to provide a technique which is capable of preventing an increase in the resistance of an interconnect having copper main-conductor layer.

Another object of the invention is to provide a technique to improve the adhesion between an interconnect having a copper main conductor layer and a cap film.

The foregoing and other objects and novel features of the invention will be made apparent from the following description in the present Specification and the appended drawings.

The aspects of the invention as disclosed in the present Application, briefly explained as a summary of representative features thereof, include the following.

Namely, the method of the present invention includes a step of carrying out a plasma process on a semiconductor substrate in a hydrogen gas atmosphere and a step of carrying out a plasma process on the semiconductor substrate in an ammonia gas atmosphere, after forming, using a polishing technique, an interconnect including copper as a main conductor layer in an interconnect opening formed in a first insulation film on the semiconductor substrate, but before depositing a second insulation film on the first insulation film and the interconnect.

Also, the method of the invention includes a step of carrying out a heating process in a hydrogen gas atmosphere, a step of carrying out on a semiconductor substrate a plasma process in an ammonia gas atmosphere and a step of carrying out a plasma process in a hydrogen gas atmosphere, after forming, using a polishing technique, an interconnect including copper as a main conductor layer in an interconnect opening formed in a first insulation film on the semiconductor substrate, but before depositing a second insulation film on the first insulation film and the interconnect.

Also, the method of the invention includes a step of carrying out on a semiconductor substrate a cleaning process using an alkali solution, a deoxidizing process and a cleaning process using the acid solution, and a step of depositing a second insulation film on the first insulation film and interconnect, after forming, using a polishing technique, an interconnect including copper as a main conductor layer in an interconnect opening formed in a first insulation film on the semiconductor substrate.

Also, the method of the invention includes a step of carrying out a cleaning process using an alkali solution, a deoxidizing process and a cleaning process using the acid solution, and a step of carrying out a plasma process in a hydrogen gas atmosphere on the substrate, a step of carrying out a plasma process on the semiconductor substrate in an ammonia gas atmosphere, and a step of depositing a second insulation film on the first insulation film and the interconnect, after forming, using a polishing technique, an interconnect including copper as a main conductor layer in an interconnect opening formed in a first insulation-film on the semiconductor substrate.

BRIEF DESCRIPTION OF THE DRAWINGS

FIGS. 11(a)–11(d) are graphs showing XPS data;

FIGS. 13(a)–13(f) are graphs showing XPS data;

FIGS. 14(a)–14(d) are graphs showing mass analysis results;

FIG. 19A and 19B are diagrams showing a mechanism of TDDB deterioration;

FIG. 20A and 20B are diagrams showing a mechanism of TDDB improvement;

FIGS. 42(a) and 42(b) are sectional views of an overall structural example of a plasma processing apparatus according to one embodiment of the invention;

FIG. 70 is a graph showing a TDDB characteristic after annealing in the case of the absence of a conductive barrier film and of a thickness smaller than 10 nm;

in FIG. 78(a);

DETAILED DESCRIPTION OF THE PREFERRED EMBODIMENTS

For explaining the embodiments of the present invention, the terms used in this Specification will be understood to have the followings meanings.

1. TDDB (Time Dependence on Dielectric Breakdown) life is a time (life) determined by extrapolation to an electric field intensity in actual use (e.g. 0.2 MV/cm) from a graph prepared by applying a comparatively high voltage between electrodes under a measuring condition at a predetermined temperature (e.g. 140° C.) to plot a time from voltage application up to dielectric breakdown against an applied electric field.

Figure 1:
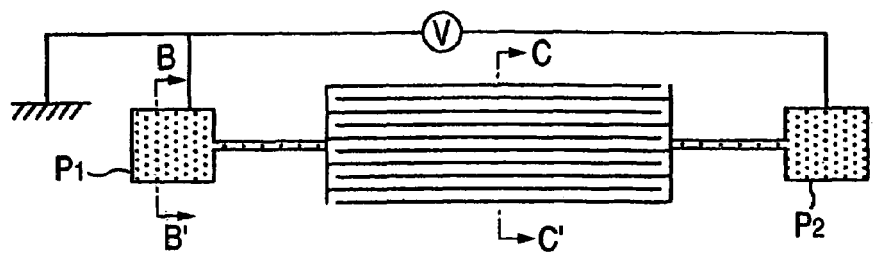
FIG. 1(a) is a plan view of a sample used in a TDDB life measurement in accordance with the present invention.
FIGS. 1(b) and 1(c) are sectional views taken along line B–B' and line C–C' in FIG. 1(a), respectively.
Figure 1:
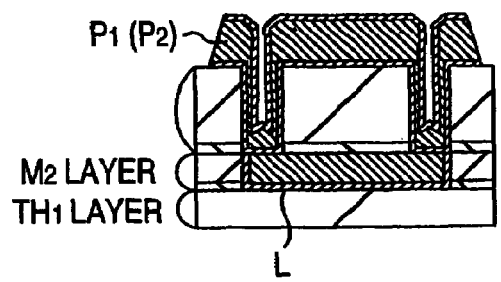
Figure 1:
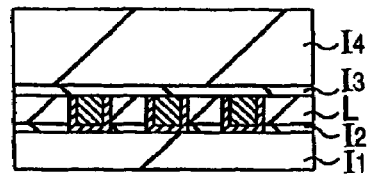

FIG. 1(a) shows a sample used in a TDDB-life measurement, and FIGS. 1(b) and 1(c) show, respectively, a section on line B–B' and a section on line C–C' in FIG. 1(a). The sample in actual use can be formed in a TEG (Test Equipment Group) region on a semiconductor wafer (hereinafter referred to merely as a wafer). As shown in the drawing, a pair of comb-shaped interconnects L are formed in a second interconnect level M2 and are connected respectively to the pads P1, P2 in the uppermost level. An electric field is applied between the comb-shaped interconnects L to measure a current. The pads P1, P2 are measuring terminals. The comb-shaped interconnect L is 0.5 μm in any of interconnect width, interconnect spacing and interconnect thickness. Also, the interconnect opposite length was $1.58 \times 10^5$ μm.

Figure 2:
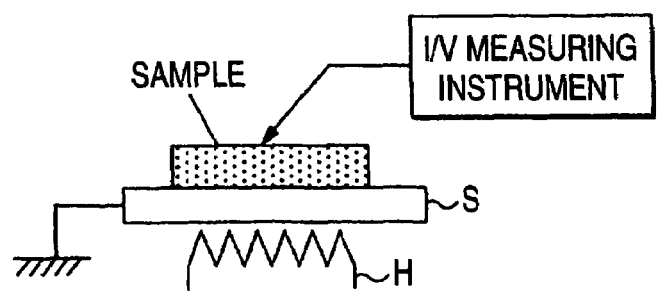
FIG. 2 is a diagram showing the outline of a measurement arrangement.

FIG. 2 is a diagram showing the outline of a measurement arrangement. The sample is held on a measuring stage S, and a current-voltage measuring instrument (I/V measuring instrument) is connected between the pads P1, P2. The sample stage S is heated by a heater H in order to adjust the sample temperature to 140° C.

Figure 3:
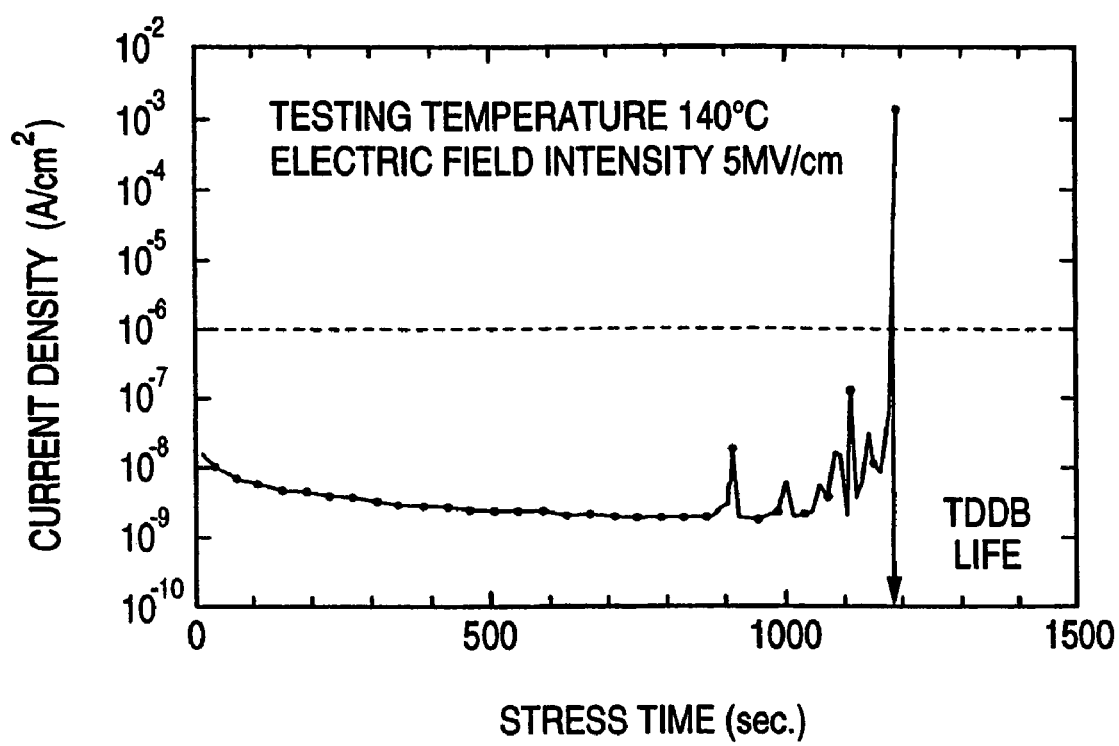
FIG. 3 is a graph showing one example of a current-voltage measurement result.

FIG. 3 shows one example of a current-voltage measurement result. This example relates to the case of a sample temperature of 140° C. and an electric field intensity of 5 MV/cm. Although the TDDB life measurement includes a constant-voltage stress scheme and a low-current stress scheme, the present Application uses a constant-voltage stress scheme in which the mean electric field applied to an insulation film is constant. After voltage application, the current density decreases with lapse of time, and, thereafter, an abrupt current increase (dielectric breakdown) is observed. Herein, the time at which the leakage current density reaches 1 μA/cm$^2$ is given a TDDB life (TDDB life at 5 MV/cm). Incidentally, although the TDDB life refers to a breakdown time (life) at 0.2 MV/cm, unless otherwise referred to, there is a case in which the term of the TDDB life is used broadly as meaning a time to a breakdown, while referring to a predetermined electric field intensity. Also, unless otherwise mentioned, the TDDB life is at a sample temperature of 140° C. Incidentally, although the TDDB life refers to a measurement on a comb-shape interconnect L, as in the foregoing example, it is needless to say that it reflects an actual interlevel breakdown life.

2. "Plasma process" refers to a process in which a plasma chemical or mechanical (bombardment) action is applied to an exposed surface of a substrate or a member when an insulation film, metal film or the like is formed on a substrate, in a plasma-state environment. Generally, although plasma is caused by ionizing a gas through the action of a high-frequency electric field or the like, while supplementing, as required, a process gas to a reaction chamber having a particular gas (step gas) replaced, perfect replacement to a process gas is practically impossible to achieve. Accordingly, in the present Application, ammonia plasma, when referred to, for example, is not intended to mean perfect ammonia plasma, and, accordingly, the existence of an impurity gas in the plasma (nitrogen, oxygen, carbon dioxide, water vapor, etc.) is not to be excluded. Similarly, the inclusion of another dilution gas or additive gas in the plasma is not excluded as a matter of course.

"Reduction-atmosphere plasma" refers to a plasma environment in which there predominantly exist reaction species, such as radicals, ions, atoms and molecules, having a deoxidizing action or action to withdraw oxygen, wherein radicals and ions include atomic or molecular-formed radicals or ions. Also, it is satisfactory that, besides a single species, a plurality of kinds of species may be included in the environment. For example, the environment may have a hydrogen radical and $NH_2$ radical existing simultaneously.

3. If in the present Application there is an expression, for example, of "comprising copper", it is intended that copper is present as a major component. Namely, it is natural that, generally, copper even with a high purity contains impurities. The additives or impurities included in a member comprising copper are not to be excluded. In this Specification, the expression of "comprising copper in high purity" is intended to mean copper comprising a material high in purity (e.g. 4N (99.99%)) or higher, wherein the material is presumed to contain an arbitrary impurity in an amount of nearly 0.01%. This is not limited to copper, but is true for other metals (titanium nitride, etc.).

4. The term "gas concentration", in this Specification, refers to a flow rate ratio in mass flow rate. Namely, the concentration of a gas A of 5% in a gas mixture of gases A and B refers to $Fa/(Fa+Fb)=0.05$ provided that the mass flow rate of the gas A is Fa and the mass flow rate of the gas B is Fb.

5. Chemical Mechanical Polish (CMP) generally refers to polishing of a surface by relative movement in a direction of the surface while supplying a slurry in a state relatively in contact with a polishing pad formed of a sheet material in a soft cloth form. Besides this, the present Application includes CML (Chemical Mechanical Lapping) for polishing a surface, while relatively moving a hard grindstone, those using fixed grits and grit-free CMP without using grits, on the surface.

6. Grit-free chemical mechanical polish generally refers to chemical mechanical polish using a slurry having a grit weight concentration of 0.5% by weight or less. Grit-used chemical mechanical polish refers to chemical mechanical polish using a slurry having a grit weight concentration of 0.5% by weight or higher. However, these are relative in nature. Where the first-step polish is a grit-free chemical mechanical polish and the following second-step polish is a grit-used chemical mechanical polish, or where the first-step polish concentration is smaller by one order of magnitude, preferably by two orders of magnitude, than the second-step polish concentration, there are cases in which the first-step polish is referred to as grit-free chemical mechanical polish. In this Specification, grit-free chemical mechanical polishing includes not only the case a unit planarizing process overall for a subjective metal film using grit-free chemical mechanical polish, but also the case of a major process using grit-free chemical mechanical polish and a minor process using grit-used chemical mechanical polish.

7. "Polishing fluid" (slurry), generally, refers to a suspension having polish grits mixed in a chemical etchant, and the present Application includes those not mixed with polishing grits in the nature of the invention.

8. "Grits" (slurry particles) generally refers to a powder, such as alumina and silica, contained in a slurry.

9. "Anticorrosive" refers to an agent which inhibits or suppresses CMP polishing from proceeding by forming a protection film having a corrosive or hydrophobic nature or both on the surface of a metal. Generally, benzotriazole (BTA) or the like is used (for detail, see JP-A-8-64594).

10. The conductive barrier film is generally a conductive film having a diffusion barrier property formed comparatively thin on a side surface or bottom of a buried interconnect in order to prevent copper from diffusing into an interlayer insulation film or a lower-level layer. Generally, a refractory metal or nitride thereof is used, such as titanium nitride (TiN), tantalum (Ta) and tantalum nitride (TaN)

11. The buried interconnect or buried metal interconnect generally refers to an interconnect patterned by an interconnect-forming technique for removing an unwanted portion of a conductive film on an insulation film after burying a conductive film inside a trench or hole formed in the insulation film, as in single damascene or dual damascene processes. Meanwhile, generally, "single damascene" refers to an interconnect burying process for burying a plug metal and a interconnect metal in two stages. Similarly, "dual damascene" generally refers to an interconnect burying process for burying a plug metal and an interconnect metal at one time. Generally, there are often cases in which a copper-buried interconnect is used in a multi-level structure.

12. Selective removal, selective polishing, selective etching or selective chemical mechanical polishing, when referred to, have a selective ratio of 5 or greater.

13. Concerning "selective ratio", when referred to, a selective ratio "of A to B" (or "of B to A") is X, means that, when taking an example of a polishing rate, the calculation of a polishing rate for A with reference to a polishing rate for B provides X.

14. The term "semiconductor integrated circuit device", when referred to in the present Application, includes not only those devices particularly fabricated on single-crystal silicon substrates, but, except for the case which explicitly states that it is not so, also those fabricated on other substrates, such as SOI substrates or TFT (Thin Film Transistor) liquid crystal manufacturing substrates. Also, the term "wafer" refers to a single-crystal silicon substrate (generally in a disk form) used in the manufacture of a semiconductor integrated circuit device, an SOS (Silicon On Sapphire) substrate, a glass substrate, other insulating, semi-insulating or semiconductor substrates or a combined substrate thereof.

15. The term "wafer" (semiconductor integrated circuit substrate or semiconductor substrate) refers to a silicon or other semiconductor single-crystal substrate used in the manufacture of semiconductor integrated circuits (generally, nearly in a flat disk form), a sapphire substrate, a glass substrate, other insulation or semi-insulation semiconductor substrates or a combined substrate thereof. Incidentally, the substrate in its part or entirety or the gate electrode in its entirety or part may be formed of another semiconductor, e.g. SiGe.

16. The terms "semiconductor integrated circuit chip" (semiconductor integrated circuit substrate) or "semiconductor chip" (semiconductor substrate) refers to those elements into which a wafer that has completed a wafer process is divided into to form unit-circuit groups.

17. Silicon nitride or a silicon nitride film, when referred to, includes not only $Si_3N_4$, but also a silicon-nitride insulation film having a similar composition.

18. The cap film is an insulation film having high insulation and diffusion barrier properties formed in a position above a buried interconnect, except for an electrical connection, and is generally formed of a material other than that of the major portion of the interlayer insulation film, e.g. silicon nitride film.

19. The wafer process is called also a first-half process, which is a process carried out from a mirror-polished wafer (mirror wafer) state through a device-and-interconnect forming process to a state in which a surface protection film is formed to finally enable electrical tests with a probe.

20. The long throw sputtering technique refers to a sputtering technique, representing one method for improving bottom coverage, for allowing a stable discharge at a reduced pressure by making the target-to-substrate spacing distant in order to allow only the vertical component of sputtering particles to reach the substrate.

21. The collimate sputtering technique refers to a sputtering technique having a mechanism for forcibly enhancing the vertical component by inserting a grit-formed plate between a target and a substrate in order to obtain a sufficient film thickness even at a bottom when forming a film in an interconnect opening, such as an interconnect trench, contact hole or through-hole, having a great aspect ratio.

Figure 4:
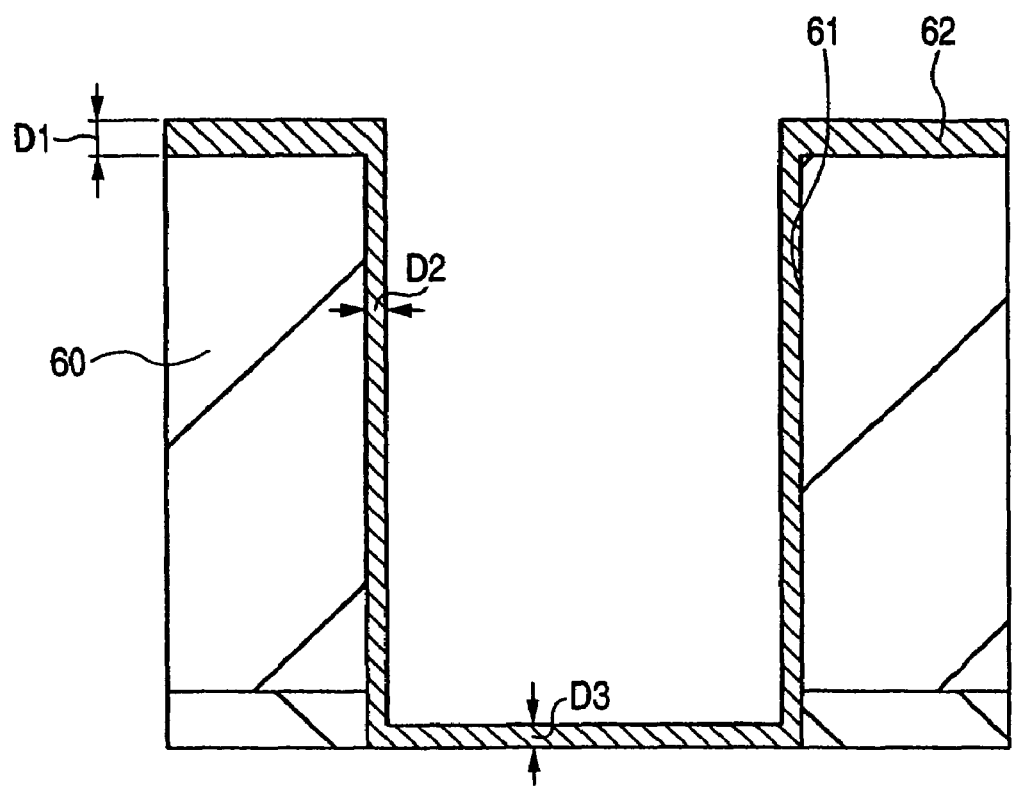
FIG. 4 is sectional view of coverage in an interconnect trench or connection hole in a conductive barrier film.

22. The coverage in a conductive-barrier-film interconnect opening (interconnect trench, contact hole, through-hole or the like) has side coverage and bottom coverage. FIG. 4 shows a typical state in which a barrier film 62 is deposited by a sputtering technique on an upper surface of an insulation film 60, as well as in an interconnect trench 61 formed in the insulation film 60. The depo-film thickness of a barrier film, when referred to, generally refers to a film thickness D1 of a barrier film 62 on a top surface of the insulation film 60. Side coverage refers to coverage of the barrier film 62 on a sidewall (including the intersecting corner between the side surface and the bottom surface) of the interconnect trench 61, wherein the film thickness D2 is minimum at that point. Meanwhile, bottom coverage refers to a coverage of the barrier film 62 at the bottom of the interconnect trench 61, wherein the film thickness D3 is the greatest next to the depo-film thickness. For example, according to a result of experiment by the present inventors, where a barrier film was deposited in an interconnect trench having an aspect ratio, for example, of 1 by the usual sputtering technique without special consideration being given to directivity, the barrier film had a depo-film thickness of 100 nm, a side coverage of nearly 30 nm and a bottom coverage of nearly 50 nm. Meanwhile, where a barrier film was deposited by the long sputtering technique, the barrier film had a depo-film thickness of 100 nm, a side coverage of nearly 20 nm and a bottom coverage of nearly 90 nm.

The low-dielectric-strength insulation film or insulation material is to be defined as an insulation film having a dielectric constant lower than a dielectric constant of a silicon oxide film (e.g. TEOS (Tetraethoxysilane) oxide film) included in a protection film formed as a passivation film. Generally, the insulation film having a dielectric constant nearly equal to or lower than a dielectric constant of $\in=4.1-4.2$ of a TEOS oxide film is referred to as a low-dielectric-constant insulation film.

In the embodiments described herein, explanations will be presented by dividing the subject matter into a plurality of sections or embodiments. It is, however, to be noted that, unless otherwise explicitly indicated, they are in a relationship in which one is a modification, detail, supplementary explanation to a part or the entire of another, rather than being not related to one another.

Also, in the embodiment described herein, where reference is made to a number of elements or the like (including number, numeral, quantity, range and the like), the invention is not limited to the particular number, i.e. the number may be greater than or smaller than the particular number, unless otherwise explicitly noted, or clearly limited to a particular number on principle.

Furthermore, in the embodiments described herein, it is needless to say that the constituent elements thereof (including element steps) are not necessarily essential except for the case of elements especially explicitly noted as essential or clearly essential on principle.

Similarly, in the embodiment described herein, when reference is made to a shape, positional relationship or the like of the constituent elements or the like, those factors substantially approximated or similar to the shape or the like are included, except for the case of factors especially explicitly noted as excluded or clearly considered not included on principle. This is true for the numeral and range.

Also, those having elements the same function are identified with the identical reference numerals throughout the drawings illustrating the embodiments, and repeated explanations thereof are omitted.

Meanwhile, in the embodiments, the MISFET (Metal Insulator Semiconductor Field Effect Transistor) representative of a field-effect transistor is abbreviated merely as MIS, the p-channel MISFET is denoted as pMIS, and the n-channel MISFET is denoted as nMIS.

Embodiment 1

An explanation will now be given of the problem in a post-CMP cleaning technique studied by the present inventors and the means for solving such problem.

The post-CMP cleaning technique studied by the present inventors is designed to carry out alkali cleaning and acid cleaning in this order on a semiconductor substrate after CMP processing. Alkali cleaning has an object to remove foreign matter, such as the slurry used during CMP processing. In alkali cleaning, a cleaning liquid containing, for example, ammonia ($NH_4OH$) is used. Also, acid cleaning has an object to improve the TDDP characteristic or remove the remaining metal. In acid cleaning, a cleaning liquid containing, for example, hydrogen fluoride (HF) is used.

Figure 5:
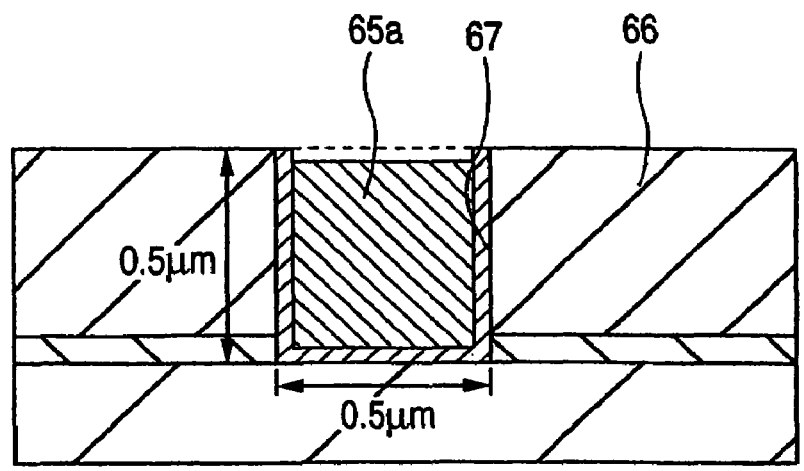
FIGS. 5(a) and 5(b) are sectional views of a buried interconnect for illustrating the technical problem studied by the present inventors.
Figure 5:
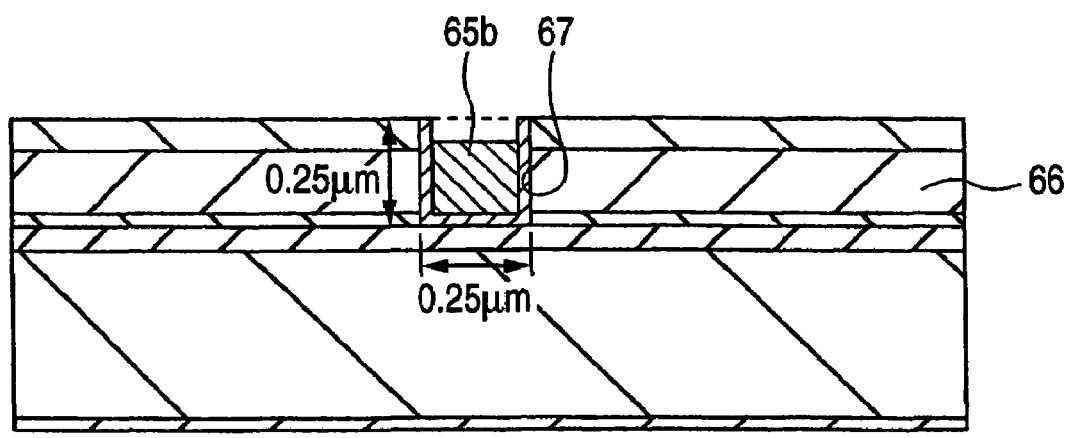

FIGS. 5(*a*) and 5(*b*) show respective examples of sections in the buried interconnects 65*a*, 65*b* in which a cleaning process is carried out on buried interconnects that are different in interconnect dimensions. The buried interconnects 65*a*, 65*b* are formed in a state in which they are buried in an interconnect trench 67 formed in an insulation film 66, each of which is structured as a main conductor film having a conductor film based on copper (Cu).

As shown in FIGS. 5(*a*) and 5(*b*), according to a result of experiment by the present inventors, the etching action on copper is intense in the cleaning process, particularly during the acid cleaning. The removal of the interconnect is almost negligible in the dimensions of the buried interconnect 65*a* exemplified in FIG. 5(*a*). However, when scale-down was effected, as seen by the dimensions of the buried interconnect 65*b* exemplified in FIG. 5(*b*), there were found problems involving an interconnect-resistance increase, a variation, a step occurrence and the like, particularly in a solitary buried interconnect pattern.

Figure 6:
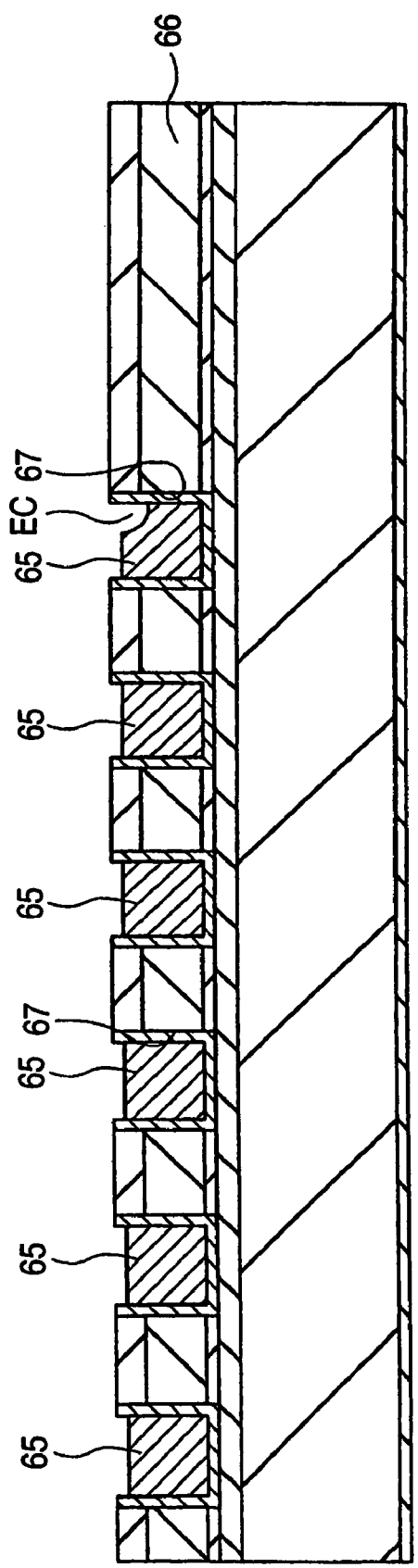
FIG. 6 is a sectional view of a buried interconnect for illustrating the technical problem studied by the present inventors.

Also, in the post-CMP cleaning, as shown in FIG. 6, a poor appearance was produced, such as corrosion (hereinafter, etch corrosion) EC at an edge of a dense buried-interconnect 65 group. This occurs also in a coarse buried interconnection or solitary buried interconnection. Also, according to a result of study by the present inventors, it was found that the above various problems were especially conspicuous where the buried interconnect was formed by a plating method. The reason for etch-corrosion occurrence can to be considered to relate to the fact that the buried interconnect formed by a plating technique is readily corroded as compared to a buried interconnect formed by a sputter technique; and, in addition, the friction by the pad during CMP processing is concentrated on an edge of a dense buried interconnect, coarse buried interconnect or solitary buried interconnect to thereby promote the formation of a brittle oxide film (CuO), or the dissolution of the buried interconnect is accelerated due to the non-linear diffusion of an agent used during post-CMP cleaning. The occurrence of etch corrosion results in an increase or variation in interconnect resistance.

For this reason, the present embodiment carries out a deoxidizing process after CMP, before post-CMP cleaning or after alkali cleaning, before acid cleaning. Due to this, because the copper surface oxidized by CMP can be deoxidized, the entire copper interconnect can have an improved resistance to a cleaning liquid. Due to this, it is possible to suppress or prevent the occurrence of steps in an upper portion of a copper interconnect or etch corrosion, as described above. Therefore, it is possible to suppress or prevent a copper-based buried interconnect from increasing or varying in interconnect resistance.

Next, an explanation will be given of the problem of TDDB life deterioration and a means for solving such problem.

Figure 7:
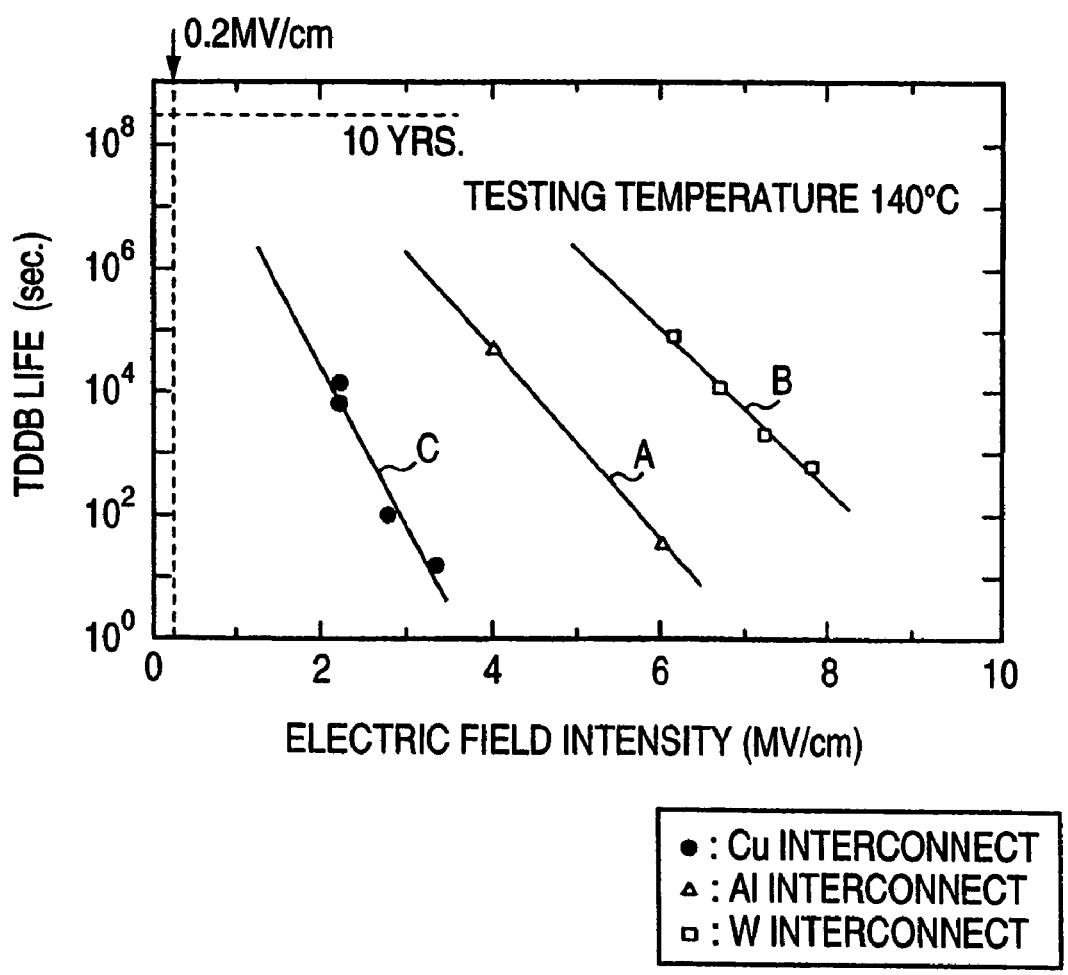
FIG. 7 is a graph showing the data measured on the TDDB characteristics of a copper interconnect, an aluminum interconnect and a tungsten interconnect.

As in the foregoing, it is generally known that, in the case of using copper as an interconnect material, the TDDB life is conspicuously shortened compared to that of other materials (e.g. aluminum, tungsten). FIG. 7 is a graph showing the data measured on the TDDB characteristics of a copper interconnect, an aluminum interconnect and a tungsten interconnect. TDDB life is shown on the vertical axis, while electric-field intensity is shown on the horizontal axis. If extrapolating an aluminum-interconnect characteristic (data A) and tungsten-interconnect characteristic (data B), a TDDB life at an electric field intensity of 0.2 MV/cm (normal use state) is by far in excess of $3 \times 10^8$ sec (10 years) as a development goal of the present inventors. On the other hand, if extrapolating a copper-interconnect characteristic (data C), it is to be seen that almost no margin is available for the 10-year development goal.

In this experiment, the aluminum interconnect was formed by patterning using film deposition and photolithography, while the tungsten interconnect was formed by a damascene technique similar to the copper interconnect. Namely, the copper interconnect and the tungsten interconnect are different only in material without having any difference in structure. Nevertheless, there is a conspicuous difference in the TDDB characteristic, suggesting that this is caused by the different interconnect materials. Incidentally, the TDDB characteristic herein shows the data taken at a temperature of 140° C.

It is generally considered that the cause of such TDDB life deterioration is due to diffusion of the copper applied as an interconnect material to the surrounding areas, thereby causing a decrease in the interlevel breakdown strength. However, as a result of experiment and consideration of the copper diffusion phenomenon by the present inventors, the following mechanism of the copper diffusion phenomenon has been found for the first time.

Namely, the copper in an interconnect is more predominant than the copper in an atomic form, in respect to the fact that the ionized copper supplied from copper oxide or copper silicide drifts and diffuses on an interlevel potential. Also, the diffusion route of copper is predominantly at an interface between the insulation layer formed with a copper interconnect and the cap film. Namely, copper oxide or copper silicide is formed on a surface of a copper interconnect. Copper ions are formed from such a copper compound so that the ionized copper drifts and diffuses along the interface of an interconnect-forming insulation film and the cap film due to the interlevel electric field. The diffused copper atoms cause an increase in the leakage current. The increase of leakage current increases the thermal stress, and dielectric breakdown ultimately occurs on a leakage path resulting in a reduced TDDB life. Accordingly, the inventors could have greatly improved the TDDB life by carrying out a deoxidizing process, such as an ammonia (NH3) plasma process on the semiconductor substrate after forming a buried interconnect by CMP before forming a cap film. In this regard, there is a description in Japanese Patent Application No. 226876/1999 or Japanese Patent Application No. 104015/2000. Incidentally, the result obtained in Japanese Patent Application No. 226876/1999 or Japanese Patent Application No. 104015/2000 is explained in the following.

Figure 8:
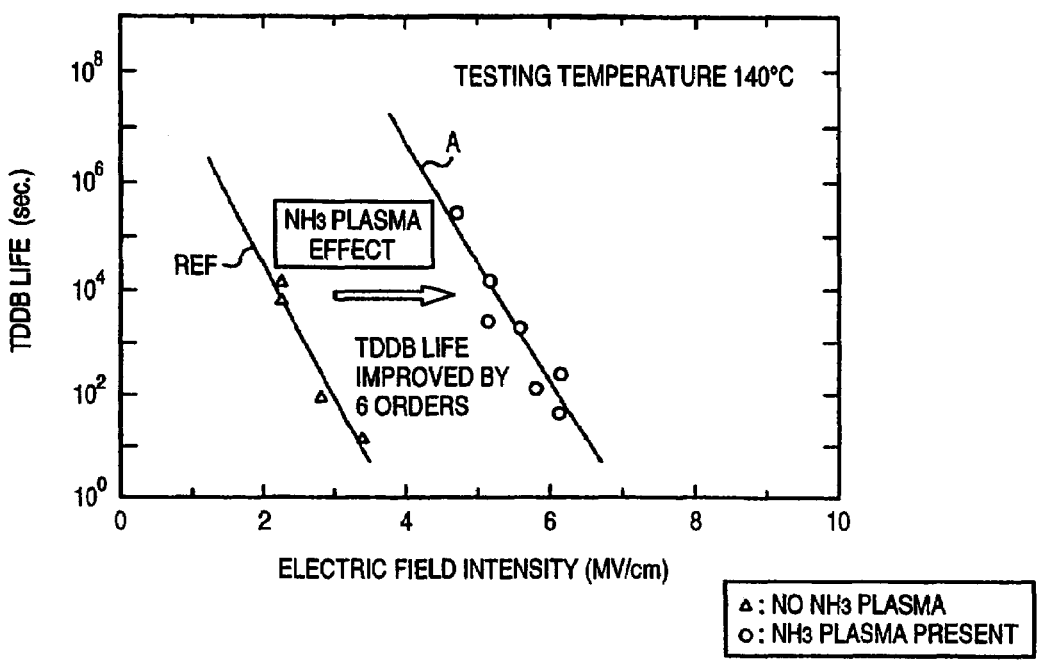
FIG. 8 is a graph showing a TDDB life.

FIG. 8 is a graph showing a TDDB life of a TEG sample formed in the same level as the second-level interconnect, wherein the data taken upon performing the ammonia plasma process is shown on a line A. For comparison, also shown is the TDDB life data taken when not performing an ammonia plasma process (line Ref). As apparent from the figure, there is observed an improvement of the life by six orders of magnitude in the case of performing the ammonia plasma process, as compared to the comparative data.

Figure 9:
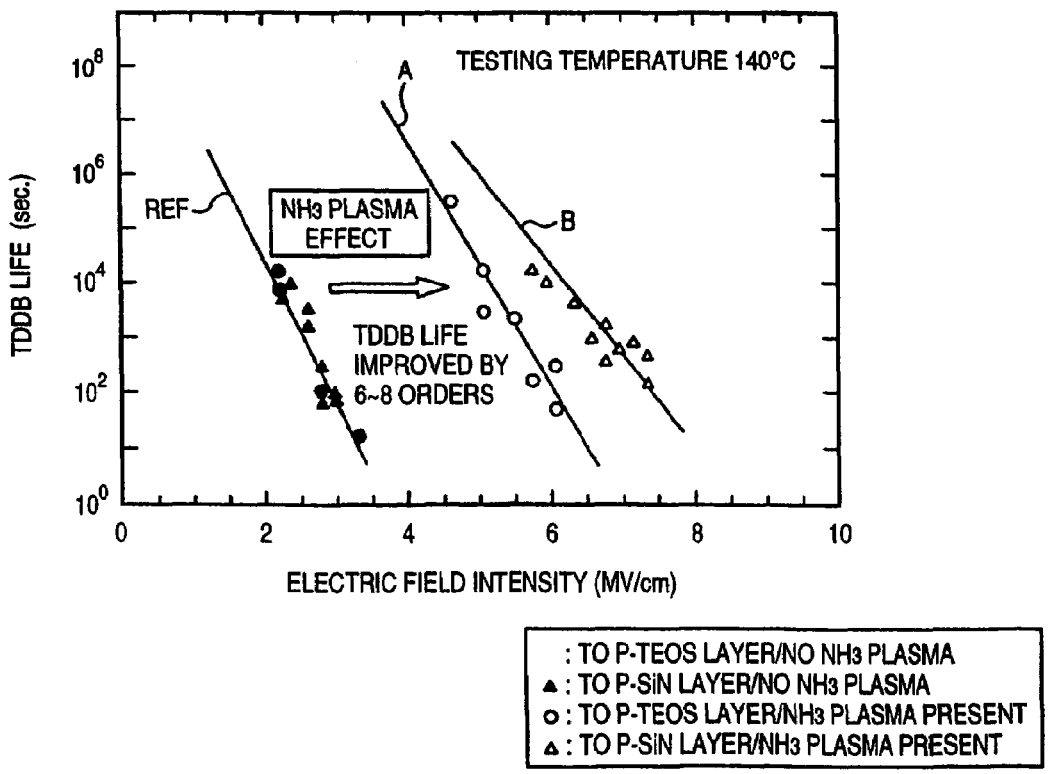
FIG. 9 is a graph showing a TDDB life.
Figure 10:
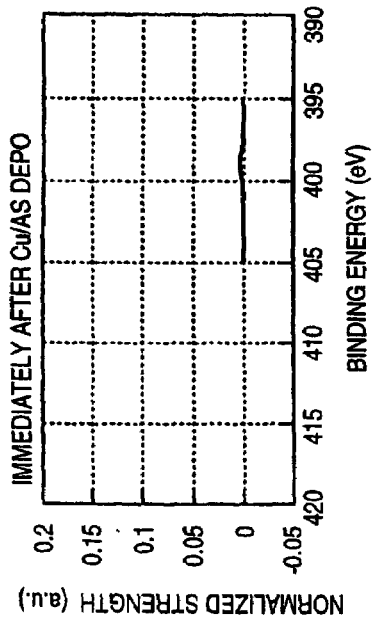
FIGS. 10(a)–10(d) are graphs showing XPS data.
Figure 10:
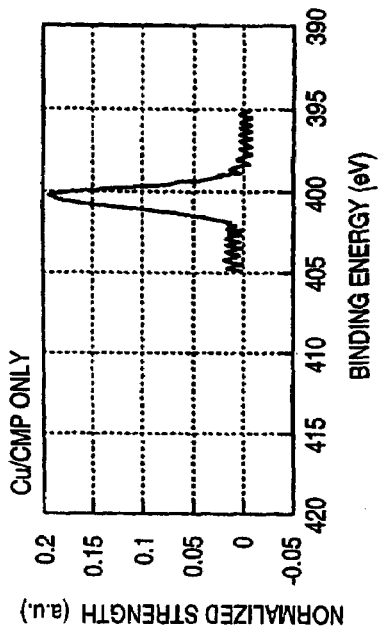
Figure 10:
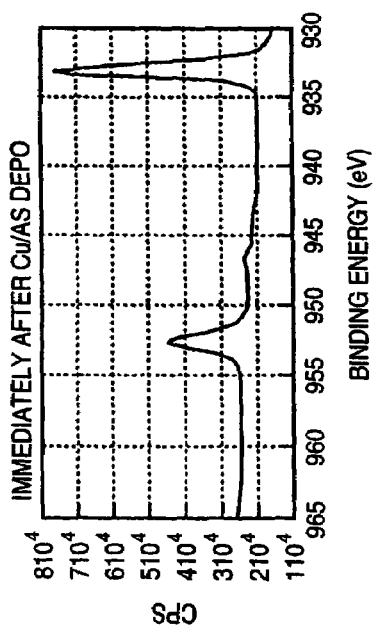
Figure 10:
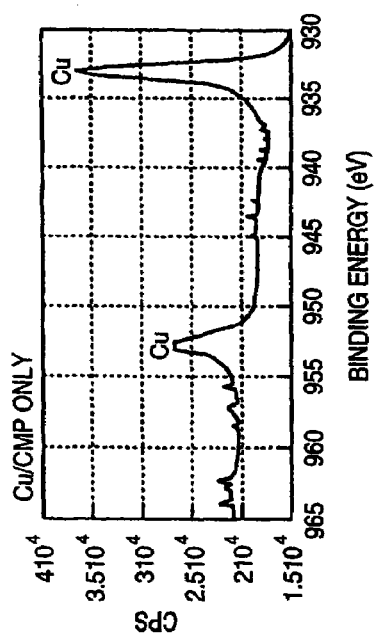
Figure 12:
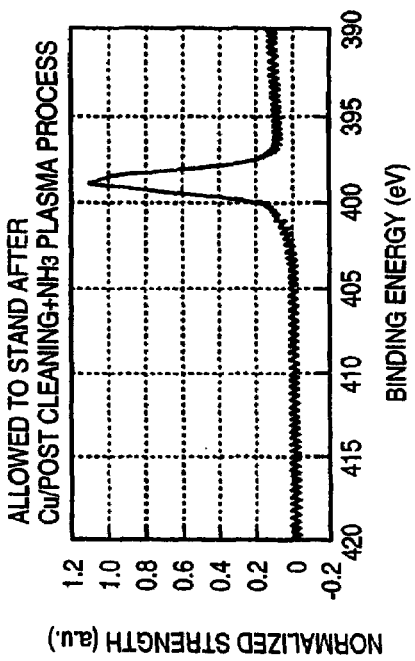
FIGS. 12(a)–12(d) are graphs showing XPS data.
Figure 12:
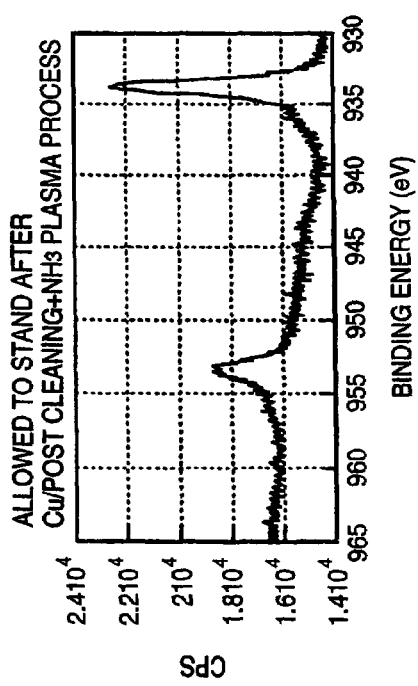
Figure 12:
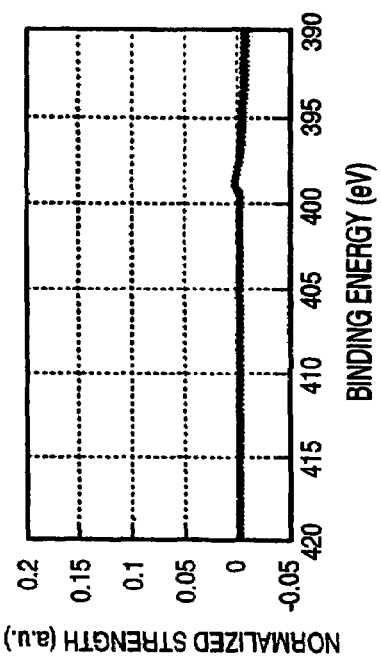
Figure 12:
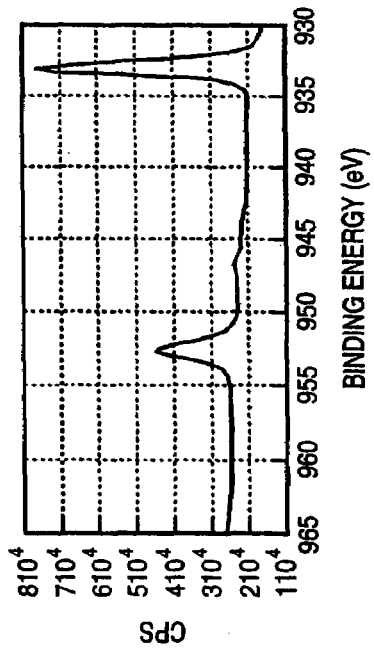
Figure 15:
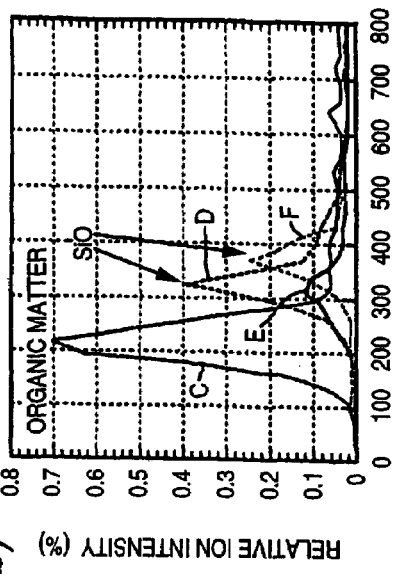
FIGS. 15(a)–15(d) are graphs showing mass analysis results.
Figure 15:
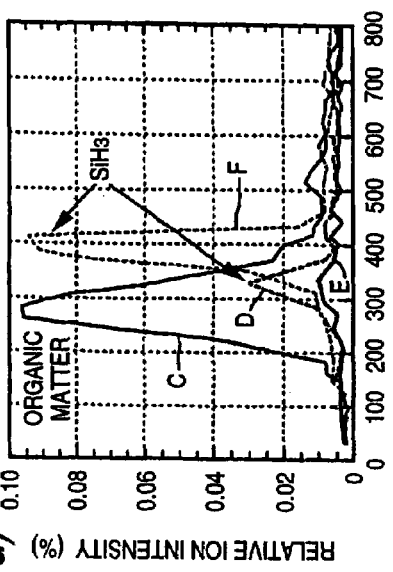
Figure 15:
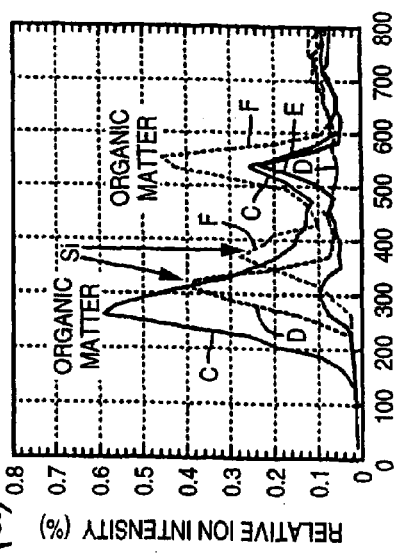
Figure 15:
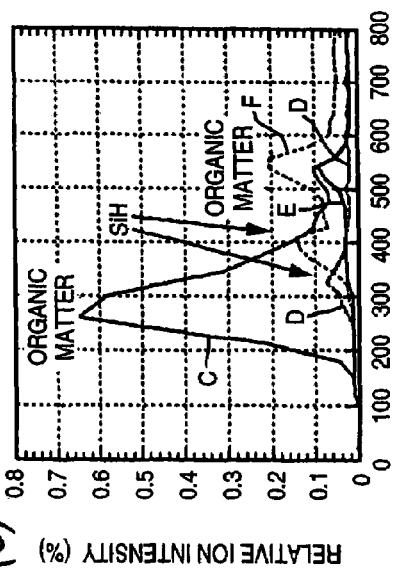

FIG. 9 shows the data (line B) taken in the case where the silicon oxide film formed with an interconnect trench for a buried interconnect is replaced by a silicon nitride film greater in density and firmness. Even where the insulation film is replaced by a silicon nitride film, there is no difference from the case of replacing the insulation film by a silicon nitride film unless an ammonia plasma process is carried out (line Ref). On the other hand, if a silicon nitride film is applied for the insulation film to carry out an ammonia plasma process thereon, the TDDB life is improved furthermore. However, it can be understood that the rate of improvement is less and the factor due to the ammonia plasma process performed is more predominant. This demonstrates that the factor governing the TDDB life is more predominant at an interface of an insulation film, than in the bulk thereof.

Herein, the inventors have conducted a surface analysis on copper and a silicon oxide film in order to analyze the mechanism of improving the TDDB life due to an ammonia plasma process. The results of analysis and the like are explained below.

FIG. 10(a) to FIG. 12(d) are graphs showing results of XPS (X-ray Photoelectron Spectroscopy) analysis on a copper interconnect surface. In these drawings, figures appended with (a) and (c) show Cu2p spectral results, while figures appended with (b) and (d) show N1s spectral results.

FIGS. 10(a) and 10(b) show a result of analysis of a copper film surface in an as-depo state. From the fact that a peak of Cu2p is observed and a peak of N1s is in a noise level, it is understood that no nitrogen exists in the as-depostate copper film. FIGS. 10(c) and 10(d) are a result of analysis on a copper interconnect surface immediately after carrying out only CMP on the copper film. There is observed a peak of N1s together with a peak of Cu2p. Because there is a case where the slurry contains benzotriazole (BTA), it is to be presumed that the observation is based on the nitrogen in BTA that has remained on the copper surface. FIGS. 11(a) and 11(b) show a result of analysis on a copper interconnect surface in a state of having done post cleaning after CMP. No change is seen in a Cu2p peak, but a N1s peak is lowered. It can be considered that BTA has been removed by the cleaning. FIGS. 11(c) and 11(d) are a result of analysis on a copper interconnect surface in a state where it has been allowed to stand for 24 hours in an air atmosphere after post cleaning. A peak is observed in copper oxide (CuO), together with a peak in Cu2p. In the N1s peak, a change due to allowing the surface to stand is not observed. It can be seen that the copper surface is oxidized due to allowing it to stand to produce copper oxide.

FIGS. 12(a) and 12(b) are a result of analysis on a copper interconnect surface in a state where an ammonia plasma process is carried out on the copper interconnect thus oxidized. The peak in the copper oxide nearly disappears. On the other hand, an N1s peak occurs strongly. It can be considered that the copper surface is deoxidized and oxygen is drawn out, and further that the surface is nitrided. For comparison, analysis was made of a copper interconnect surface in a state where a hydrogen heating process at 350° C. has been carried out on an oxidized copper interconnect. The result is given in FIGS. 12(c) and 12(d). Comparing the Cu2p peaks in between FIG. 12(c) and FIG. 12(a), it can be seen that deoxidizability is stronger in the hydrogen heating process because of the fact that it is closer to the as-depo state (FIG. 10(a)). On the other hand, it appears that the copper surface is merely deoxidized in the hydrogen heating process in view of the fact that almost no N1s peak is observed.

From the above results, it can be understood that the copper interconnect surface is deoxidized by the ammonia plasma process, and further that a nitrogen layer is formed. It can be considered that this nitrogen layer acts to prevent copper from reacting with the silane contained in a material gas used upon depositing a silicon nitride film after the ammonia plasma process and to suppress copper from forming a silicide. The prevention of silicide formation has an effect to suppress an increase in the interconnect resistance.

FIGS. 13(a) to 13(f) are graphs showing a result of XPS analysis conducted on a silicon oxide film surface. FIGS. 14(a) to 14(d) and FIGS. 15(a) to 15(d) are graphs showing a result of mass spectroscopy (TDS-APIMS) conducted on a silicon oxide film. In the analysis of the silicon oxide film, analyses were conducted on the film in a state where cleaning after CMP was completed (profile C), a state where a hydrogen plasma process has been performed after post-CMP cleaning (profile D), a state where an ammonia plasma process has been performed after post-CMP cleaning (profile E), and a state where a nitrogen plasma process has been performed after post-CMP cleaning (profile F). Incidentally, the deviation of the profile C by approximately 1 eV toward the higher energy is due to the affects of charge-up.

FIGS. 13(a) and 13(b) are both directed to data in which an Si2p spectrum has been observed, wherein FIG. 13(a) concerns the analysis in a depth of approximately 10 nm, while FIG. 13(b) concerns analysis in a depth of approximately 2 nm. FIGS. 13(c), 13(d) and 13(e) concern data observing N1s, O1s and C1s spectrums, respectively. From FIG. 13(b), a broad peak is seen at a lower energy side (at around 102 eV) of a hydrogen plasma process (profile D). This can be considered to be due to the existence of Si—H bonds, i.e. Si—H is presumably formed on a silicon oxide film surface by the hydrogen plasma process. In FIG. 13(a), the ammonia plasma process (profile E) and the nitrogen plasma process (profile F) have their 105-eV peaks each asymmetrically broadened toward the lower energy side. The peak in the asymmetric portion (103.5 eV) is considered to be due to Si—O—N bonds. It is presumed that the silicon oxide film surface is nitrided by the ammonia plasma process and nitrogen plasma process. Meanwhile, from a comparison between FIGS. 13(a) and 13(b), nitriding is considered stronger in the surface. The nitriding due to the ammonia plasma process and nitrogen plasma process can be confirmed also in FIG. 13(c). In FIG. 13(e), almost no carbon is detected in the hydrogen plasma process (profile D). It is understood in this regard that the organic matter in the surface has been removed by the hydrogen plasma process. Also, the 289-eV peak after the CMP (profile C) is considered to be due to C—O bonds. It is considered that slurry remains after the CMP. FIG. 13(f) shows an N-amount presumed value by determining an existence ratio of them from an Si peak and an N peak. It is considered that nearly equivalent nitriding has been carried out in the ammonia plasma process and the nitrogen plasma process.

FIGS. 14(a), 14(b), 14(c) and 14(d) are, respectively, graphs of measurements on a mass number of 41 (Ar—H), a mass number of 27 (C2 H3), a mass number of 57 (C4 H9) and a mass number of 59 (C3 H7 O). Also, FIGS. 15(a), 15(b), 15(c) and 15(d) are, respectively, graphs of measurements on a mass number of 28 (Si, C2 H4), a mass number of 44 (SiO, C3 H6), a mass number of 29 (SiH, C2 H5) and a mass number of 31 (SiH3).

It is understood from FIG. 14(a) that there is almost no difference in the desorption amount of hydrogen, but the desorbing temperature in the hydrogen plasma process (profile D) is 520° C., which is lower as compared to the other cases (560° C.). In FIGS. 14(a), 14(b) and 14(c), desorption of organic matter is seen in each process.

On the other hand, in FIGS. 15(a)–15(d) there are seen the existences of peaks of other than desorption of organic matter. That is, the peaks at 300° C.–400° C. seem to be Si, SiO, SiH and SiH3. Comparing the figures, SiO desorption is seen in each of hydrogen, ammonia and nitrogen plasmas, but SiH/SiH3 desorption is not observed in the ammonia plasma process. Namely, in the ammonia plasma process, Si—O—N is formed, which is to be desorbed at a comparatively low energy. Also, the energy required for desorption is the highest in the nitrogen plasma process, and almost the same in the hydrogen plasma process and the ammonia plasma process.

From these results, Si—OH and Si—O—, forming a cause of a dangling bond in the silicon oxide film surface, is considered to terminate at a weak bond Si—O—N by the ammonia plasma process. In the formation of a silicon nitride film after the ammonia plasma process, Si—O—N immediately close to the surface desorbs so that the Si—O bond in the bulk and the Si—N in the silicon nitride film firmly bond together to form a continuous interface. This is considered a mechanism to improve the adhesion at the interface. On the other hand, where an ammonia plasma process is not carried out, it can be considered that a condensation reaction takes place between the surface of a silicon oxide film abundant in Si—OH bond and ammonia as a material gas for a silicon nitride film, thereby causing a number of Si—O-bonds as a cause of dangling bonds. If there exist a number of dangling bonds at the interface of the silicon oxide film and the silicon nitride film, it can be considered that a leakage path will be formed there forming a cause of leakage current between interconnects and eventually of dielectric breakdown.

From the above analysis results, it can be considered that the oxidized copper interconnect surface is deoxidized and converted into Cu single element in a state electrically more stable than ionized copper, and the interface of the silicon oxide film/silicon nitride film becomes a continuous firm film, thereby decreasing the leakage current and greatly improving the TDDB life.

The inventors have taken TEM pictures of the interface of the interconnect layer and the silicon nitride film (cap film) in the cases where an ammonia plasma process has been carried out and not been carried out. As a result, in the case of the present embodiment in which an ammonia plasma process has been carried out, a thin film existence at the interface could have been confirmed. It can be considered that the thin film is a nitriding layer mentioned before. On the other hand, where an ammonia plasma process is not carried out, such a film cannot be confirmed.

Figure 16:
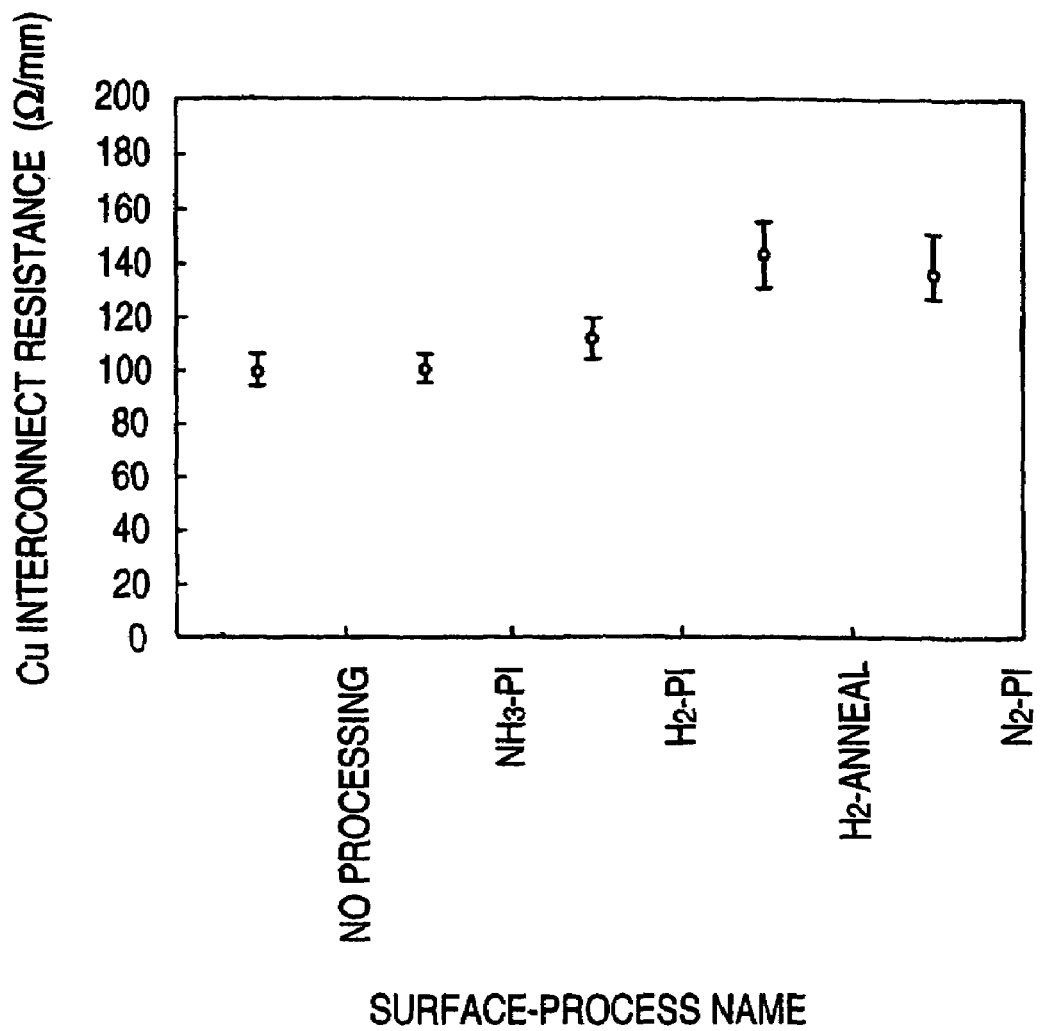
FIG. 16 is a graph showing an interconnect resistance.
Figure 17:
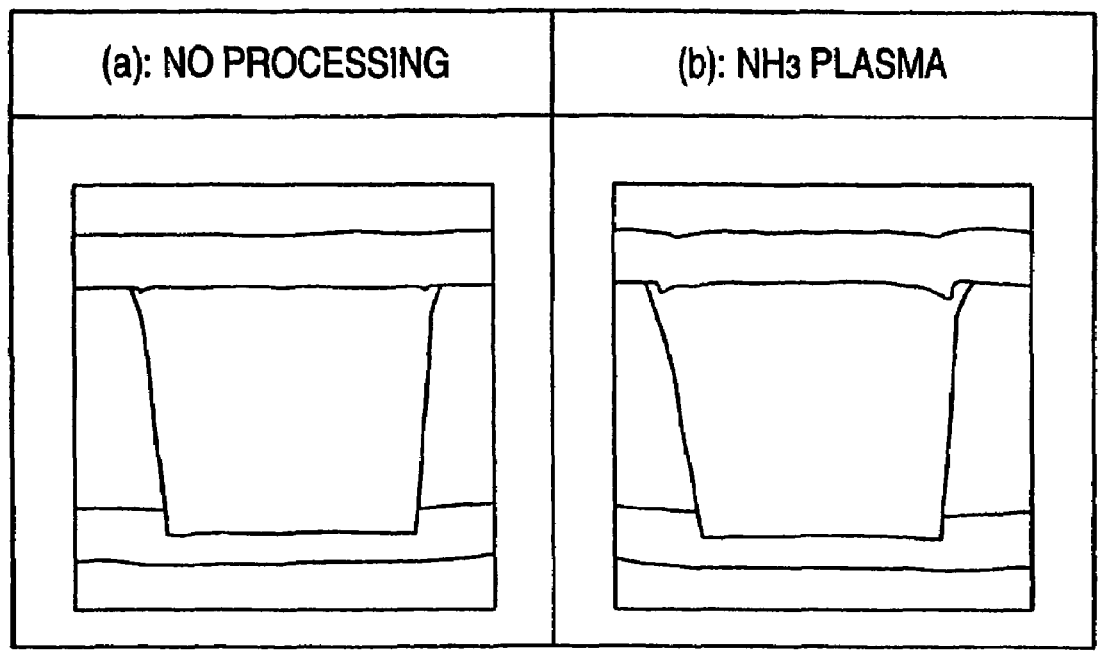
FIG. 17 is a diagram formed by tracing of a TEM picture showing an interconnect part in the case of no processing, and a diagram formed by tracing of a TEM picture showing an interconnect part in the case of carrying out an ammonia plasma process.
Figure 18:
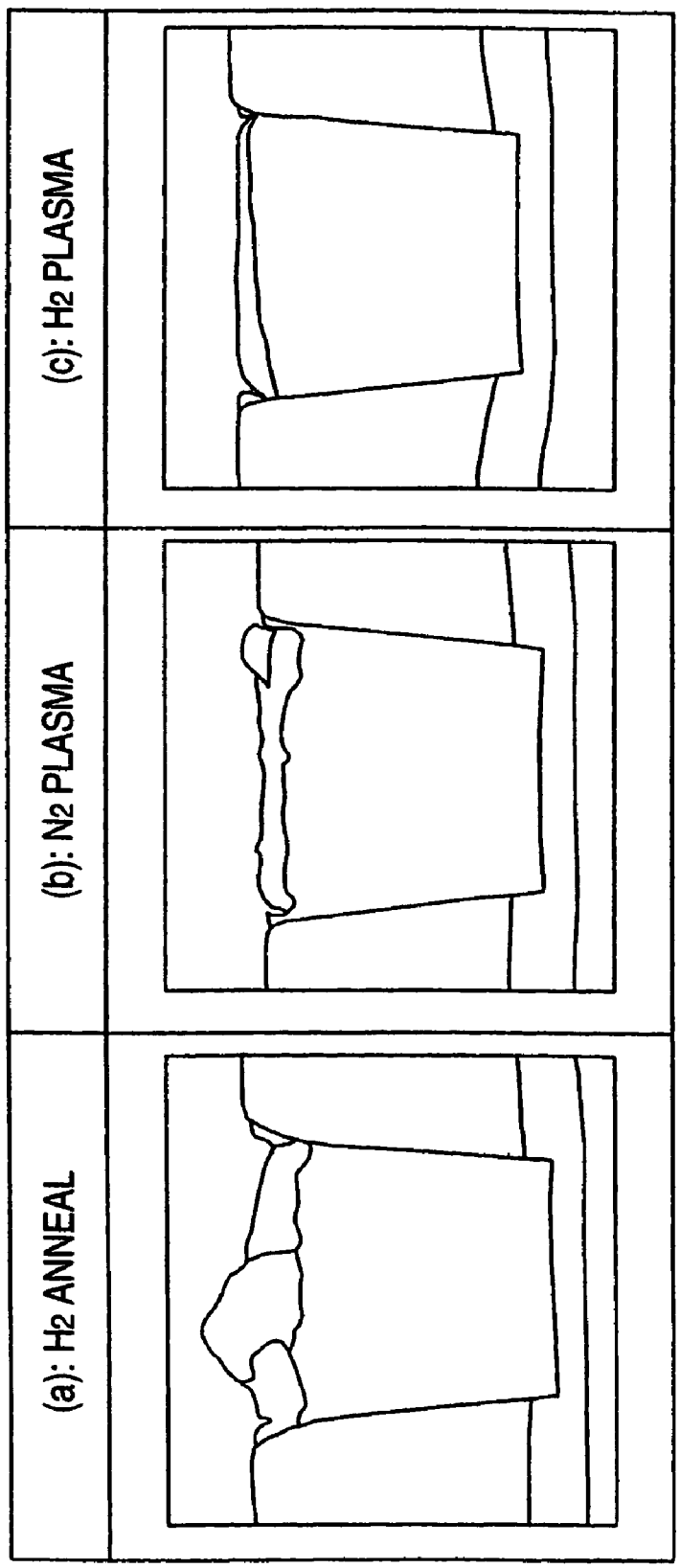
FIG. 18 is a diagram formed by tracing of a TEM picture for comparison purposes.

Also, the present embodiment can reduce the resistance of the Cu interconnect. FIG. 16 shows a result of measurement of interconnect resistances in the case of carrying out various processes. In the cases where there is no process (not carrying out a plasma process) and where a plasma process is carried out, the values are significantly low as compared to those of the other cases (hydrogen plasma process, hydrogen anneal, nitrogen plasma process). FIG. 17 and FIG. 18 are trace figures of TEM pictures observing the interface of a Cu interconnect and a cap film (silicon nitride film) in the case of carrying out each of these processes.

In the cases of no process and an ammonia plasma process (FIG. 17), no differential is seen at the interface. However, in the case of hydrogen anneal and nitrogen plasma processes (FIG. 18), a copper silicide (CuSi) layer is formed at the interface. This silicide layer seems to be a cause of resistance increase. Such a silicide layer is formed in the reaction with a silane gas upon forming a silicon nitride film (cao film). However, where an ammonia plasma process has been carried out, an extremely thin silicon nitride film is formed on a copper surface. This silicon nitride film is considered to serve as a blocking layer against silicide formation. On the other hand, it can be considered that, by only deoxidizing the copper surface, an active copper surface is exposed and promoted for reaction with silicon, thereby readily forming a silicide layer. Meanwhile, in the case of a hydrogen plasma process (FIG. 18), any formation is seen in the interface. However, there are many cases of not creating such a formation. It can be considered that the silicidation degree is low in the case of a hydrogen plasma process.

It has been found for the first time by results of a study by the present inventors that the following model can be considered from the foregoing analysis results. FIG. 19(a) shows a schematic illustration of a TDDB deterioration mechanism, and FIG. 19(b) shows an energy band of the same. Namely, where the ammonia plasma process is not carried out, the surface of the copper interconnect is influenced by the subsequent surface processes to form thereon copper oxide (CuO), and copper silicide (Cu compound) upon forming a cap film (silicon nitride film) 68. Such copper oxide or copper silicide is ready to ionize as compared to pure copper. Such ionized copper is drifted by an interlevel electric field and diffused into an interlevel insulation film.

Meanwhile, where the ammonia plasma process is not carried out, the interface between an insulation film (silicon oxide film) 66 forming a copper-based buried interconnect 65 and a cap film (silicon nitride film) 68 is formed with a number of CMP damages, organic matter or dangling bonds, thus being non-continuous and insufficient in adhesion. The presence of such dangling bonds produce an action to promote the diffusion of copper ions so that the copper ions are drifted and diffused along the interface. Namely, a leakage path is formed at the interface between the interconnects. The leakage current flowing through the leakage path is accompanied with a long-time leakage action and thermal stresses due to current, and thereafter is acceleratedly increased in current value, resulting in dielectric breakdown (lowered TDDB life).

Contrary to this, FIGS. 20(a) and 20(b) show a schematic diagram of a TDDB-improvement mechanism and an energy band of the same where the ammonia plasma process has been carried out. Because an ammonia plasma process is carried out on a surface of a copper-based buried interconnect 65, an oxide layer on the surface of the buried interconnect 65 is deoxidized so as to vanish. Because a thin nitride layer is formed on the surface of the buried interconnect 65, a copper silicide is not formed upon forming a silicon nitride film 68. Due to this, it is possible to not create a source substance predominantly supplying copper ions forming a cause of current leakage and dielectric breakdown. Also, because the ammonia plasma process is carried out on the surface of an insulation film (silicon oxide film) 66, it is possible to make the connection to the cap film (silicon nitride film) 68 continuous and decrease the density of dangling bonds, thus suppressing the formation of a leakage path. Also, the surface of the insulation film 66 can be made in a clean state. Accordingly, it is possible to suppress the occurrence of copper ions forming a cause of lowering the TDDB life and to form a junction interface of the insulation film 66 and the cap film 68 that can suppress the diffusion of copper. This can improve the TDDB life.

Also, it can be considered from the foregoing analysis that the TDDB life can be improved also by a hydrogen plasma process. Namely, a hydrogen plasma process deoxidizes the copper surface, thereby terminating, at Si—H, the dangling bonds, such as Si—O—, and Si—OH as a cause thereof. When forming a cap film (silicon nitride film), the weak-bonded Si—H in the surface is desorbed and replaced with Si—N. This forms a continuous interface of insulation film (silicon oxide film) 66 and a cap film (silicon nitride film) 68. However, the interconnect resistance increases, as described in the foregoing.

Figure 21:
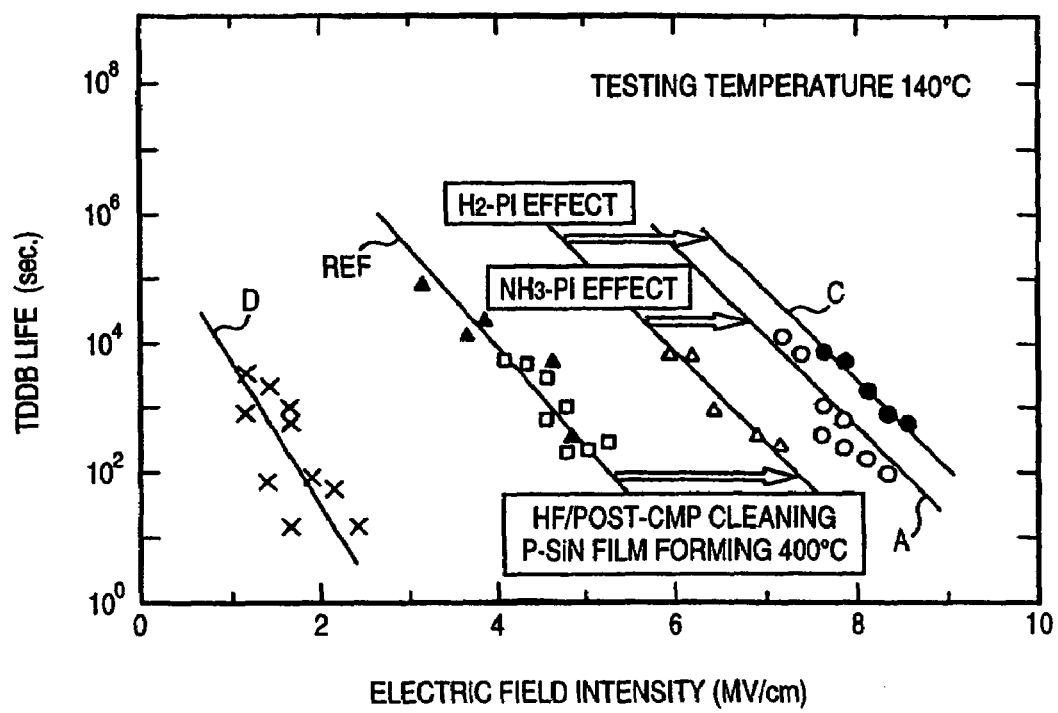
FIG. 21 is a graph showing a TDDB life.

FIG. 21 is a graph showing the data of TDDB life where a hydrogen plasma process is carried out. For reference, a line Ref (no-processing) and a line A (ammonia plasma process) are shown. With a hydrogen plasma process (line C), it is understood that the TDDB life is improved greatly. In the case of a hydrogen plasma, it is expected that plasma damage will be relieved. Accordingly, this is extremely effective when such a material can be applied that is another material replacing, as a cap film, a silicon nitride film and not to cause a reaction product with Cu. Incidentally, in a nitrogen plasma process (line D), the TDDB life is rather lowered. As understood from FIGS. 14(a) to 14(d) and 15(a) to 15(d), this seems to be caused by rather an increase of organic-matter deposition due to the nitrogen plasma process. Furthermore, because the adhesion between the buried interconnect 65 and insulation film 66 and the cap film 68 is improved, there is an effect to increase the strip-resisting strength at the interface and increase the margin.

The ammonia plasma process is not limited to a single gas of ammonia or hydrogen, but processing may be carried out with a mixture-gas plasma including an inert gas of nitrogen, argon, helium or the like, i.e., a mixture gas of ammonia and hydrogen, nitrogen, argon or helium or a mixture gas of hydrogen and ammonia, nitrogen, argon or helium. Furthermore, it is satisfactory to use a mixture gas in a hypercomplex system of a ternary or quarternary system as selected from those gases. In this case, hydrogen, ammonia or hydrogen plus ammonia in sum is required, mixed by 5% or more with respect to a total flow rate (mass flow rate).

The present inventors have qualitatively analyzed the TDDB deterioration mechanism as described above and have established a reliable process (Japanese Patent Application No. 226876/1999 or Japanese Patent Application No. 104015/2000). However, because, as the material of an interlevel insulation film, a low-dielectric-constant insulation material has recently been used from a viewpoint of reducing the interlevel capacitance or the like, the interlevel dielectric strength is naturally lower than the case of using a silicon oxide film. Moreover, the effective electric field intensity increases due to the scaling down of line pitch (e.g. scaling down of from 1.0 μm pitch to 0.5-μm or 0.44-μm pitch). These factors result in further difficulty in securing reliability, i.e. TDDB life. Namely, in addition to the foregoing ammonia plasma surface treatment, it is essentially required to develop a process to further improve the TDDB life.

Accordingly, the present embodiment, after CMP and post-CMP washing, carries out hydrogen plasma or ammonia plasma processes and thereafter forms a cap film in a continuous fashion without release to the air. This can improve the TDDB life further and secure sufficient reliability even in the combination of a low-dielectric-constant insulation film and a copper-based buried interconnect. Also, by combining this with the foregoing post-CMP cleaning technique of the present embodiment, it is possible to further improve the interconnect electric characteristics and TDDB life.

Next, explanation will be given of the case in which the technical idea of the invention is applied to a fabrication method for a CMIS (Complimentary MIS)—LSI (Large Scale Integrated Circuit), with reference to the flowchart of FIG. 22 and FIGS. 23($a$) to 35. Incidentally, FIG. 23($a$) and FIG. 24($a$) are plan views, while FIGS. 23($b$) and 24($b$) are a sectional views taken on line X—X in FIGS. 23($a$) and 24($a$), respectively.

Figure 23:
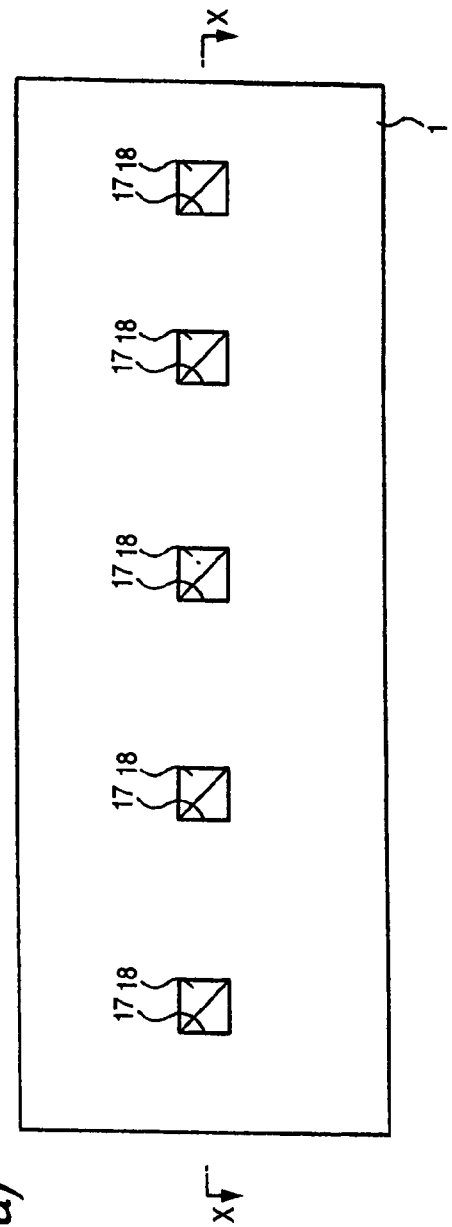
FIG. 23(a) is a plan view showing a step in the process of fabrication of a semiconductor integrated circuit device representing one embodiment of the invention.
FIG. 23(b) is a sectional view taken on line X—X in FIG. 23(a)
Figure 23:
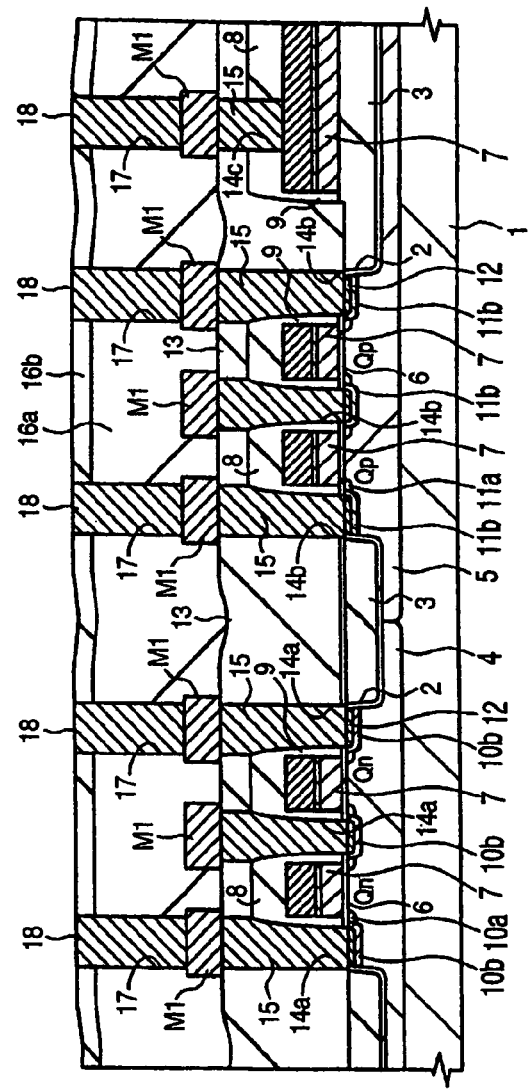
Figure 24:
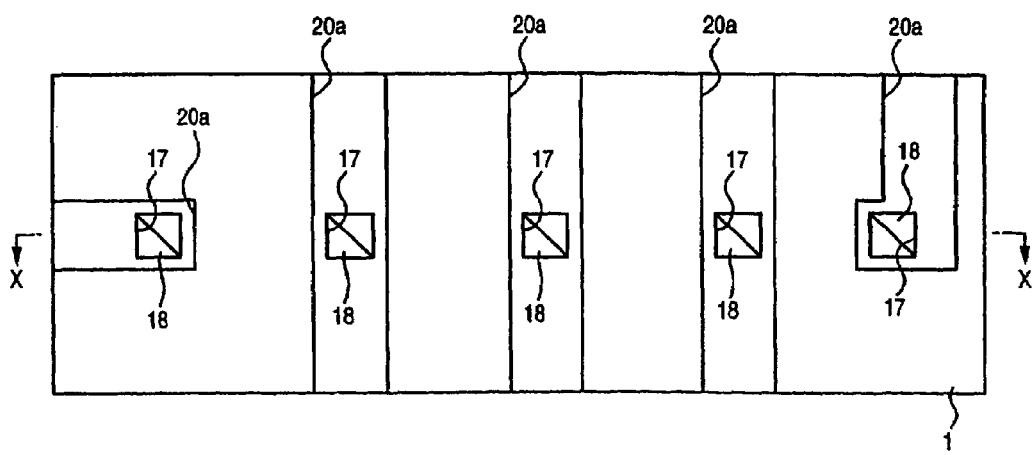
FIG. 24(a) is a plan view showing a subsequent step in the process of fabrication of the semiconductor integrated circuit device following the step of FIG. 23(a)
FIG. 24(b) is a sectional view taken on line X—X in FIG. 23(b)
Figure 24:
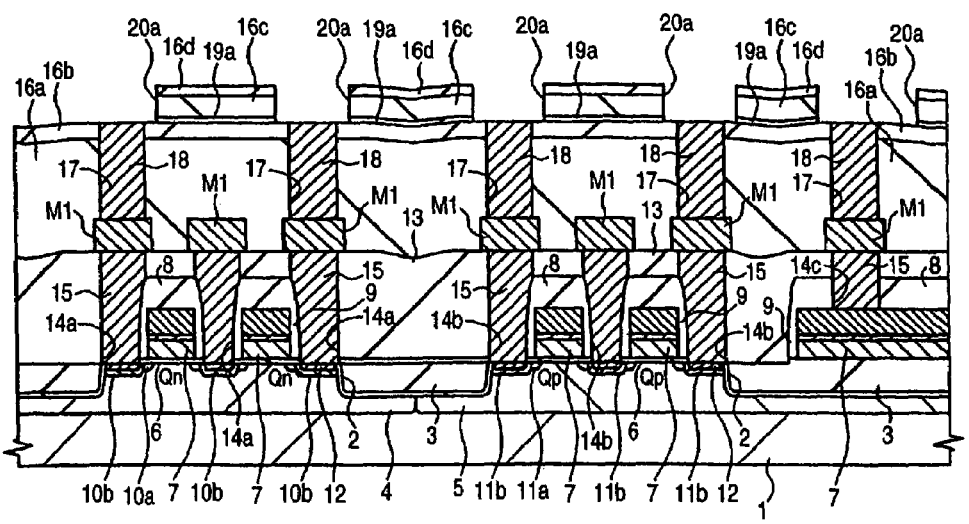

In FIG. 23($a$), a semiconductor substrate 1 forming a wafer (hereinafter referred merely to as substrate) comprises p-type single-crystal silicon having a specific resistance of nearly 1–10 Ωcm, for example. The semiconductor substrate 1, as seen in FIG. 23($b$), has a device isolation trench 2 formed in a main surface (device-forming surface) thereof. In the device isolation trench 2 there is formed a trench-formed device isolation region (trench isolation) buried, for example, with a silicon oxide film. Also, a p-type well 4 and an n-type well 5 are formed in the semiconductor substrate 1 at a main-surface side thereof. Boron, for example, is introduced in the p-type well 4 and phosphorus, for example, is introduced in the n-type well 5. In the region forming the p-type well 4 and n-type well 5 encompassed by the device isolation region, an nMISQn and a pMISQp are formed.

The nMISQn and the pMISQn each have a gate dielectric film 6 formed by a silicon oxide film having a thickness, e.g. of nearly 6 nm. The film thickness of the gate dielectric film 6, referred to herein, signifies a silicon-oxide-reduced film thickness (hereinafter referred merely to as reduced film thickness), which in some cases might not coincide with the actual film thickness.

The gate dielectric film 6 may be structured by a silicon oxide nitride film in place of the silicon oxide film. The silicon oxide nitride film, having a high effect to suppress the occurrence of interfacial levels in the film, as compared to a silicon oxide film, and reduce electron traps, can improve the resistance to hot carriers and reduce the dielectric strength. To form a silicon oxide nitride film, the semiconductor substrate 1 may be thermally processed in a nitrogen-contained gas atmosphere, such as NO, $NO_2$ or $NH_3$. Meanwhile, a similar effect to the above can be obtained by forming a silicon-oxide gate electrode film 6 on a surface of the p-type well 4 and n-type well 5, and thereafter thermally processing the semiconductor substrate 1 in the foregoing nitrogen-contained gas atmosphere, thereby segregating nitrogen to the interface of the gate dielectric film 6 and the semiconductor substrate 1.

Meanwhile, the gate dielectric film 6 may be formed by a composite insulation film, for example, of a silicon nitride film or silicon oxide film and a silicon nitride film. If the silicon-oxide gate dielectric film 6 is reduced in silicon-dioxide-reduced film thickness down to 5 nm or less, particularly 3 nm or less, the lowering of the dielectric strength is directly actualized due to the occurrence of tunnel current or stress-caused hot carriers. Because the silicon nitride film has a dielectric constant higher than that of the silicon oxide film, the silicon-dioxide-reduced film thickness thereof is smaller than the actual film thickness. Namely, even where a silicon nitride film is physically thin, it is possible to obtain a capacitance equivalent to that of a relatively thin silicon oxide film. Consequently, by structuring the gate dielectric film 6 as a single silicon nitride film or a composite film of silicon oxide together therewith, its effective film thickness can be increased greater than a gate dielectric film structured by a silicon oxide film, thereby improving the occurrence of tunnel leakage current or the lowering in dielectric strength due to hot carriers. Also, the silicon oxide nitride film is immune to penetrate impurity as compared to the silicon oxide film.

Accordingly, by structuring a gate oxide film 6 as a silicon oxide nitride film, it is possible to suppress a variation of the threshold voltage resulting from the diffusion of the impurity in a gate electrode material into the semiconductor substrate.

Herein, the reduced film thickness dr of a single insulation film or composite insulation film is a thickness defined by the following formula, provided that the specific dielectric constant of the insulation film being considered is ∈i, the film thickness thereof is di and the specific dielectric constant of silicon dioxide is ∈S.

$$dr = \sum \frac{\varepsilon i}{\varepsilon s} di \qquad \text{[Formula 1]}$$

For example, the dielectric constant of silicon oxide ($SiO_2$) is 4–4.2 while the dielectric constant of silicon nitride ($Si_3N_4$) is 8. Accordingly, computing with the dielectric constant of silicon nitride taken as twice the dielectric constant of silicon oxide, a silicon nitride film having a film thickness of 6 nm, for example, has a silicon-dioxide-reduced film thickness of 3 nm. Namely, a gate dielectric film formed by a silicon nitride film having a film thickness of 6 nm is equivalent in capacitance to a gate dielectric film formed by a silicon oxide film having a film thickness of 3 nm. Also, a gate dielectric film formed by a composite film of a silicon oxide film having a film thickness of 2 nm and a silicon nitride film having a film thickness of 2 nm (reduced film thickness=1 nm) is equal in capacitance to a gate dielectric film formed by a single silicon oxide film having a film thickness of 3 nm.

The gate electrode 7 of the nMISQn and pMISQp is formed by a laminated film including, for example, a low-resistance polycrystal silicon film, a WN (tungsten nitride) film and a W (tungsten) film. It is noted that the gate electrode 7 may be formed using a laminated film including a tungsten silicide film or cobalt (Co) silicide film deposited on a low-resistance polycrystal silicon film. Also, the material of the gate electrode 7 may use an alloy of polycrystal or single-crystal silicon (Si) and germanium (Ge). On the gate electrode 7 there is formed a gate cap film 8 formed of silicon oxide, for example. Also, sidewalls 9 are formed, for example, of silicon oxide on the side surfaces of the gate electrode 7.

The nMISQn has $^-$ semiconductor region 10a and $n^+$ semiconductor region 10b as source/drain semiconductor regions for the nMISQn both introduced, for example, with phosphorus or arsenic. The pMISQp has a $p^-$ semiconductor region 11a and a $p^+$ semiconductor region 11b as source/drain semiconductor regions for the pMISQp both introduced, for example, with boron. Meanwhile, a silicide layer 12, for example, of titanium silicide, cobalt silicide or the like is formed in a surface of the $n^{30}$ semiconductor region 10b and $p^+$ semiconductor region 11b.

An insulation film 13 is deposited on the substrate 1. This insulation film 13 is formed by a film high in reflow property to fill a narrow space around the gate electrode, e.g. a BPSG (Boron-doped Phospho Silicate Glass) film. This may be structured by an SOG (Spin On Glass) film to be formed due to a spin application technique. The insulation film 13 is formed with contact holes 14a–14c. In a bottom of the contact holes 14a, 14b, part of a top surface of the silicide layer 12 is exposed. Also, in the bottom of the contact hole 14c, part of a top surface of the gate electrode 7 is exposed. Within the contact holes 14a–14c, a plug 15 is formed. The plug 15 is formed, for example, by depositing a titanium nitride (TiN) film and tungsten (W) film over the insulation film 13 including the inside of the contact holes 14a–14c by a CVD technique or the like and removing an unwanted portion of the titanium nitride film and tungsten film on the insulation film 13 by a CMP technique or etch-back technique to leave these films only inside the contact holes 14a–14c.

A first-level interconnect M1 is formed on the insulation film 13. The first-level interconnect M1 is formed, for example, of tungsten and electrically connected to the source/drain or gate electrode 7 of the nMISQn or pMISQp through the plug 15. Also, an insulation film 16a and an insulation film 16b are deposited on the insulation film 13 in order from the lower level in a manner covering the first-level interconnect M1. The insulation film 16a is formed by an insulation film having a low dielectric constant, e.g. organic polymer, while the insulation film 16b is formed, for example, of silicon oxide serving to secure the mechanical strength of the interlayer insulation film.

The organic polymer structuring an insulation film 16a includes, for example, SiLK as a material based on polyallylether (PAE) (by U.S. The Dow Chemical Co.; specific dielectric constant=2.7, heat-resisting temperature=490° C. or higher, dielectric strength=4.0–5.0 MV/Vm) or FLARE (by U.S. Honeywell Electronic Materials; specific dielectric constant=2.8, heat-resisting temperature=40° C. or higher) and so on. The PAE-based material has a feature of high basic properties, excellent mechanical strength, thermal stability and low cost.

Also, the insulation film 16a can be a SiOC-based material, a SiOF-based material, an HSQ (hydrogen silsequioxane)-based material, an MSQ (methyl silsesquioxane)-based material, a porous HSQ-based material, a porous MSQ-based material or a porous organic material, in place of the PAE-based material.

The SiOC-based material includes, for example, Black-Diamond (by U.S. Applied Materials; specific dielectric constant=3.0–2.4, heat-resisting temperature=450° C.), CORAL (by U.S. Novellus Systems; specific dielectric constant=2.7–2.4, heat-resisting temperature=500° C.), Aurora2.7 (by ASM Japan; specific dielectric constant=2.7, heat resisting temperature=450° C.) and p-MTES (by Hitachi Kaihatsu, specific dielectric constant=3.2).

The HSQ-based material includes, for example, OCD T-12 (by Tokyo Ohka Kogyo; specific dielectric constant=3.4–2.9, heat-resisting temperature 450° C.), FOx (by U.S. Dow Corning; specific dielectric constant=2.9) and OCL T-32 (by Tokyo Ohka Kogyo; specific dielectric constant=2.5, heat-resisting temperature=450° C.).

The MSQ-based material includes, for example, HSG-R7 (by Hitachi Chemical, specific dielectric constant=2.8, heat-resisting temperature=650° C.), OCD T-9 (by Tokyo Ohka Kogyo; specific dielectric constant=2.7, heat-resisting temperature=600° C.), LKD-T200 (by JSR; specific dielectric constant=2.7–2.5, heat-resisting temperature=450° C.), HOSP (by U.S. Honeywell Electronic Materials; specific dielectric constant=2.5, heat-resisting temperature=550° C.), HSG-RZ25 (by Hitachi Chemical, specific dielectric constant=2.5, heat-resisting temperature=650° C.), OCL T-31 (by Tokyo Ohka Kogyo; specific dielectric constant=2.3, heat-resisting temperature=500° C.) and LKD-T400 (by JSR; specific dielectric constant=2.2–2, heat-resisting temperature=450° C.).

The porous HSQ-based material includes, for example, HLK (by U.S. Dow Corning; specific dielectric constant=2.5–2), OCL T-72 (by Tokyo Ohka Kogyo; specific dielectric constant=2.2–1.9, heat-resisting temperature=450° C.), Nanoglass (by U.S. Honeywell Electronic Materials; specific dielectric constant=2.2–1.8, heat-resisting temperature=500° C. or higher) and MesoELK (by U.S. Air Products and Chemicals; specific dielectric constant=2 or lower).

The porous MSQ-based material includes, for example, HSG-6211X (by Hitachi Chemical; specific dielectric constant=2.4, heat-resisting temperature=650° C.), ALCAP-S (by Asahi Kasei Kogyo; specific dielectric constant=2.3–1.8, heat-resisting temperature=450° C.), OCL T-77 (by Tokyo Ohka Kogyo; specific dielectric constant=2.2–1.9, heat-resisting temperature=600° C.), HSG-6210X (by Hitachi Chemical; specific dielectric constant=2.1, heat-resisting temperature 650° C.), and silica aerogel (Kobe Steel; specific dielectric constant 1.4–1.1).

The porous organic material includes, for example, Poly-ELK (by U.S. Air Productsand Chemicals; specific dielectric constant=2 or lower, heat resisting temperature=490° C.).

In the insulation film 16a, 16b, a through-hole 17 is opened to expose part of the first-level interconnect M1. A plug 18, for example, of tungsten is formed in the through-hole 17.

The SiOC-based material and SiOF-based material, for forming an insulation film 16a, and the insulation film 16b are formed by the CVD technique. In the case of Black Diamond described above, for example, a mixture gas of trimethylsilane and oxygen is used as a material gas. For P-MTES described above, the material gas uses, for example, a mixture gas of methyltriethoxysilane and $N_2O$. The other insulation materials having low dielectric constant are formed by an application technique.

First, in the present embodiment, an insulation film 19a of a silicon nitride film having a film thickness, for example, of 50 nm is deposited on the foregoing semiconductor substrate 1 by the plasma CVD technique or the like, as shown in FIGS. 24(a) and 24(b). The insulation film 19a may be a silicon carbide (SiC) or silicon oxide film formed by the plasma CVD technique, in place of the silicon nitride film. The silicon carbide-based material to be formed by the plasma CVD technique includes, for example, BLOk (by AMAT; specific dielectric constant=4.3), wherein a mixture gas of trimethylsilane and helium, for example, is used upon formation thereof. Also, the silicon oxide-based material to be formed by the plasma CVD technique includes, for example, PE-TMS (by Canon; specific dielectric constant=3.9), wherein a mixture gas of trimethoxysilane and nitride oxide ($N_2O$), for example, is used upon formation thereof. These if used can reduce the dielectric constant to a greater extent than that of the silicon nitride film and hence decrease the interconnect capacitance or the like, making it possible to improve the operation speed of the semiconductor integrated circuit device.

Subsequently, insulation films 16c, 16d are deposited in order from the lower level on the insulation film 19a (step 100 in FIG. 22). The insulation film 16c comprises a material selected from the low dielectric constant of insulation films the same as the insulation films 16a. Also, the insulation film 16d is formed of the same material as that of the insulation film 16b. Thereafter, the insulation films 16d, 16c, 19a are preferentially removed by dry etching using a photoresist film as a mask thereby forming an interconnect trench (interconnect opening) 20a (step 101 in FIG. 22). To form an interconnect trench 20a, the insulation film 16d, 16c is preferentially etched using the insulation film 19a as an etching stopper, and thereafter the insulation film 19a is etched. In this manner, a thin insulation film 19a is previously formed in a layer underlying the insulation film 16c, 16d where an interconnect trench 20a is to be formed. Etching is at first stopped at the surface of the insulation film 19a and thereafter the insulation film 19a is etched thereby improving the depth precision of the interconnect trench 20a. Thus, the interconnect trench 20a can be formed without encountering overetching.

Next, a buried interconnect for a second-level interconnect is formed in the interconnect trench 20a.

Figure 22:
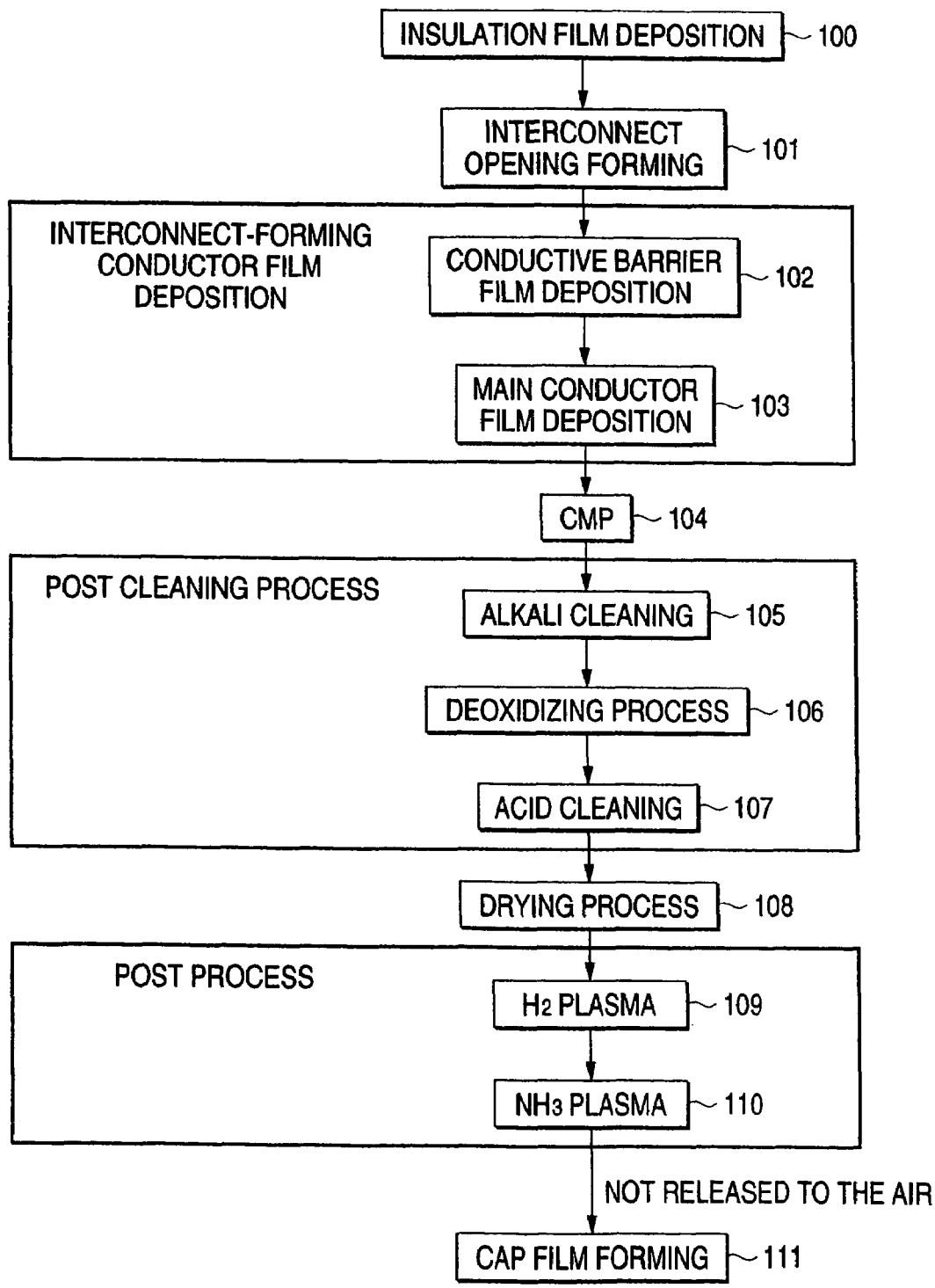
FIG. 22 is a flowchart showing a method of fabrication of a semiconductor integrated circuit device as one embodiment of the invention.
Figure 25:
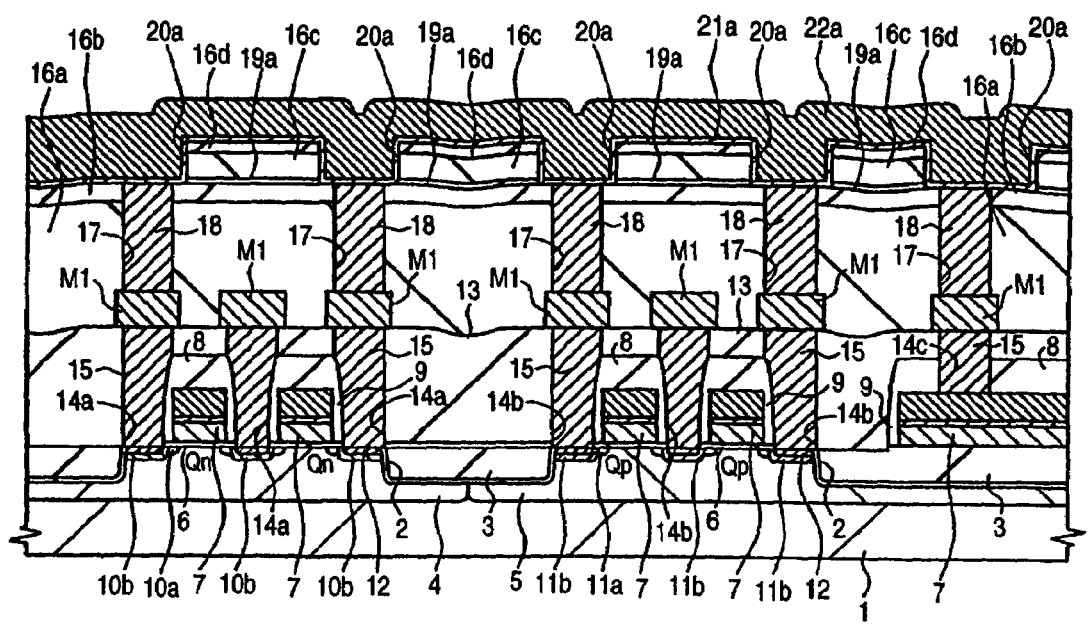
FIG. 25 is a sectional view showing a subsequent step in the process of fabrication of the semiconductor integrated circuit device following the step of FIG. 24(a)

First, as shown in FIG. 25 a thin conductive barrier film 21a, for example, of titanium nitride (TiN), is formed over the insulation film 16c, 16d including the inside of the interconnect trench 20a by the sputtering technique or the like (step 102 in FIG. 22). The conductive barrier film 21a has the ability to prevent the diffusion of copper for forming a main conductor film, hereinafter discussed, to improve the adhesion of the main conductor film to the insulation film 16c, 16d and to improve the wetness of copper upon reflowing the main conductor film. The film having such actions preferably uses, in place of titanium nitride, a refractory-metal nitride, such as tungsten nitride (WN) and tantalum nitride (TaN), which are less reactive with copper. Meanwhile, it is possible to use, in place of the titanium nitride, a material of a refractory-metal nitride added with silicon (Si) or a refractory metal, such as tantalum (Ta), titanium (Ti), tungsten (W), titanium tungsten (TiW) or the like, which are less reactive with copper.

The present embodiment exemplifies a conductive barrier film 21a in the case having a maximum thickness of 50 nm. However, according to the result of consideration by the present inventors, it has been revealed that the conductive barrier film 21a can be further reduced in thickness or eliminated. This will be hereinafter discussed.

Subsequently, a main conductor film 22a, for example, of copper, is deposited onto the conductive barrier film 21a (step 103 in FIG. 22). In the present embodiment, the main conductor film 22a has been formed by a plating technique. The use of a plating technique makes it possible to form a main conductor film 22a that is favorable in film quality with preferred burying and at low cost. In this case, a thin conductor film of copper was first deposited on the conductive barrier film 21a by the sputtering technique, and thereafter a comparatively thick conductor film of copper was grown thereon by an electrolytic plating technique or electroless plating technique using a plating solution based, for example, on copper sulfate, thereby depositing a main conductor film 22a.

It is noted that the main conductor film 22a can be formed by a sputtering technique. The sputtering technique for forming such a conductive barrier film 21a and main conductor film 22a may be the usual sputtering technique but preferably uses a sputtering technique having a high directivity, e.g. a long-throw sputtering technique or a collimate sputtering technique, with a view toward improving the burying property and film quality. Also, the main conductor film 22a can be formed by a CVD technique.

Subsequently, the substrate 1 is thermally processed in a nonoxidizing atmosphere (e.g. hydrogen atmosphere) at nearly 475° C., for example, thereby reflowing the main conductor film 22a to bury copper in the interconnect trench 20a without producing gaps.

Figure 26:
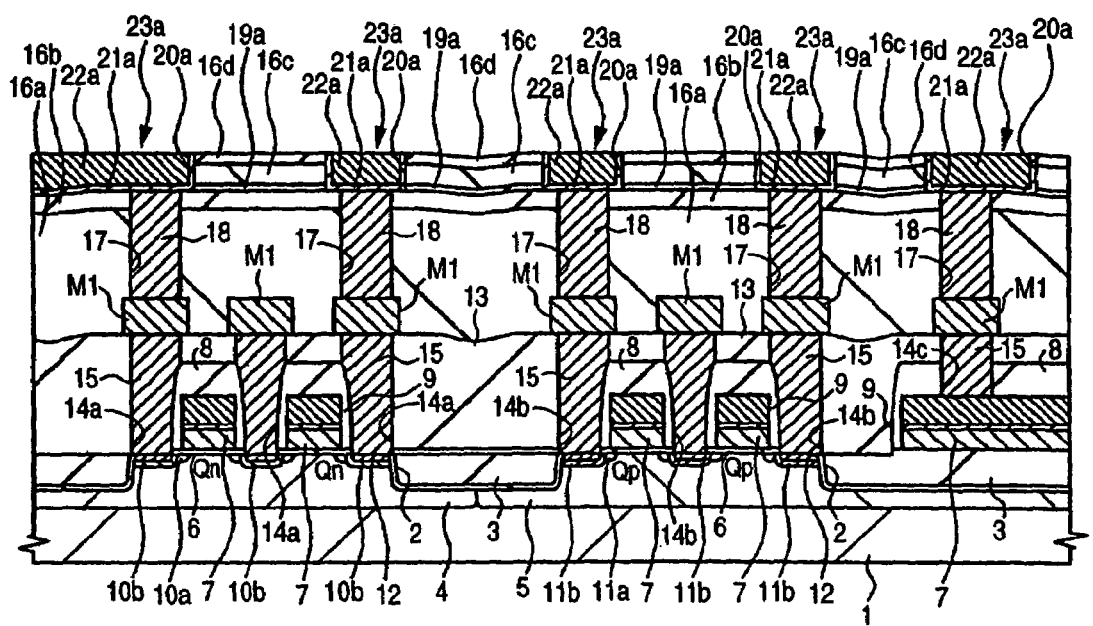
FIG. 26 is a sectional view showing a subsequent step in the process of fabrication of the semiconductor integrated circuit device following the step of FIG. 25.

Next, the main conductor film 22a and conductive barrier film 21a are polished by a CMP technique (step 104 in FIG. 22), and thereafter a buried interconnect 23a based on copper is formed in the interconnect trench 20a through a cleaning process with pure water or the like, as shown in FIG. 26. The details of the CMP process and CMP apparatus will be hereinafter described.

Subsequently, a post-CMP cleaning process is entered in a state in which the surface of the substrate 1 is kept in a wet state. First, an alkali cleaning process is carried out for the substrate 1 (step 105 in FIG. 22). Herein, the aim is to remove foreign matter, such as slurry, used in the CMP process, wherein the acid slurry that has adhered to the substrate during CMP is neutralized so as to arrange the zeta potential of the substrate 1, foreign matter and cleaning brush. In order to eliminate an absorbing force acted between them, scrub cleaning (or brush cleaning) is conducted on the surface of the substrate 1 while supplying thereto a weak alkali agent solution, for example, of nearly PH 8 or higher. The alkali agent solution used was Diluted Amino Ethanol (DAE having a composition of 2-aminoethanol and $CH_2CH_2OH$ in an concentration of approximately 0.001%–0.1%, preferably 0.1%). This agent solution produces less etch action on copper and has a cleaning capability equivalent to $NH_4OH$. The details of the alikali cleaning process will be hereinafter explained.

Figure 27:
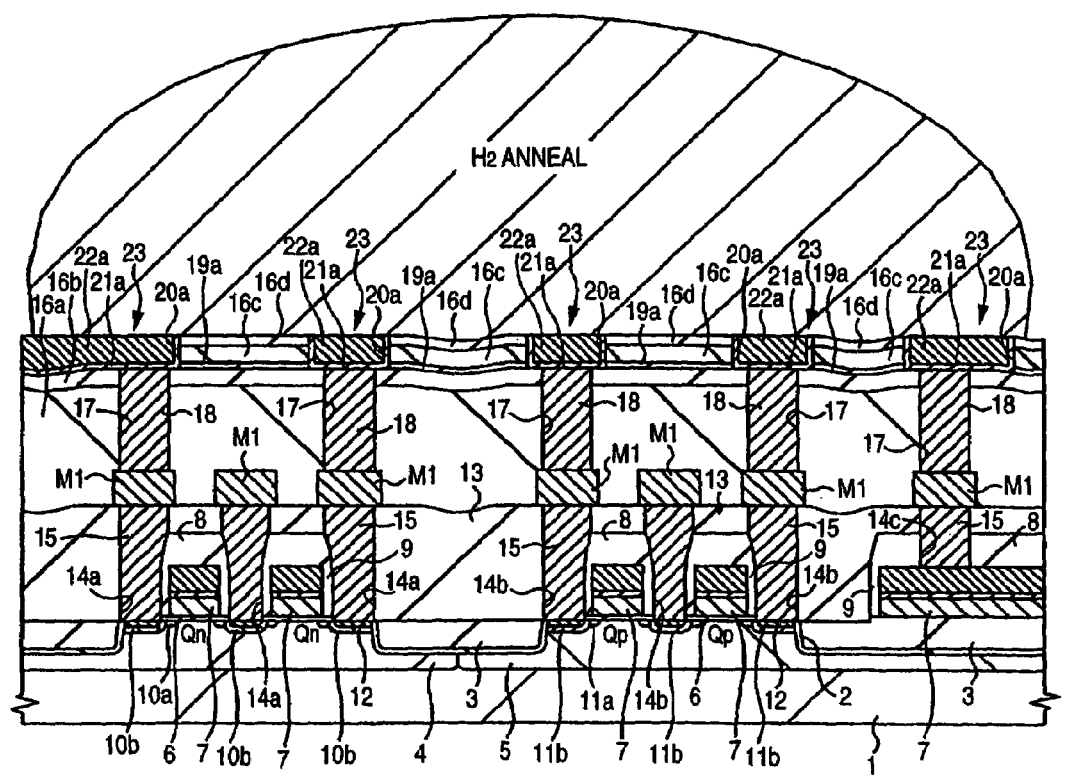
FIG. 27 is a sectional view showing a subsequent step in the process of fabrication of the semiconductor integrated circuit device following the step of FIG. 26.

Subsequently, a deoxidizing process is carried out on the substrate 1 (step 106 in FIG. 22). Herein, as shown in FIG. 27, a thermal process (hydrogen ($H_2$) anneal) was carried out on the substrate 1 in a hydrogen atmosphere at, for example, 200° C.–475° C., preferably 300° C., for 0.5–5 minutes, preferably approximately 2 minutes. This makes it possible to deoxidize the copper oxide formed in the surface of the buried interconnect 23a during CMP and hence prevent the buried interconnect 23a from being etched due to the following acid cleaning. Due to this, it is possible to suppress and prevent simultaneously the variation in interconnect resistance and the occurrence of steps and further the occurrence of etch corrosion. Also, where no deoxidizing process is carried out, there is a case in which the organic matter of BTA or the like that has adhered to the surface of the substrate 1 during the CMP process acts as a mask during a cleaning process, making it impossible to favorably remove a surface layer of the insulation film 16d. However, by conducting a deoxidizing process as in the present embodiment, because the organic matter of BTA or the like that has adhered during CMP can be removed, the surface layer of the insulation film 16d can be removed sufficiently and evenly. This makes it possible to greatly improve the TDDB life of the semiconductor integrated circuit device.

Figure 28:
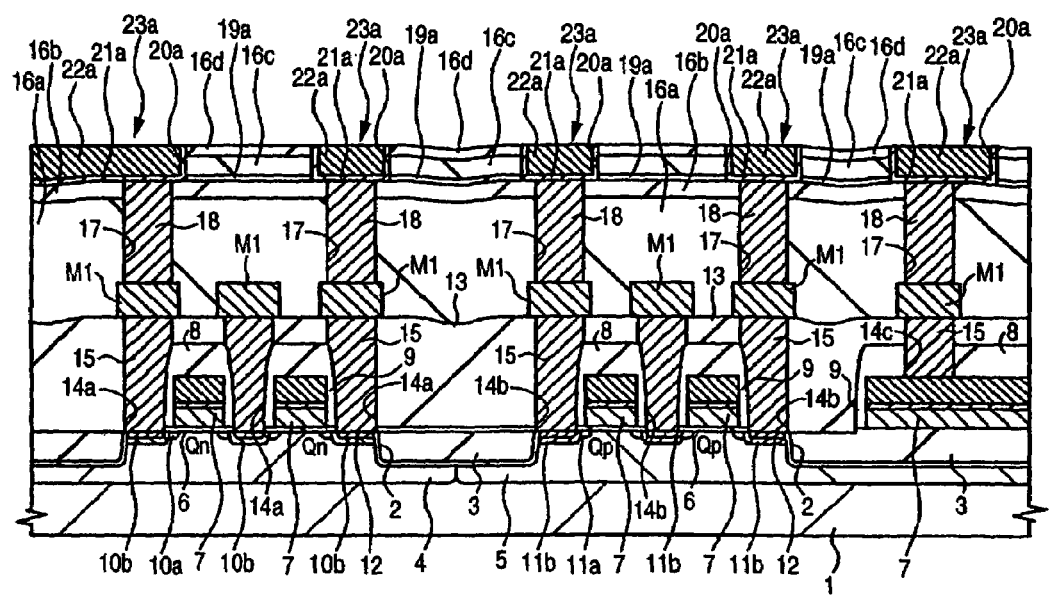
FIG. 28 is a sectional view showing a subsequent step in the process of fabrication of the semiconductor integrated circuit device following the step of FIG. 27.

Subsequently, an acid cleaning process is carried out on the substrate 1, as shown in FIG. 28 (step 107 in FIG. 22). Herein, the aim is to improve the TDDB characteristic, remove the remaining metal, decrease the dangling bonds on the surface of the insulation film 16d, remove the roughening on the surface of the insulation film 16d and so on. A hydrogen fluoride solution is fed to the surface of the substrate 1 to remove foreign particles due to etching. The mere insertion of hydrogen-fluoride cleaning can improve the TDDB characteristic. This is considered to be due to the removal of the surface damaged layer by an acid process, thereby improving the adhesion at the interface. The hydrogen fluoride (HF) cleaning uses, for example, brush scrub cleaning wherein the selected conditions are an HF concentration of 0.5% and a cleaning time of 20 seconds.

Figure 29:
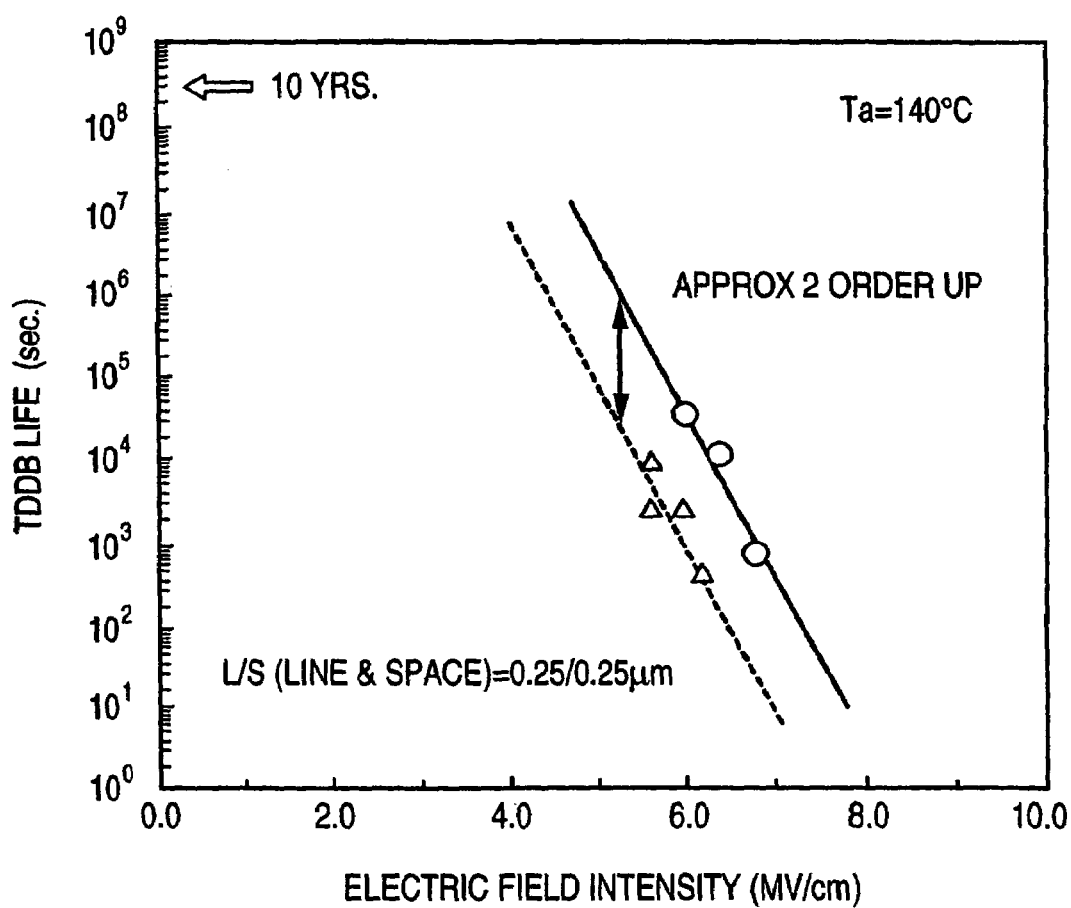
FIG. 29 is a graph showing a TDDB characteristic.

FIG. 29 shows a result of the TDDB characteristic according to the present embodiment. As compared to the TDDB characteristic in the successive sequence of alkali cleaning and acid cleaning in the figure, it is to be understood that the TDDB characteristic in the sequence of alkali cleaning, hydrogen annealing and acid cleaning is improved by two orders of magnitude. Considering the reliability of the buried copper interconnect structure using a low-dielectric-constant insulation material in the interlayer insulation film, the improvement of the TDDB life by two orders of magnitude provides a quite effective process. The reason for the improvement in the TDDB life by insertion of hydrogen annealing between alkali cleaning and acid cleaning is considered to be due to the removal of the organic matter, such as BTA, that has adhered during CMP. It is to be presumed that, if acid cleaning is carried out while organic matter adheres thereto, the cleaning on the adjacent insulation film surface (lift-off) determinative for the TDDB life cannot be made sufficiently. On the other hand, in the present embodiment, because a cleaning process is carried out after performing a hydrogen annealing process, it is possible to lift off the insulation-film surface sufficiently and evenly, thereby making it possible to improve the TDDB life.

Figure 30:
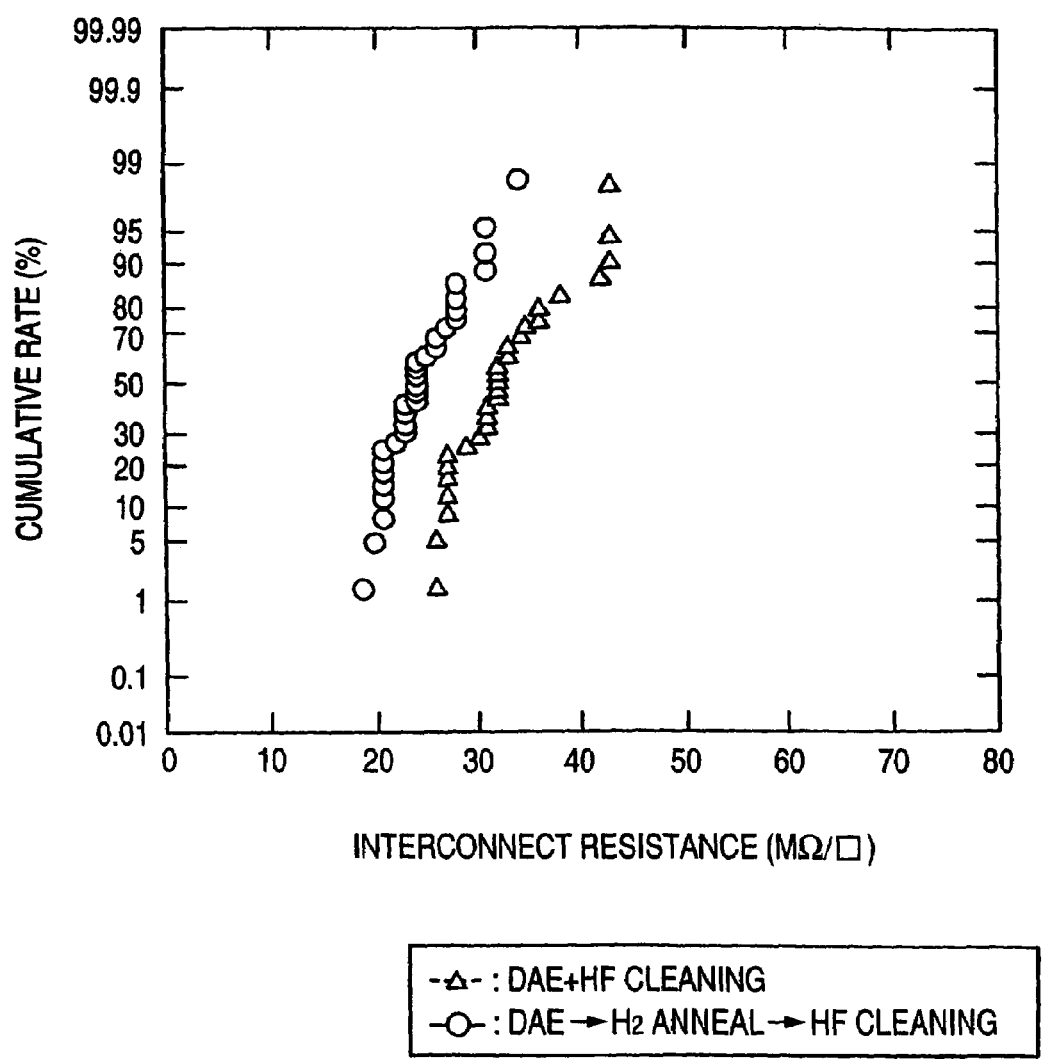
FIG. 30 is a graph showing the dependency of interconnect resistance on hydrogen annealing.

Meanwhile, as in the foregoing, the occurrence of interconnect resistance proceeds in the order of the formation and promotion of an oxide film due to CMP, the removal of a copper oxide film by an acid solution such as a hydrogen-fluoride cleaning, the increase (variation) in interconnect resistance and the occurrence of steps. Accordingly, by performing a hydrogen annealing process at a time when the alkali cleaning is ended, the copper oxide film caused upon CMP can be deoxidized into copper, thus making it possible to suppress or prevent the copper interconnect from being etched in the following acid cleaning. This can suppress or prevent simultaneously an increase of the interconnect resistance and the occurrence of a variation and steps, and further the occurrence of etch corrosion. FIG. 30 is a graph showing a dependency of the interconnect resistance upon hydrogen annealing in the case the present embodiment is applied. The interconnect resistance could have been reduced by approximately 6% by carrying out alkali cleaning, hydrogen annealing and acid cleaning in this order, as compared to that by continuously performing alkali cleaning and acid cleaning. Also, the variation of resistance could have been decreased from 6.4% to 5.9%.

Although the above example has been directed to a case of carrying out hydrogen annealing as a deoxidizing process, the invention is not limited thereto, but, for example, hydrogen plasma or ammonia plasma may be employed. In this case, in addition to the foregoing effects, the deoxidizing process time can be shortened, thereby promoting an improvement of the throughput. The advantage of hydrogen annealing as compared to the use of hydrogen plasma or ammonia plasma lies in the actual experience of broad use in the device process and capability of performing a process comparatively easily because of the absence of a requirement to form a vacuum state and the like.

Also, prior to or concurrent with the post-CMP cleaning process, the substrate 1 at its surface may be subjected to pure-water scrub cleaning, superpure-water ultrasonic cleaning, pure-water feed water cleaning or pure-water spin cleaning, or the substrate 1 at its backside can be subjected to pure-water scrub cleaning.

Next, after the cleaning process, a cap-insulation-film forming process (step 111 in FIG. 22) is entered by way of, for example, a pure-water rinse process, a drying process, such as spin drying and IPA (IsoPropyl Alcohol) vapor drying (step 108 in FIG. 22), and a post process (steps 109, 110 in FIG. 22).

Figure 31:
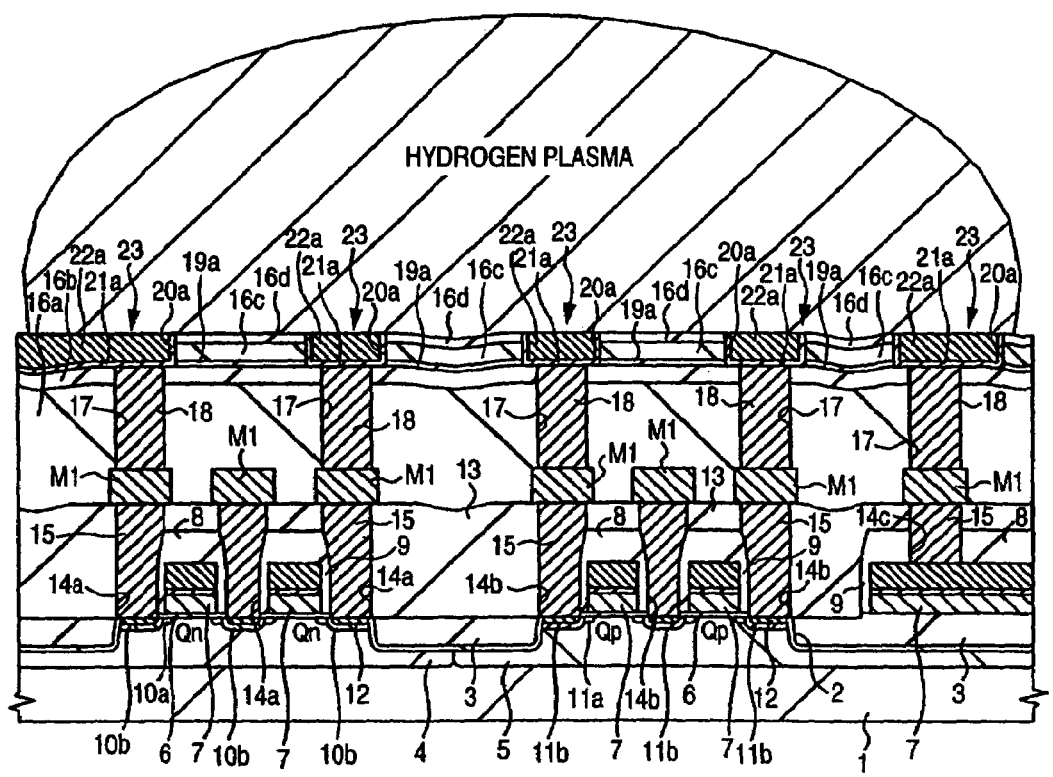
FIG. 31 is a sectional view showing a subsequent step in the process of fabrication of the semiconductor integrated circuit device following the step of FIG. 28.

Herein, as shown in FIG. 31, a hydrogen plasma process is first carried out on the surface of the substrate 1 (the surface the buried interconnect 23a is exposed). The condition for the hydrogen plasma process, provided that the diameter of the substrate 1 is 8 inches (=approximately 20 cm), for example, can be given a processing pressure of 5.0 Torr (=6.6661×10$^2$ Pa), an RF power of 600 W, a substrate temperature of 400° C., a hydrogen gas flow rate of 500 cm$^3$/min and a processing time of 10–30 seconds. The electrode-to-electrode distance was 600 mils (15.24 mm).

Figure 32:
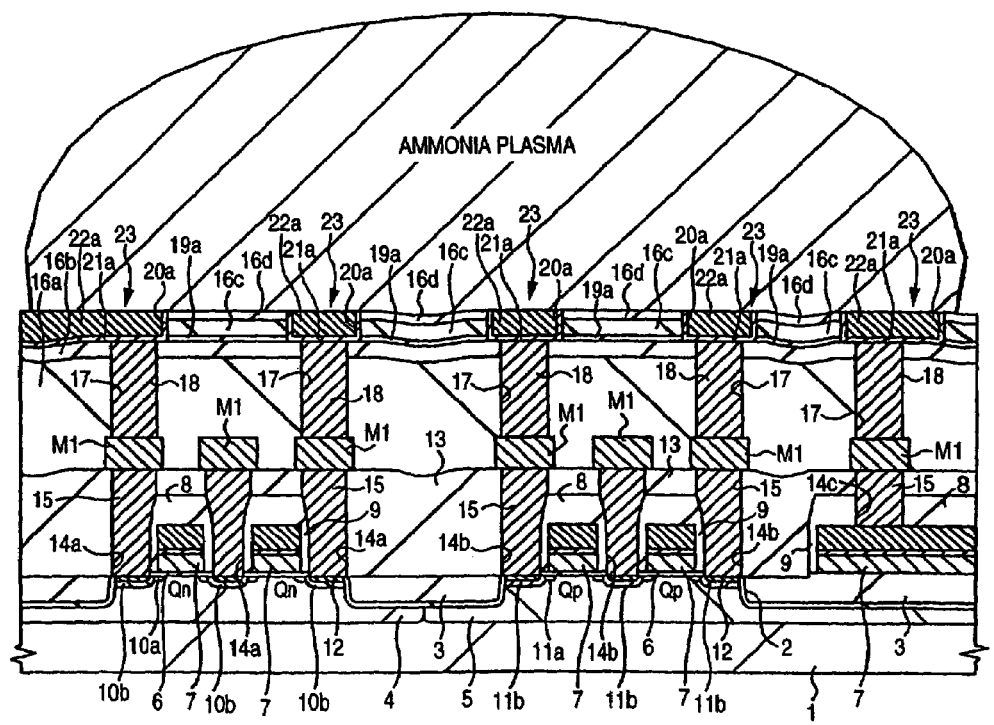
FIG. 32 is a sectional view showing a subsequent step in the process of fabrication of the semiconductor integrated circuit device following the step of FIG. 31.

Subsequently, after the hydrogen plasma process 109, an ammonia (NH$^3$) plasma process is continuously carried out, without release to the air, on the surface of the substrate 1 (the surface the buried interconnect 23a is exposed), as shown in FIG. 32. The condition for the ammonia plasma process is the same as the hydrogen plasma process condition in process 109, except that the ammonia flow rate is approximately 200 cm$^3$/min, for example.

It is to be noted that the plasma process condition is, of course, not limited to the exemplified conditions. According to the considerations by the present inventors, plasma damage can be decreased with increase in the pressure, while the TDDB life can be decreased in in-substrate variation and increased in life with increase in the substrate temperature. Also, it has been found that hillocks are caused more readily on the surface of Cu as the RF power and process time increase. Considering these findings and conditional variations due to device structure, a setting is possible within the ranges, e.g. a processing pressure of 0.5–6 Torr (=0.66661× 10$^2$–7.99932×10$^2$ Pa), an RF power of 300–600 W, a substrate temperature of 350° C.–450° C., a hydrogen gas flow rate of 50–1000 cm$^3$/min, an ammonia gas flow rate of 20–500 cm³/min, an electrode-to-electrode distance of 150–1000 mils (3.81–25.4 mm).

Figure 33:
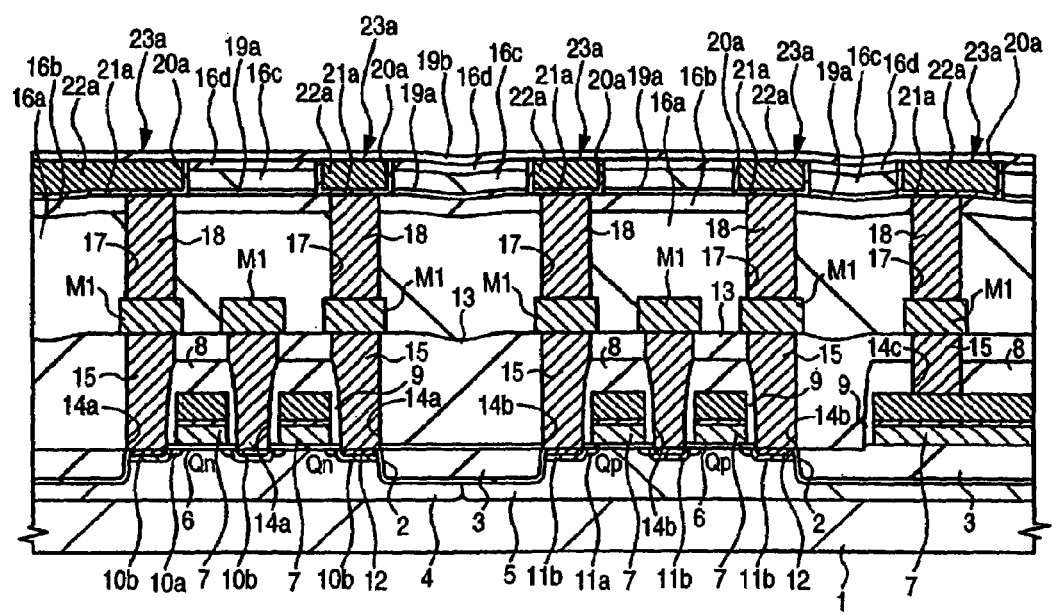
FIG. 33 is a sectional view showing a subsequent step in the process of fabrication of the semiconductor integrated circuit device following the step of FIG. 32.

Subsequently, after the ammonia plasma process 110, an insulation film 19b (cap film) is continuously deposited, without release to the air, on a surface of the buried interconnect 23a and insulation film 16d by the CVD technique or the like, as shown in FIG. 33. The insulation film 19b is, for example, of the same material and has the same thickness as the insulation film 19a, and has a similar modification to the insulation film 19a.

In this manner, the present embodiment carries out a hydrogen plasma process and ammonia plasma process on the substrate 1 prior to the deposition of an insulation film 19b for a cap film.

In ammonia plasma, the copper oxide (CuO, $CuO_2$) in a copper interconnect surface oxidized in CMP is deoxidized into copper (Cu). Also, a copper nitride (CuN) layer, for preventing copper silicidation upon set flow, is formed in a surface (in an extremely shallow region) of the buried interconnect 23a. In an upper surface of the insulation film 16d between the interconnects (in an extremely shallow region), the formation of SiN or SiH proceeds to compensate for the dangling bonds in the surface of the insulation film 16d, which can also improve the adhesion between the cap film (silicon nitride film) and the buried interconnect 23a and insulation film 16d to reduce the leakage current through the interface. This effect improves the TDDB life.

On the other hand, hydrogen plasma is extremely high in its capability to remove organic-based matter, as compared to the ammonia plasma process or the like, as has been described in Japanese Patent Application No. 226876/1999. Accordingly, this can completely remove the BTA contained in the CMP slurry, slurry ingredients, post-CMP-cleaning organic acid and the residual organic matter produced in the process, thereby decreasing the leakage current through the interface. As a result, the TDDB life can be improved furthermore.

Figure 34:
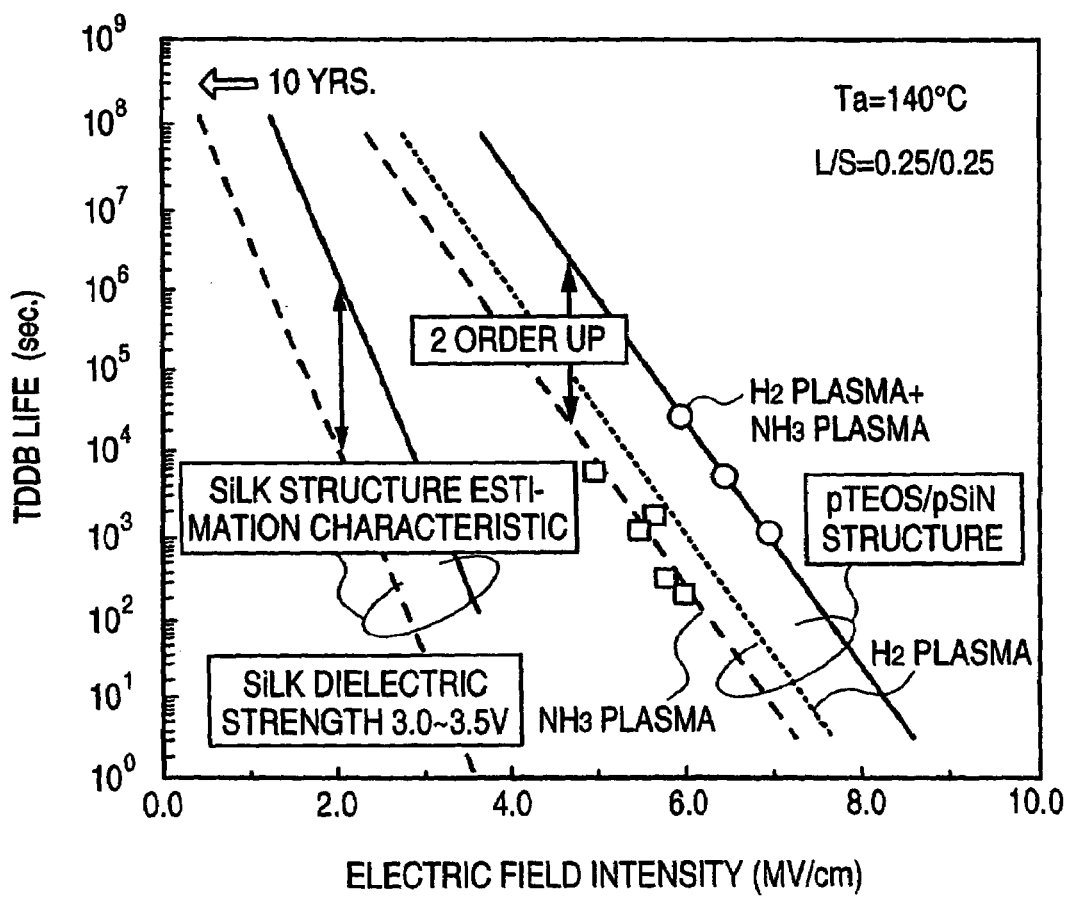
FIG. 34 is a graph showing a TDDB characteristic at a time when a hydrogen plasma process and an ammonia plasma process have been carried out in combination.

Consequently, by carrying out a hydrogen plasma process and an ammonia plasma process in this order, it is possible to obtain deoxidization in the surface of the copper-based buried interconnect 23a and the formation of a silicide-resisting barrier layer, the cleaning and SiH effect/SiN effect at the insulation-film interface, thus realizing a further improvement. FIG. 34 shows a TDDB characteristic in an actual combination of a hydrogen plasma process and an ammonia plasma process. CMP conditions and post-CMP cleaning conditions are all the same. It has been revealed that, where the interlayer insulation film is structured by depositing a silicon nitride film formed by a plasma CVD technique on a silicon oxide film formed by a plasma CVD technique using, for example, a TEOS (Tetraethoxysilane) gas, a sample processed by a combination of hydrogen plasma and ammonia plasma is improved in TDDB life by two orders of magnitude as compared to the case of a single amonia plasma process.

Meanwhile, FIG. 34 shows an approximated evaluation characteristic where the interlayer insulation film is structured of such a low-dielectric-coefficient material (e.g. SiLK in the foregoing), as was explained in connection with the present embodiment, from the fact of a SiLK dielectric strength of nearly 4.0–5.0 MV/cm, and the TDDB characteristic evaluation experiences on an organic SOG (Spin On Glass) interlayer structure and the like. With only an ammonia plasma process, there is an insufficient operating environment, for example, of approximately 0.13–0.17 MV/cm for 10 years. On the contrary, the present embodiment using hydrogen plasma and ammonia plasma to secure sufficient reliability for that operating environment.

Figure 35:
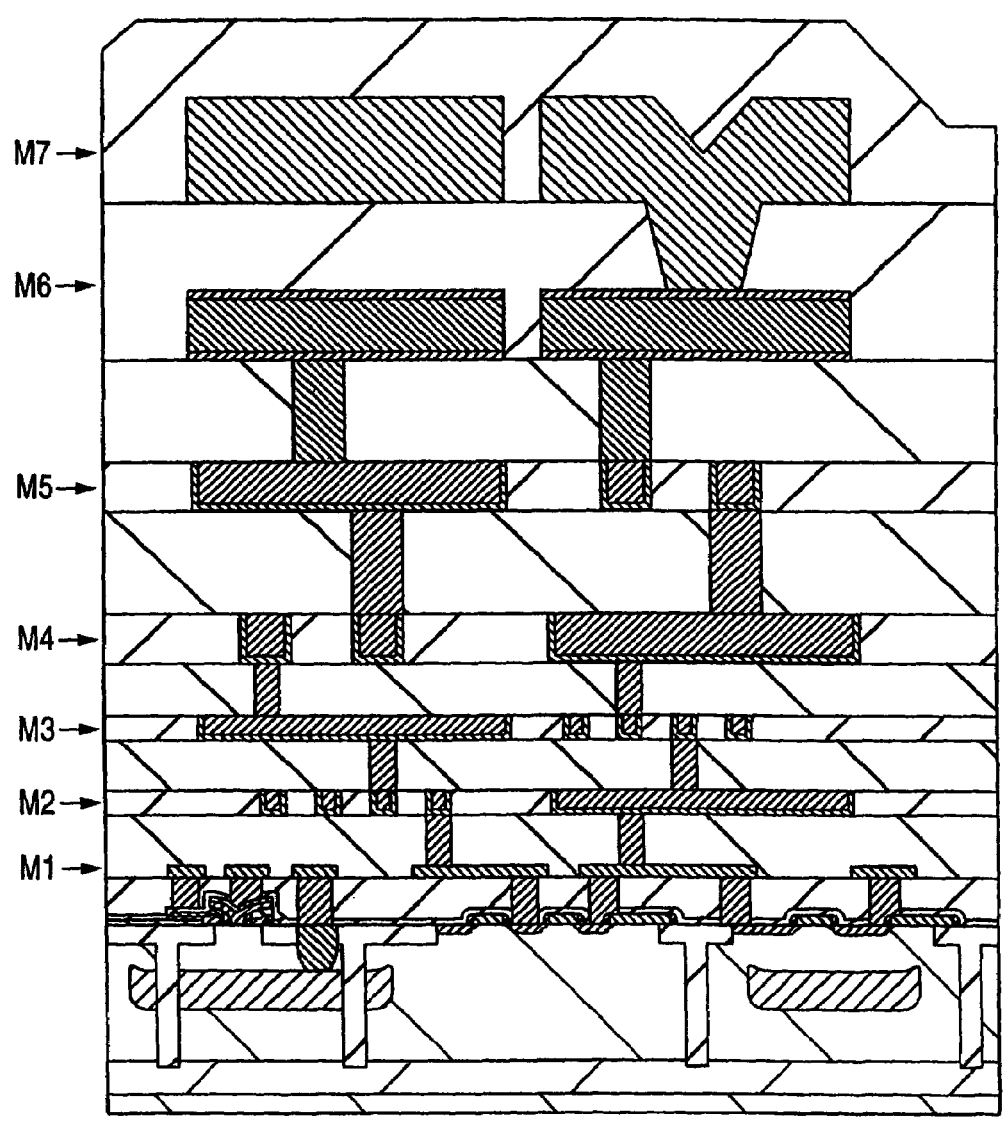
FIG. 35 is a sectional view of one example of a semiconductor integrated circuit device.

FIG. 35 shows one example of a CMIS-LSI formed up to a seventh-level interconnect in the manner as set forth in the foregoing description. Although the invention is not so limited, the dimensions of each part will be described below.

The film thickness and the interconnect pitch (center-to-center distance of between adjacent interconnects) in the first-level interconnect M1 are, for example, nearly 0.4 µm or nearly 0.25 µm. Also, the second-level interconnect M2 to the fifth-level interconnect M5 are formed by the foregoing Cu-interconnect-forming method. In the second-level interconnect M2 and third-level interconnect M3, the conductive barrier film has a thickness, for example, of nearly 0.05 µm, and the main conductor films has a thickness, for example, of nearly 0.35 µm, the interconnect width and the interconnect pitch are, for example, nearly 0.5 µm or nearly 0.25 µm. In the fourth-level interconnect M4 and fifth-level interconnect M5, the conductive barrier film has a thickness, for example, formed of nearly 0.05 µm, and the main conductor film has a thickness, for example, of nearly 0.95 µm, the interconnect width and the interconnect pitch are, for example, nearly 1.0 µm or nearly 0.25 µm. Also, the sixth-level interconnect M6 is in a three-layer structure having, for example, a tungsten film, an aluminum film and a tungsten film. Also, the seventh-level interconnect M7 is, for example, formed of an aluminum film. The seventh-level interconnect M7 has a pad to be formed with a bump electrode or connected with a bonding wire, although not shown. Incidentally, the one reason for structuring the seventh-level interconnect (M7) using a lamination film of aluminum and tungsten is that the lamination film is generally used in an uppermost layer of the usual semiconductor integrated circuit device not adopting a damascene interconnect structure, wherein the capability of securing the reliability in connection to a bump electrode or bonding wire has been empirically verified. The through-hole connecting between the first-level interconnect M1 and the second-level interconnect M2 has a diameter, for example, of nearly 0.45 µm or nearly 0.25 µm. The through-hole connecting between the second-level interconnect M2 and the third-level interconnect M3 has a diameter, for example, of nearly 0.5 µm or nearly 0.25 µm. The through-hole connecting between the third-level interconnect M3 and the fourth-level interconnect M4 has a diameter, for example, of nearly 0.5 µm or nearly 0.25 µm. The through-hole connecting between the fourth-level interconnect M4 and the fifth-level interconnect M5 has a diameter, for example, of nearly 1.0 µm or nearly 0.25 µm. The through-hole connecting between the fifth-level interconnect M5 and the sixth-level interconnect M6 has a diameter, for example, of nearly 0.5 µm or nearly 0.25 µm.

Next, an explanation will be given on one example of the CMP apparatus used in the present embodiment.

Figure 36:
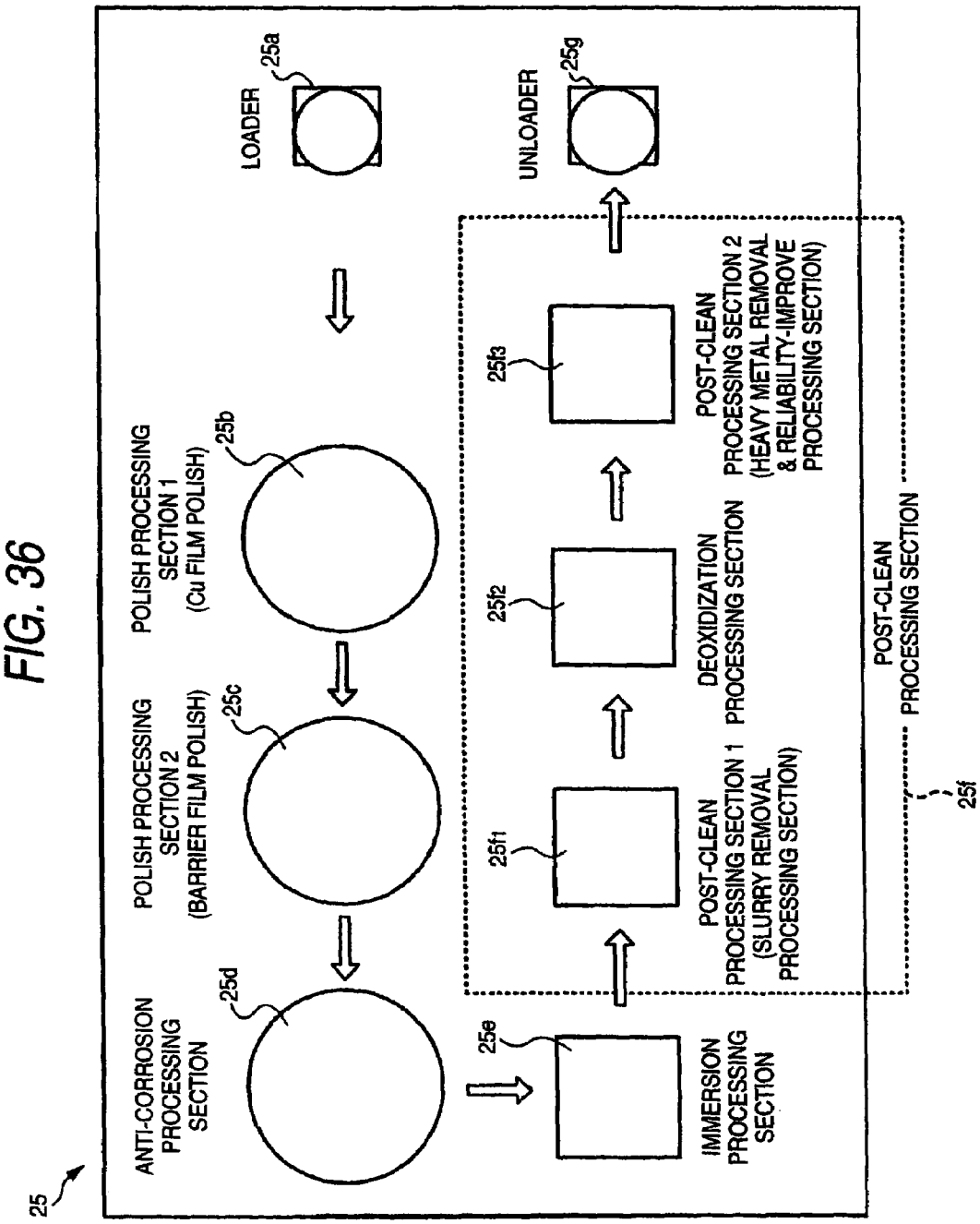
FIG. 36 is a diagram showing an overall structural example of a CMP apparatus according to one embodiment of the invention.

FIG. 36 shows one example of an overall structure of the CMP apparatus used in the present embodiment.

The CMP apparatus is a sheet-processing type CMP apparatus used for polishing a conductive barrier film 21a and main conductor film 22a, and comprises a loader 25a for accommodating a plurality of substrates, each formed with a main conductor film 22a on the surface, a polish processing section 25b for polishing and planarizing a main conductor film 22a, a polish processing section 25c for polishing and planarizing a conductive barrier film 21a, an anti-corrosion processing section 25d for carrying out an anti-corrosion process on a surface of a polished substrate 1, an immersion processing section 25e for keeping a substrate 1 on which the anti-corrosion process has been completed from having its surface dry before post-cleaning, a post-cleaning processing section 25f for post-cleaning a substrate 1 on which the anti-corrosion process has been completed and an unloader 25g for accommodating a plurality of substrates 1 on which post-cleaning has been completed. The post-clean processing section 25f has a first post-clean processing section 25f1 for alkali cleaning, a deoxidization processing section 25f2 for deoxidization and a second post-clean processing section 25f3 for acid cleaning. The post-clean processing section 25f may be an independent device separated from the CMP apparatus.

Figure 37:
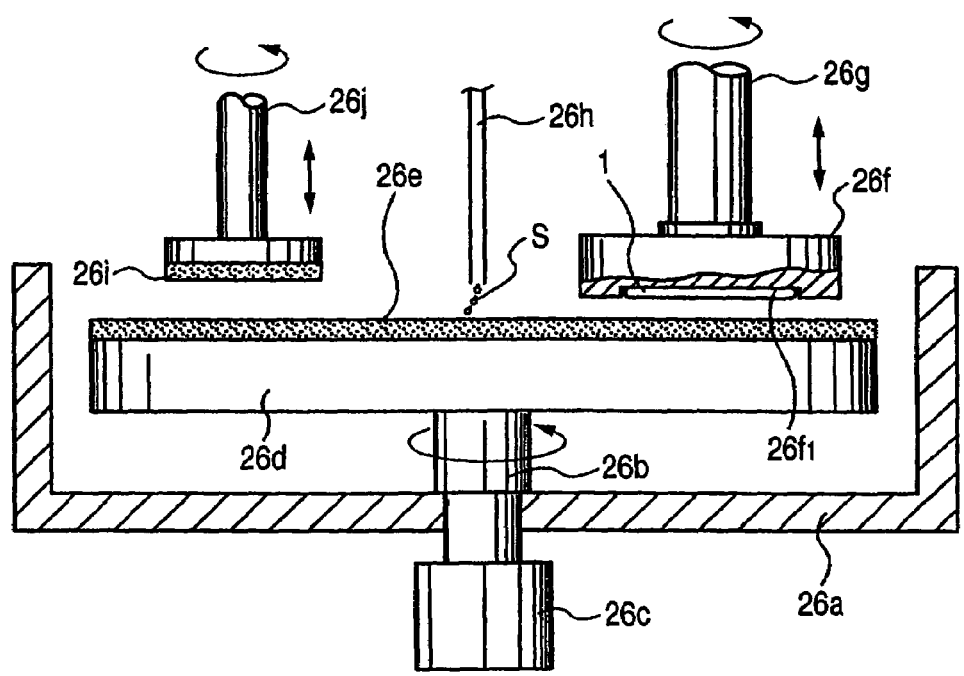
FIG. 37 is a side sectional view of a structural example of a polish processing section in the CMP apparatus of FIG. 36.

As shown in FIG. 37, the polish processing sections 25b, 25c of the CMP apparatus have a housing 26a opened in an upper part thereof. A rotary spindle 26b attached on the housing 26a has, at a top end, a polishing platen 26d rotatively driven by a motor 26c. The polishing platen 26d has, on its surface, a polishing pad 26e formed by evenly bonding a synthetic resin having a multiplicity of pores thereto.

Also, the polish processing section 25b, 25c has a wafer carrier 26f for holding a substrate 1. The driving spindle 26g, having the wafer carrier 26f, is rotatively driven in unison with the wafer carrier 26f by a motor (not shown) and is vertically movable in the space above the polishing platen 26d.

A substrate 1 is held with its main or polish surface facing down toward the wafer carrier by a vacuum suction mechanism (not shown) provided in the wafer carrier 26f. The wafer carrier 26f is formed, at its lower end, with a recess 26f1 to receive a substrate 1. When a substrate 1 is received in the recess 26f1, its polish surface is in a state flush with or slightly projecting from the lower end surface of the wafer carrier 26.

A slurry feed pipe 26h is provided in the space above the polishing platen 26d, to feed polishing slurry S between a surface of the polishing pad 26e and a polish surface of the substrate 1, so that the polish surface of the substrate 1 is chemically, mechanically polished by the polishing slurry S fed through a lower end of the same. Polishing slurry S uses a dispersion or dissolution based on polishing grits, for example, of alumina and an oxidizer of hydrogen peroxide water or ferric nitrate solution.

Also, the polish processing section 25b, 25c has a dresser 26i as a tool for shaping (dressing) the surface of the polishing pad 26e. The dresser 26i is attached at the lower end of the driving spindle 26j, which is vertically movable in the space above the polishing platen 26d, and is rotatively driven by a motor (not shown).

The polished substrate 1 at its surface is subjected to an anti-corrosion process in the anti-corrosion processing section 25d. The anti-corrosion processing section 25d has a similar structure to the structure of the polish processing section 25b, 25c. Herein, the substrate 1 at its main surface is pressed onto the polishing pad provided on the surface of the polishing platen to mechanically remove of polishing slurry. Thereafter, an agent containing an anti-corrosive, for example, of benzotriazole (BTA), is fed to the main surface of the substrate 1, thereby forming a hydrophobic protection film in a surface of the copper interconnect formed on the main surface of the substrate 1.

The substrate 1 that has been subjected to the anti-corrosion process is temporarily stored in the immersion processing section 25 in order to prevent its surface from being dried. The immersion processing section 25e is used to maintain the substrate 1 that has been subjected to the anti-corrosion process in a state where it does not become dry at its surface until post-cleaning, and is structured to store, for example, a predetermined number of substrates 1 by immersing them in an immersion tank (stocker) supplied with pure water that is allowed to overflow. At this time, by supplying pure water that is cooled down to such a temperature that electrochemical corroding reaction on the buried interconnect 23a does not substantially proceed, the buried interconnect 23a can be prevented more positively from corroding. The prevention of the substrate 1 from drying may be conducted by a method other than the storage thereof in an immersion tank, provided that the substrate 1 at its surface can be at least held in a wet state, e.g. using a pure-water shower supply.

Figure 38:
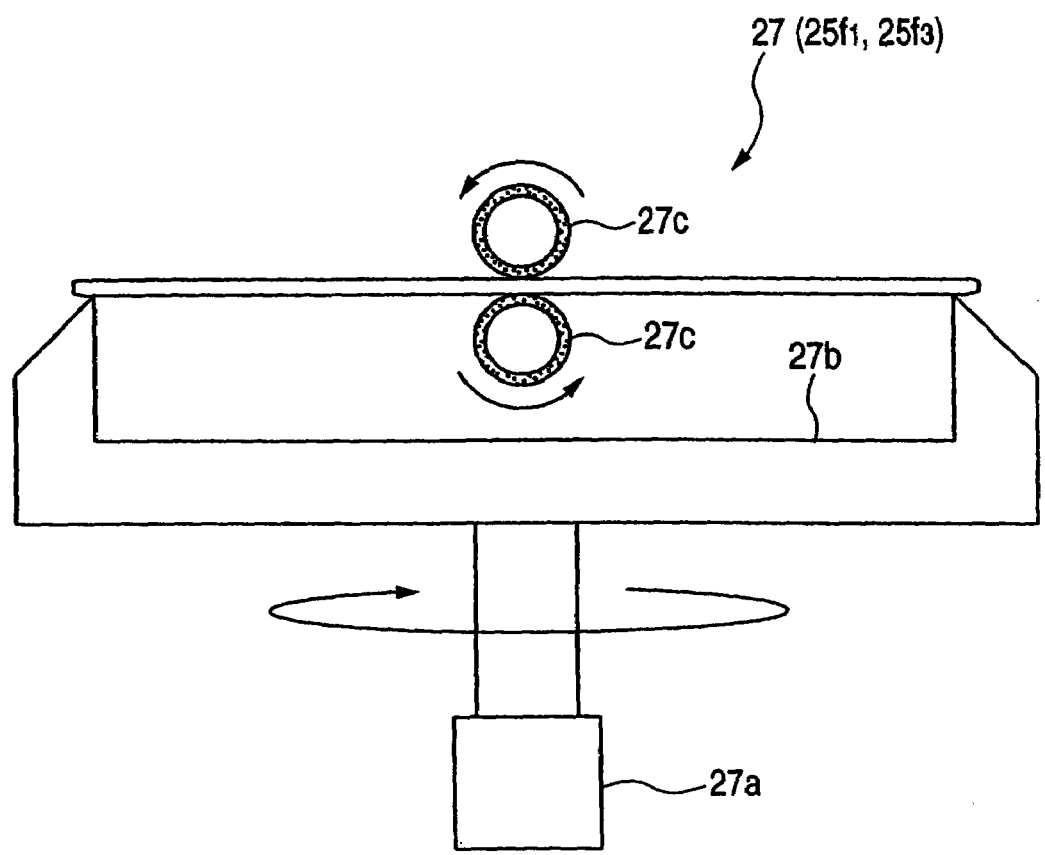
FIG. 38 is a side sectional view of a structural example of a post-cleaning processing section in the CMP apparatus of FIG. 36.

FIG. 38 shows a scrub cleaning device 27 as one example of the first and second post-clean processing sections 25f1, 25f3. This scrub cleaning device 27 has a stage 27b rotatively driven by a motor 27a so that a substrate 1 held on the stage 27b rotates at a desired speed in a horizontal plane. Also, cylindrical brushes 27c are pressed onto the upper and lower surfaces of the substrate 1 rotating on the stage 27b. These brushes 27c are rotated at a desired speed in a vertical plane relative to the main surface of the substrate 1 by a rotation drive mechanism. Also, the brushes 27c are supplied with cleaning liquid through piping. The cleaning liquid supplied to the brush 27c exudes, little by little, from an interior of the brush 27c structured by a porous member made of a synthetic resin, for example, of polyvinylalcohol (PVA) to a surface (contact surface with the substrate 1), thereby wetting the surface of the substrate 1 in contact with the brush 27c.

In order to remove the slurry or the like that has adhered on the substrate 1, the brushes 27c are pressed onto the upper and lower surface of the substrate 1, and then the brushes 27c are rotated in a vertical plane relative to the main surface of the substrate 1, while rotating the substrate in the horizontal plane. At this time, both brushes 27c are pressed onto the substrate with such a pressure that a plurality of projections provided in the surface thereof at their tips are slightly recessed (e.g. nearly 1 mm). The rotation velocity of the substrate is, for example, nearly 20 rpm, while the rotation velocity of the brush 27c is, for example, 120 rpm. In this manner, the opposite surfaces of the substrate 1 are scrub-cleaned by the brushes 27c for a predetermined period of time, thereby removing the slurry or the like that has adhered on the surface.

Figure 39:
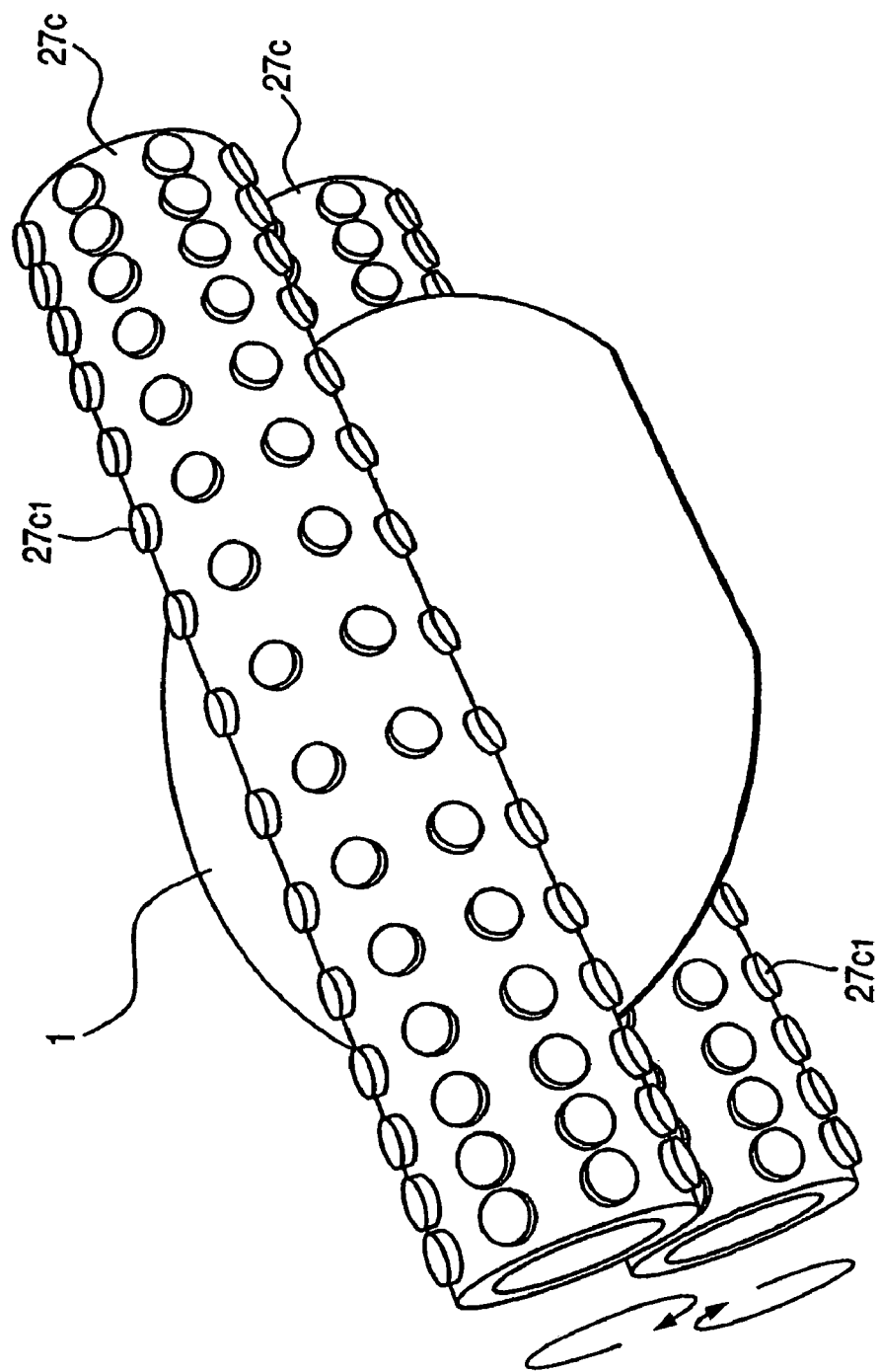
FIG. 39 is perspective view of a brush of the post-cleaning processing section of FIG. 38.

FIG. 39 is an enlarged perspective view of the brushes 27c. As shown in the figure, a multiplicity of precise cylindrical projections 27c1 are provided with spacing on a surface of the brush 27c, i.e. the surface in contrast with a substrate 1. The brush 27c is structured to have a porous member made of a synthetic resin, for example, of PVA. In the present embodiment, the number of the projections 27c1 increases in a direction from a central portion of the brush 27c toward both ends. Namely, the projections 27c1 are arranged such that the number becomes a minimum in the central part of the brush 27c and a maximum at both ends.

Where using such a brush 27c, the contact time with the brush 27c is long at a central part of a substrate, which is in contact with the central part of the brush 27c, as compared to he contact time at the peripheral part of the substrate 1, which is in contact with the ends of the brush 27c. On the contrary, however, because the number of projections 27c contacting the substrate 1 is minimum at the central part of the brush 27c and maximum at the ends thereof, the contact area between the brush 27c and the substrate 1 is greater at the peripheral part than in the central part of the substrate 1. This can make equivalent the value of time×area that the brush 27*c* is in contact with the substrate 1 throughout the surface area of the substrate. Due to this, the amount of cutting (etch amount) in the surface of the buried interconnect 23*a* can be made equivalent throughout the surface area of the substrate 1.

According to an experiment by the present inventors, the amount of cutting in the surface of the buried interconnect 23*a* has been made nearly equivalent throughout the surface of a substrate 1 by optimizing the number of projections 27*c*1 under the following condition. Incidentally, the diameter of the substrate 1 used herein is, for example, nearly 125 mm, the rotation velocity of the substrate is, for example, nearly 22 rpm, and the diameter of the brush 27*c* is, for example, nearly 55 mm. The brush 27*c* was pressed onto the substrate at a sufficient pressure to recess, by 1 mm, the contact surface with the substrate 1.

Where the substrate was equally divided into ten parts from the center to the outermost periphery and the number of projections to contact each region was gradually increased from the center of the brush to the end, for a brush rotation velocity of 120 rpm, the optimal number of the projections was 1, 1, 2, 3, 3, 4, 5, 6, 7 and 8 (in number) in this order from the substrate center. Also, for a brush rotation velocity of 30 rpm, the optimal number of projections was 3, 3, 8, 8, 8, 8, 8, 8, 8 and 8 (in number) in this order from the substrate center.

To make equivalent the time×area that the brush 27*c* is in contact with the substrate 1 throughout the surface of the substrate 1, various other means can be adopted for changing the shape, the number and the like of the projections 27*c*1, such that the contact area between the brush 27*c* and the substrate 1 decreases as the center of the substrate 1 is approached and increases as the peripheral part of the substrate is approached, e.g. the diameter of the projection 27*c*1 is gradually increased in the direction of from the center of the brush 27*c* toward both ends (or the diameter of the projection 27*c*1 is gradually decreased in the direction from both ends of the brush 27*c* toward the center).

Also, in place of the above means for decreasing the contact area between the brush 27*c* and the substrate 1 in the direction from the peripheral part of the substrate toward the center, the pressure of the brush 27*c*, which is pressed against the surface of the substrate 1, may be decreased in the direction from the peripheral part of the substrate 1 toward the center (or increased in the direction from the center toward the peripheral part). In this case, even if the contact area between the brush 27*c* and the substrate 1 is nearly the same in every part of the substrate 1, the effect similar to the foregoing can be obtained.

In order to decrease the pressure of the brush 27*c*, when it is pressed against the surface of the substrate 1, as the center is approached from the peripheral part of the substrate 1, for example, the projections 27*c*1 may be decreased in height in the direction from both ends of the brush 27*c* toward the center or the brush 27*c* may be decreased in diameter.

Meanwhile, by optimizing the ratio of substrate rotation velocity/brush rotation velocity (hereinafter referred to as the W/B ratio), an in-plane evenness on the substrate 1 can be realized without changing the number of projections 27*c*1 between the center and both ends of the brush 27*c*. According to a result of experiment by the present inventors, the effective cleaning condition in post-CMP cleaning was with a W/B ratio=1.2 or greater for a roll-type cleaning apparatus and with a W/B ratio=2.0 or greater for a disk-type cleaning apparatus.

Incidentally, the art of making equivalent the amount of cutting on the surface of the substrate 1 during post-CMP cleaning as in the above is described in Japanese Patent Application No. 176769/2000 by the present inventors.

Figure 40:
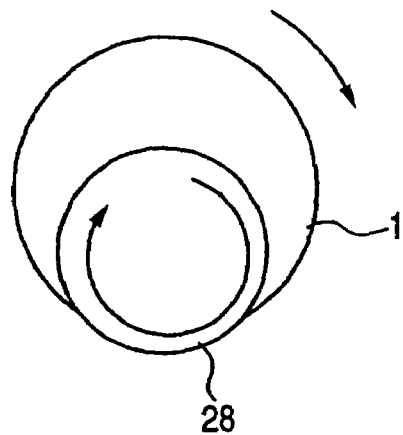
FIGS. 40(a) and 40(b) are diagrams showing another post-cleaning processing scheme.
Figure 40:
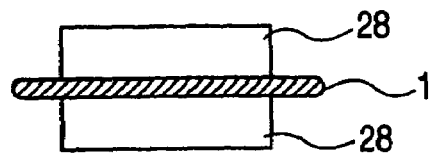
Figure 41:
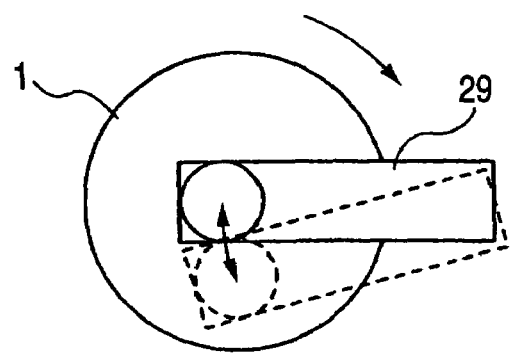
FIGS. 41(a) and 41(b) are diagrams showing still another post-cleaning processing scheme.
Figure 41:
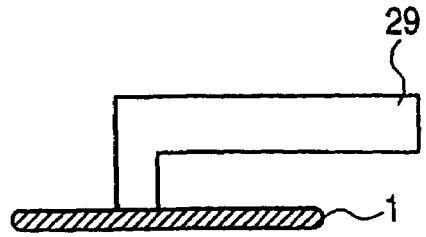

Although in the post-cleaning process, a roll-type cleaning scheme was considered, the invention is not limited thereto, but various modifications are possible, e.g. a disk-type cleaning scheme can be adopted in alkali cleaning. Also, in acid cleaning, a disk-type cleaning scheme or pen-type cleaning scheme can be adopted. FIGS. 40(*a*) and 40(*b*) are directed to one example of a disk-type cleaning scheme. FIG. 40(*a*) is a plan view and FIG. 40(*b*) is a sectional view thereof. In the state in which circular disk brushes 28 are placed on the upper and lower surfaces of a substrate 1, the surface of the substrate 1 is cleaned while both the substrate 1 and disk brushes 28 are rotated in a horizontal plane. Meanwhile, FIGS. 41(*a*) and 41(*b*) are directed to one example of a pen-type cleaning scheme. FIG. 41(*a*) shows a plan view and FIG. 41(*b*) a sectional view thereof. In the state in which a pen brush 29 is placed on a surface (surface formed with the buried interconnect) of a substrate 1, the pen brush 29 is rotated and swung to clean the main surface and end surface of the substrate 1 while the substrate 1 is rotated in a horizontal plane. The pen brush 29 is suited for removing a substance that was not removed in the precedent-staged cleaning process (e.g. roll-type cleaning or disk-type cleaning). The brush material, etc. of the disk brush 28 and pen brush 29 are the same as the foregoing.

The substrate 1 that has been subjected to the post-cleaning process, after pure-water rinse and spin dry, is accommodated in a dry state in the unloader 25*g* (see FIG. 36) and transferred collectively on a plurality-unit basis to the next process.

Incidentally, it is possible to form the immersion processing section (substrate storing section) 25*e* for preventing drying of the surface of the substrate 1 that has been subjected to the anti-corrosion process as a shaded structure so that light or the like cannot be illuminated onto the surface of the substrate 1 in storage. This can prevent a short circuit current from being generated due to the photovoltaic effect. To make the immersion processing section 25*e* as a shaded structure, the immersion tank (stocker) at its surrounding portion is covered by a shading sheet or the like, thereby reducing the interior illuminance at least to 500 lux or below, preferably 300 lux or below, more preferably 100 lux or below.

Meanwhile, immediately after the polishing process, i.e. before an electrochemical corrosive reaction can start due to the presence of an oxidizer in the polishing slurry that has remained on the surface, transfer may be immediately made to the dry processing section to remove the water content from the polishing slurry by forcible drying. In this case, the substrate 1 subjected to a polishing process in the polish processing section 25*b*, immediately after a polishing process, i.e. before an electrochemical corrosive reaction can start due to the presence of an oxidizer in the polishing slurry that has remained on the surface, is immediately transferred to the dry processing section to forcibly remove water present in the polishing slurry by forcible drying. Thereafter, the substrate 1, while being maintained in the dry state, is transferred to the post-clean processing section 25*f*, where it is subjected to a post-cleaning process; and, thereafter, it is accommodated in the unloader 25*g* through a pure-water rinse and spin dry. In this case, because the substrate 1 at its surface is kept in the dry state during the time immediately after the polishing process to the start of post cleaning, an electrochemical corrosive reaction is suppressed from starting. This can effectively prevent the Cu interconnect from corroding.

Next, an explanation will be given of one example of the plasma processing apparatus used in the processes from post-processing to cap-film formation.

FIG. 42(a) is a sectional view showing one example of a plasma processing apparatus, and FIG. 42(b) is a plan view thereof. It is noted that this plasma processing apparatus is described in Japanese Patent Application No. 226876/1999 by the present inventors.

This plasma processing apparatus 30 uses, for example, P5000 by AMAT. The plasma processing apparatus 30 has a load lock chamber 30a mounted with two process chambers 30b1, 30b2 and a cassette interface 30c. The load lock chamber 30a has therein a robot 30d to transfer a substrate 1. A gate valve 30e is provided between the load lock chamber 30a and the process chambers 30b1, 30b2 to keep a high vacuum state within the load lock chamber 30a even during processing.

The process chambers 30b1, 30b2 have therein a susceptor 30f to hold a substrate 1, a baffle plate 30g to regulate gas flow, a support member 30h to support the susceptor 30f, an electrode 30i in a mesh form arranged to oppose the susceptor 30f, and an insulation plate 30j arranged to nearly oppose the baffle plate 30g. The insulation plate 30j serves to suppress parasitic discharge in an unnecessary region, other than the region between the suceptor 30f and the electrode 30i. On a back side of the suceptor 30f, lamps 30m are arranged in a reflection unit 30k so that the infrared rays 30n emitted from the lamp 30m pass through a quartz window 3p and illuminate the susceptor 30f and substrate 1. This heats up the substrate 1. It is noted that the substrate 1 is placed face up on the susceptor 30f (in a state where the main surface, or buried interconnect formed surface, is positioned to face up).

The process chamber 301, 30b2 can be evacuated in the interior thereof to a high vacuum, into which a process gas and radio-frequency power is supplied through a gas port 30q. The process gas is passed through the mesh electrode 30i and is supplied to the vicinity of the substrate 1. The process gas is exited through a vacuum manifold 30r. By controlling the supply flow rate and exit velocity of the process gas, pressure is put under control. High-frequency power is applied to the electrode 30i to generate plasma between the susceptor 30f and the electrode 30i. High-frequency power uses a frequency, for example, of 13.56 MHz.

Within the process chamber 30b1, for example, a hydrogen plasma process and ammonia plasma process are carried out as in the foregoing. It is noted that such hydrogen plasma process and ammonia plasma process may be respectively carried out in separate plasma process chambers. Meanwhile, cap-film (silicon nitride film) deposition is carried out within the process chamber 30b2. Because the process chamber 30b and the process chamber 30b2 are mechanically connected together through the load lock chamber 30a, the substrate 1, after hydrogen plasma processing and ammonia plasma processing, can be transferred to the process chamber 30b2 without encountering a break in the vacuum. Thus, plasma processing (post-processing) and cap-film formation can be carried out in a continuous fashion.

In plasma processing (post processing), for example, the following operations are carried out. A substrate 1 is transferred from a cassette interface 30c to the load lock chamber 30a by the robot 30d. The load lock chamber 30a is evacuated fully to a pressure-reduced state, and the substrate 1 is transferred into the process chamber 30b1 by the use of the robot 30d. The gate valve 30e of the process chamber 30b1 is closed to evacuate the process chamber 30b1 to a full vacuum. Then, a hydrogen gas or ammonia gas is introduced into the process chamber 30b1 where it is adjusted in pressure and kept at a predetermined pressure. Thereafter, an electric field is applied from the radio-frequency power source to the electrode 30i to plasma-process the surface of the substrate 1. After a lapse of a predetermined time, the high-frequency electric field is shut down to end generation of the plasma. Thereafter, the process chamber 30b1 is evacuated and the gate valve 30e is opened to transfer the substrate 1 out to the load lock chamber 30a using the robot 30d. It is noted that the substrate 1 at its surface will not be exposed to the ambient air because the load lock chamber 30a is kept in a high vacuum state.

Subsequently, in cap-film formation, for example, the following operations are carried out. First, using the robot 30d, a substrate 1 is transferred into the process chamber 30b2. The gate valve 30e of the process chamber 30b2 is closed to evacuate the process chamber 30b2 fully to a vacuum, and thereafter a mixture gas of silane (SiH$_4$), ammonia and nitrogen is introduced into the process chamber 30b2 where it is adjusted in pressure and kept at a predetermined pressure. Thereafter, an electric field is applied from the radio-frequency power source to the electrode 30i to generate a plasma, thereby depositing an insulation film in the form of a cap film (see FIG. 33). After a lapse of a predetermined time, the high-frequency electric field is shut down to end generation of the plasma. Thereafter, the process chamber 30b2 is evacuated and the gate valve 30e is opened, to transfer the substrate 1 out to the load lock chamber 30a. Furthermore, using the robot 30d, the substrate 1 is exited to the cassette interface 30c.

Embodiment 2

The present embodiment is directed to a modification of the foregoing post-CMP cleaning process.

Figure 43:
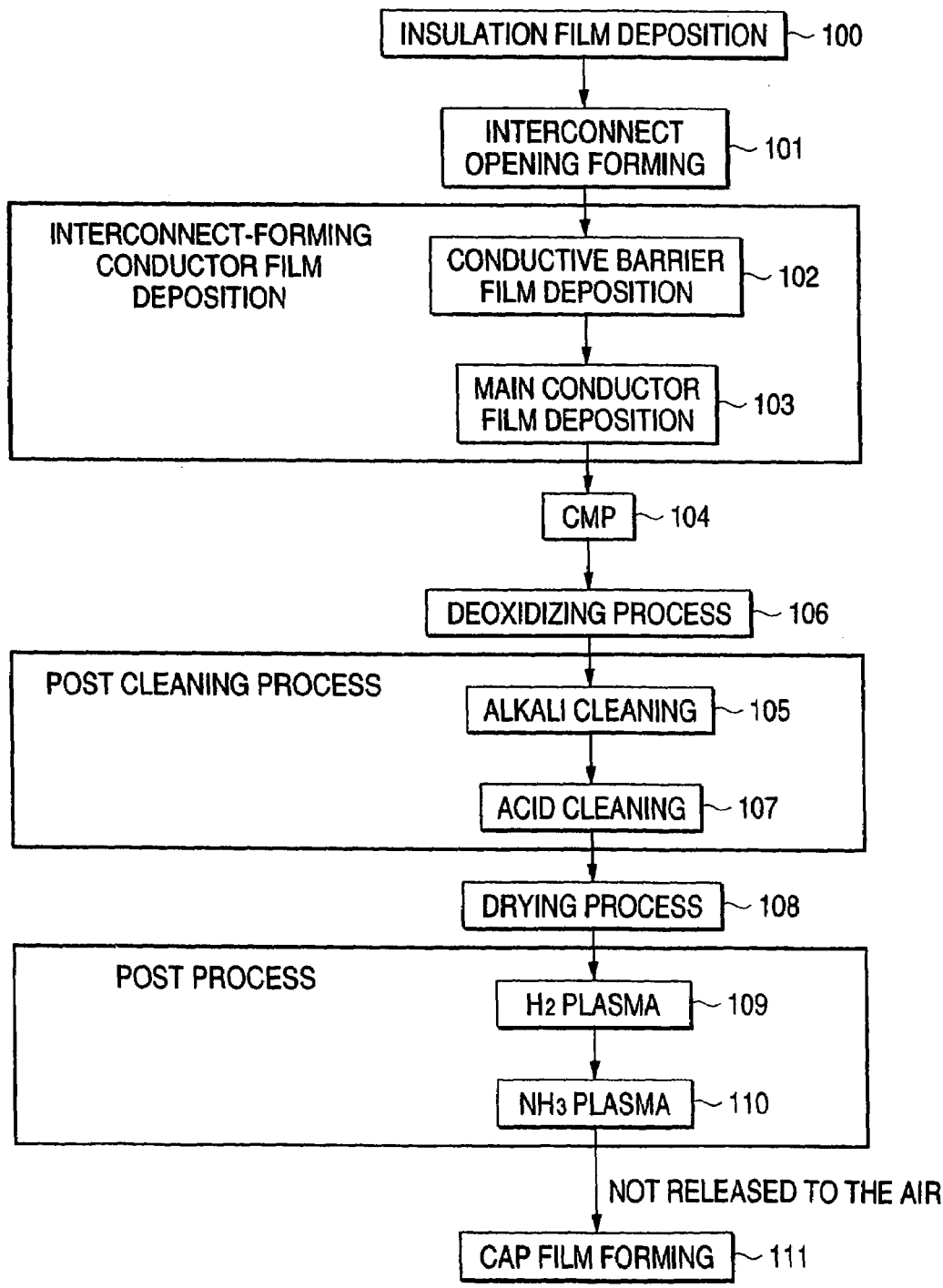
FIG. 43 is a flowchart showing a method of fabrication of a semiconductor integrated circuit device according to another embodiment of the invention.

FIG. 43 is a flowchart illustrating this modification. An example is herein given of the case of carrying out the foregoing deoxiding process (step 106) after the CMP process (step 104), and thereafter performing a post-cleaning process in the order of alkali cleaning (step 105) and acid cleaning (step 107). The other points of the process are similar to those of the Embodiment 1. In this case, a similar effect to the post-CMP cleaning process is obtained. In this case, a deoxidization processing section may be provided in the CMP apparatus.

Figure 44:
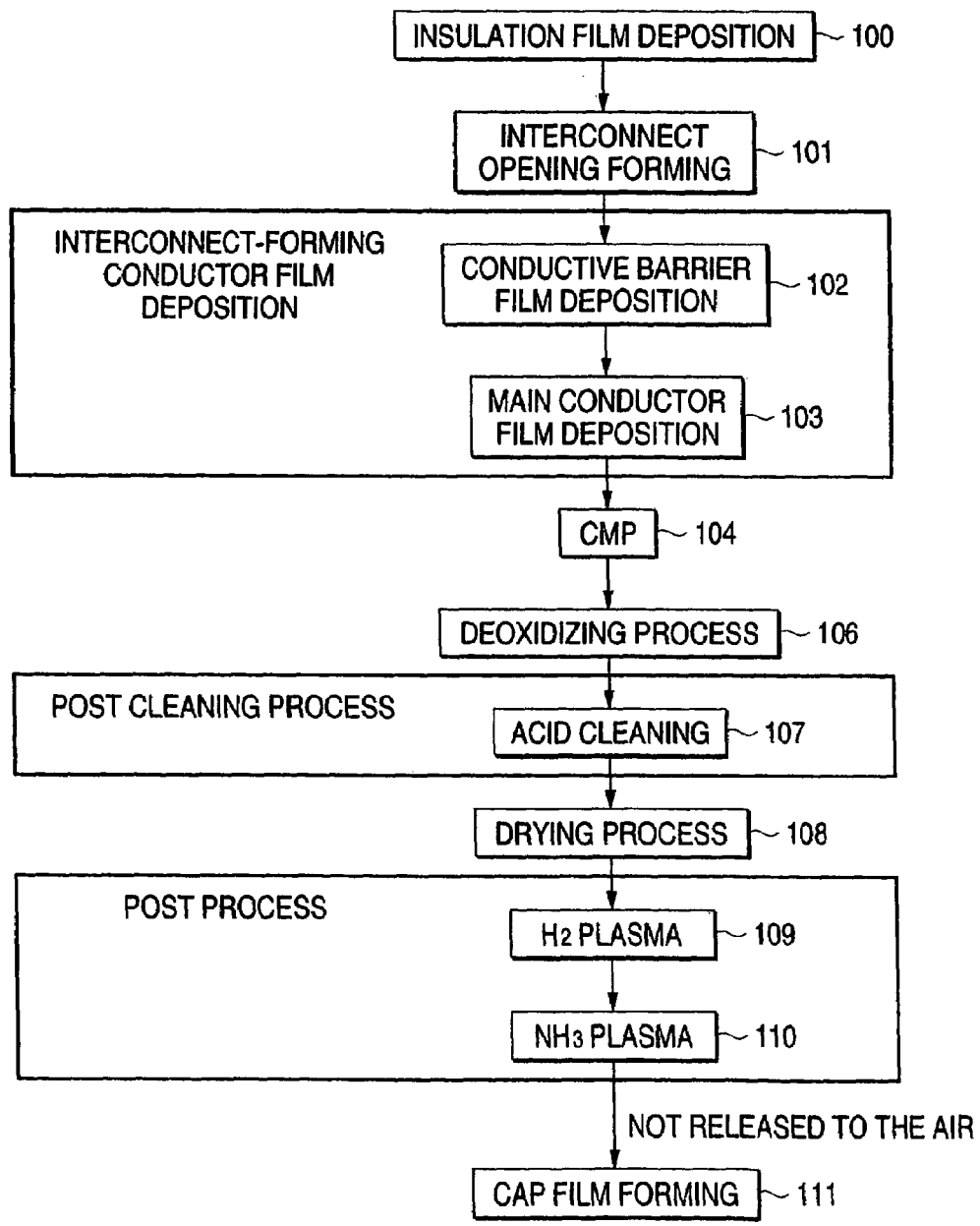
FIG. 44 is a flowchart showing a method of fabrication of a semiconductor integrated circuit device according to another embodiment of the invention.

Meanwhile, FIG. 44 is a flowchart of another example of a post-CMP cleaning process. An example is herein given of the case in which the invention is applied where acid cleaning only is carried out without performing alkali cleaning. The other features are similar to those of the Embodiment 1. The TDDB characteristic is improved by merely carrying out acid cleaning. This can be considered possible owing to interfacial characteristic improvement by the removal of damaged layers. In also this case, a deoxidization processing section may be provided in the CMP apparatus.

Embodiment 3

The present embodiment is directed to a modification of the foregoing post process.

Figure 45:
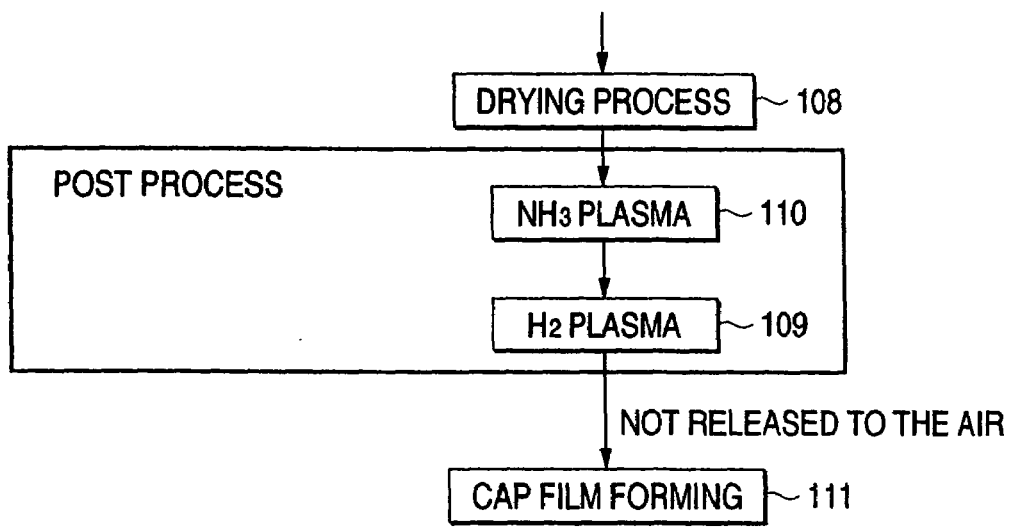
FIG. 45 is a flowchart of a part of a method of fabrication of a semiconductor integrated circuit device according to another embodiment of the invention.
Figure 46:
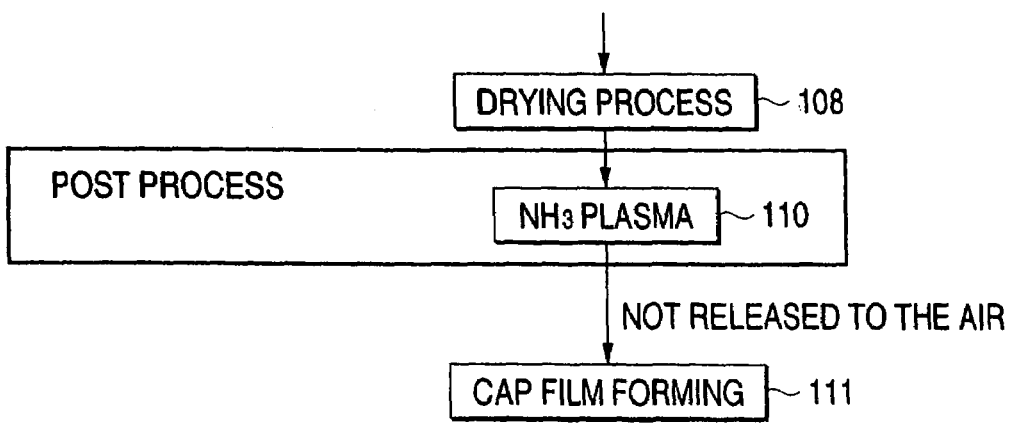
FIG. 46 is a flowchart of a part of a method of fabrication of a semiconductor integrated circuit device according to another embodiment of the invention.

FIG. 45 shows a part of the flowchart illustrating the process. An example is herein given of the case in which, after an ammonia plasma process, a hydrogen plasma process is continuously carried out while maintaining a vacuum. The other features are similar to those of the Embodiments 1 and 2. Meanwhile, FIG. 46 exemplifies a case in which an ammonia plasma process only is carried out in a post process. The other features are similar to those of the Embodiments 1 and 2. In these cases, the TDDB characteristic could have been improved despite the fact that the interconnect resistance has decreased to a level lower than that of the Embodiments 1 and 2.

Embodiment 4

The present embodiment is directed to a modification of the foregoing post process.

Figure 47:
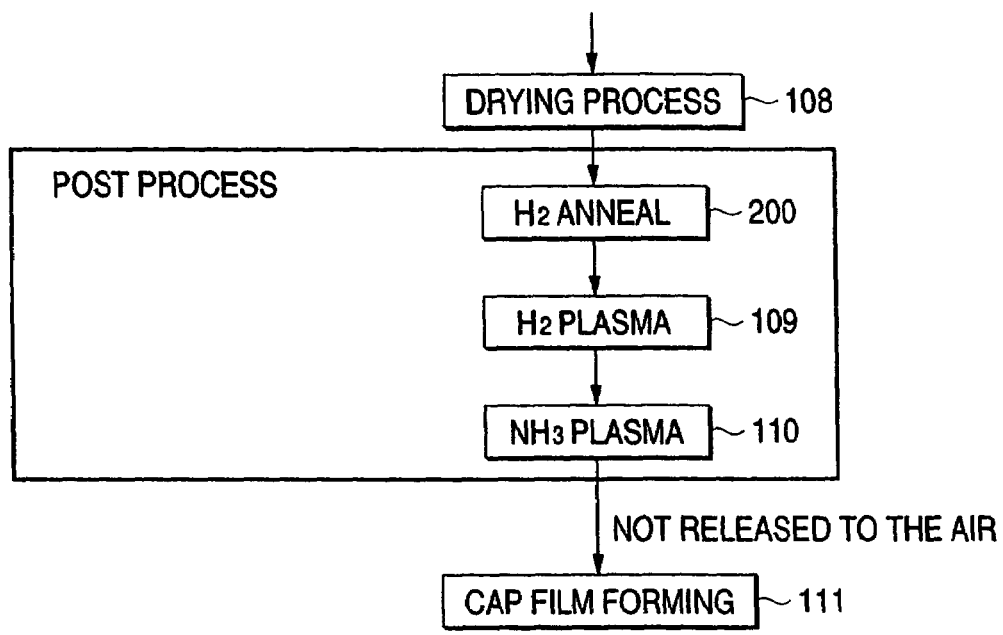
FIG. 47 is a flowchart of a part of a method of fabrication of a semi-conductor integrated circuit device according to another embodiment of the invention.

FIG. 47 shows part of the flowchart illustrating the process. An example is herein given of the case in which a hydrogen anneal process (step 200) is carried out after a drying process (step 108), but before a hydrogen plasma process (step 109). Namely, this example is directed to a case in which the processes are carried out in the order of a drying process (step 108), a hydrogen anneal process (step 200), a hydrogen plasma process (step 109), an ammonia plasma process (step 110) and a cap film forming process (step 111).

Figure 48:
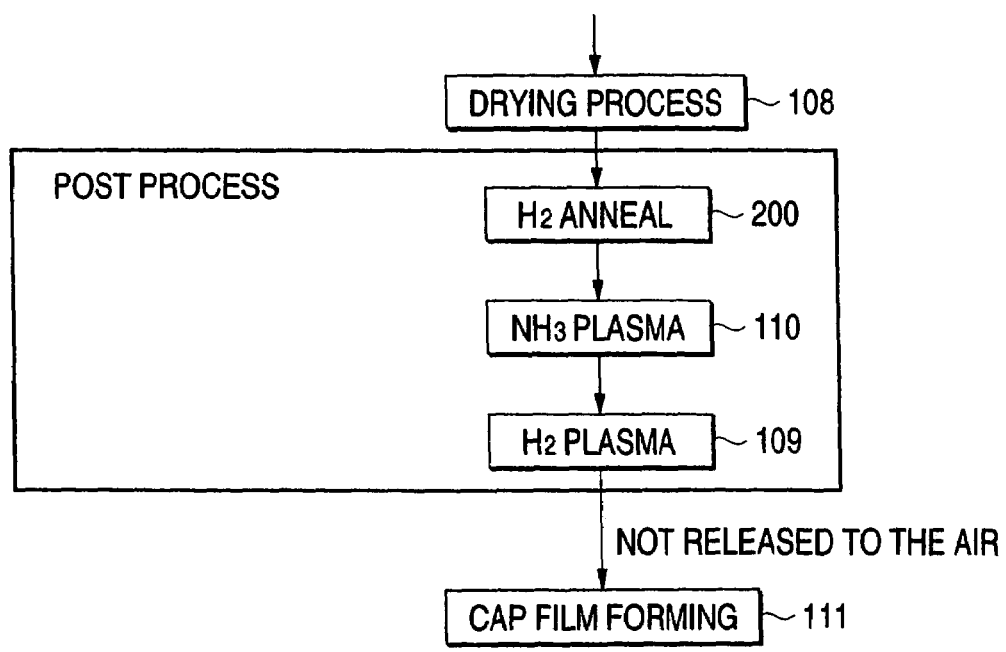
FIG. 48 is a flowchart of a part of a method of fabrication of a semiconductor integrated circuit device according to another embodiment of the invention.

Meanwhile FIG. 48 exemplifies a case in which the post process of FIG. 47 is changed in sequence. Namely, this example is directed to the case in which a hydrogen anneal process (step 200), an ammonia plasma process (step 110) and hydrogen plasma process (step 109) are carried out in this order.

Figure 49:
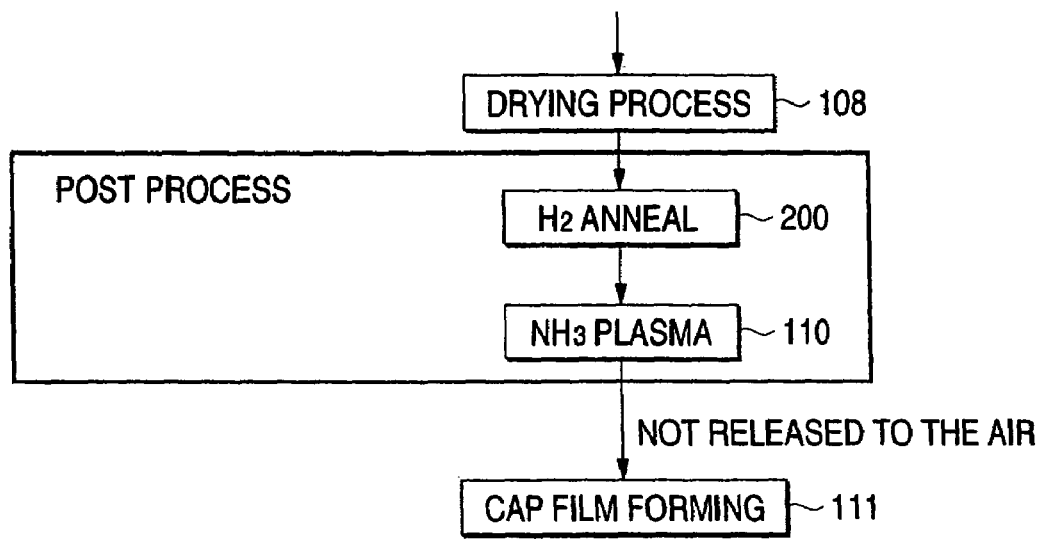
FIG. 49 is a flowchart of a part of a method of fabrication of a semiconductor integrated circuit device according to another embodiment of the invention.

Furthermore, FIG. 49 exemplifies a case in which, after the hydrogen anneal process (step 200), only the ammonia plasma process (step 110) is carried out as a post process. Namely, this example is directed to the case in which a hydrogen anneal process (step 200), ammonia plasma process (step 110) and cap-film forming process (step 111) are carried out in this order.

In any of the above examples, the conditions for the hydrogen anneal process are a processing temperature, for example, of 200–475° C., preferably approximately 300° C., and a processing time, for example, of 0.5–5 minutes, preferably approximately 2 minutes.

This method is suited particularly to the formation of a main conductor film comprising copper for a buried interconnect by a plating technique. Also, this method is suited for the case in which the hydrogen anneal process is not carried out during post-cleaning process or immediately before the deoxidizing process. In this manner, by carrying out a hydrogen anneal process (step 200), the copper formed by the plating technique can be recrystallized, thus making it possible to reduce the interconnect resistance. Meanwhile, if a cap film (insulation film 19b) is deposited without performing the hydrogen anneal process, there is a possibility that the cap film can be stripped off due to thermal stress. However, a hydrogen anneal process, if carried out, can suppress or prevent this.

Figure 50:
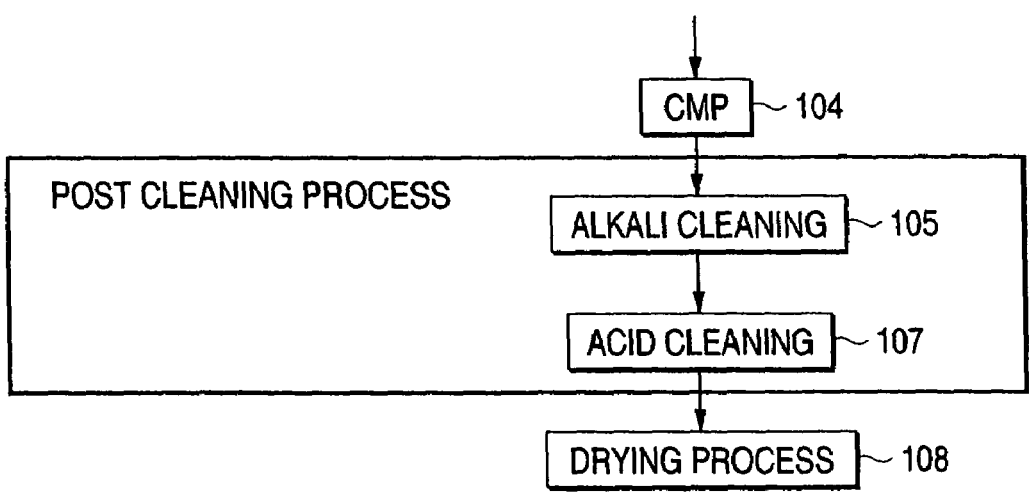
FIG. 50 is a flowchart of a part of method of a fabrication of a semiconductor integrated circuit device according to another embodiment of the invention.
Figure 51:
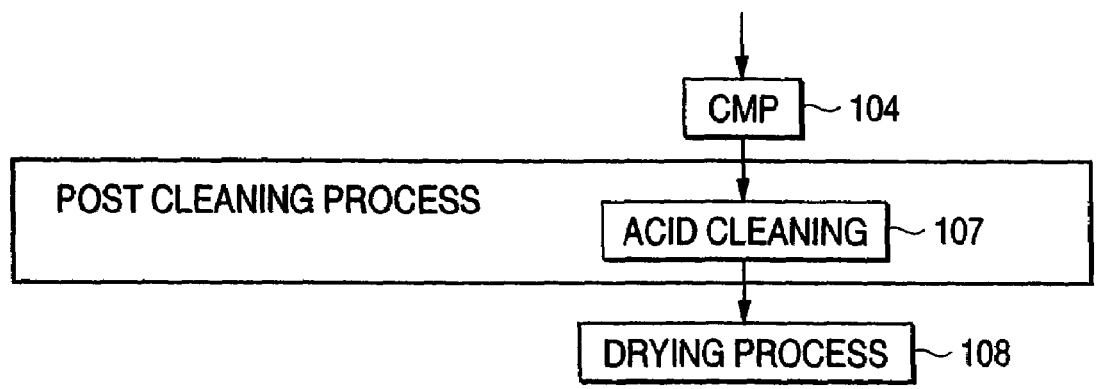
FIG. 51 is a flowchart of a part of a method of fabrication of a semiconductor integrated circuit device according to still another embodiment of the invention.

It is noted that, in the post process of the Embodiment 3, the means for carrying out hydrogen plasma and ammonia plasma processes and the means of the Embodiment 4, if combined with the case of not carrying out a deoxidizing process during the post-CMP cleaning process or immediately before that, as shown in FIG. 50 or FIG. 51, can obtain the effect of each means. FIG. 50 exemplifies a case in which alkali cleaning (step 105) and acid cleaning (step 107) are carried out in sequence during post-CMP cleaning, while FIG. 51 exemplifies a case in which acid cleaning (step 107) only is carried out during post-CMP cleaning.

Embodiment 5

A method of fabrication of a semiconductor integrated circuit device of the present embodiment will be explained with reference to FIG. 52 to FIG. 61.

Figure 52:
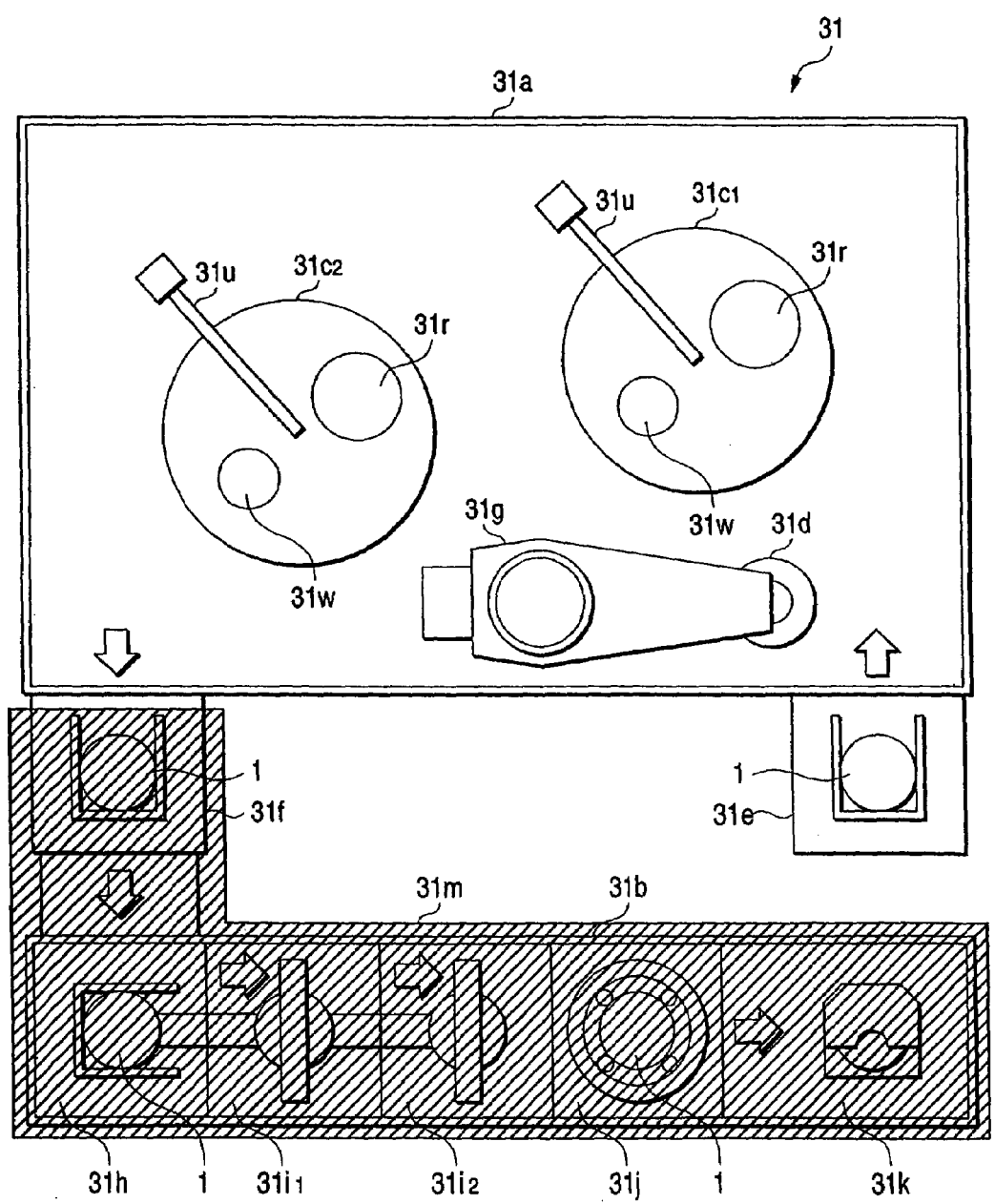
FIG. 52 is a top plan view showing one example of the overall structure of a CMP apparatus to be used in a method of fabrication of a semiconductor integrated circuit device according to another embodiment of the invention.

FIG. 52 is a schematic view showing one example of the overall structure of a CMP apparatus to be used for forming copper-based buried interconnects.

As shown in the figure, the CMP apparatus 31 has a polish processing section 31a and a post-cleaning section 31b provided in a rear stage thereof. The polish processing section 31a is provided with two platens (first platen 31c1, second platen 31c2) to perform a polishing process on a substrate 1, a clean station 31d to preliminarily clean the substrate 1 after polishing and subject the surface thereof to an anti-corrosion process, a rotary arm 31g to move the substrate 1 between the loader 31e, the first platen 31c1, the second platen 31c2, the clean station 31d, the unloader 31f and so on.

In a rear stage of the polish processing section 31a, a post-cleaning section 31b is provided to perform scrub cleaning on the surface of a substrate 1 after preliminary cleaning. The post-cleaning section 31b is provided with a loader 31h, a first cleaning section 31i1, a second cleaning section 31i2, a spin drier 31j, an unloader 31k and so on. Meanwhile, the post-cleaning section 31b is surrounded with a shade wall 31m in order to prevent light from illuminating the surface of a substrate 1 under cleaning. The interior is maintained in a darkroom state at 180 lux or less, preferably 100 lux or less. This is because, if light is illuminated on a substrate 1 on which a polishing solution adheres in a wet state, a short circuit current may flow through a pm junction due to silicon photovoltaic power to dissociate Cu ions from the surface of a Cu interconnect connected to a p-side (+ side) of the pn junction, thereby causing interconnect corrosion.

Figure 53:
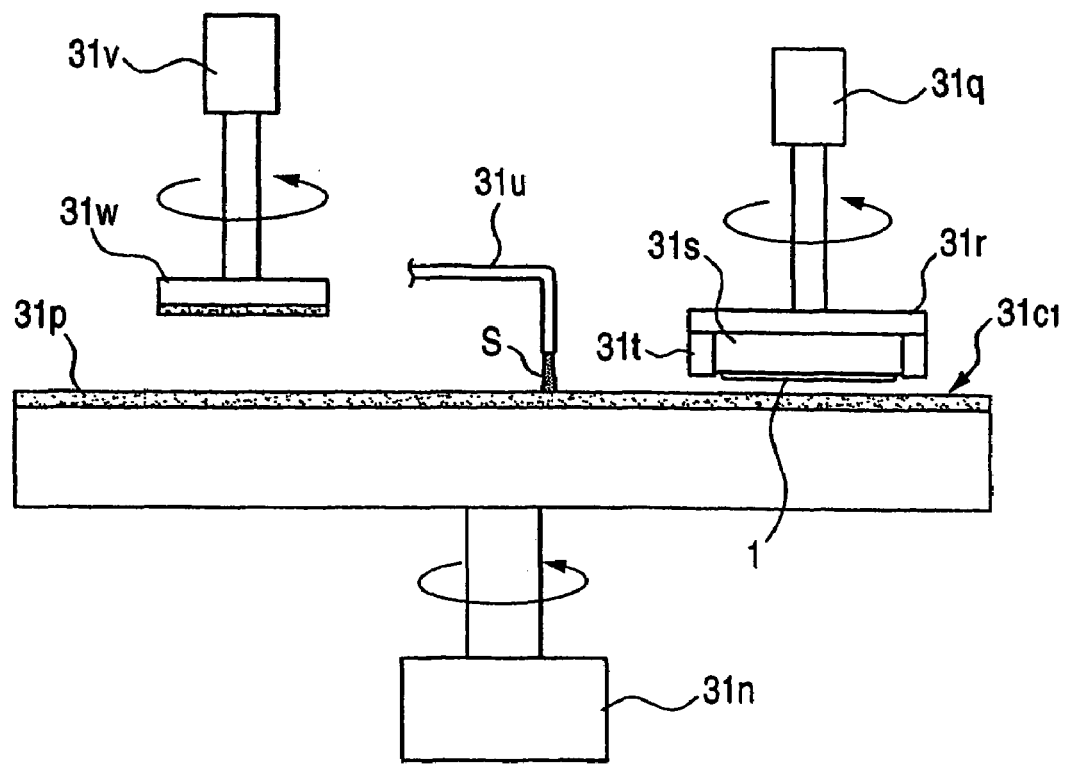
FIG. 53 is a side sectional view showing one part of a CMP apparatus to be used in forming a buried interconnect.

As shown in FIG. 53, the first platen 31c1 is rotatively driven in a horizontal plane by a drive mechanism 31n. Also, the first platen 31c1 has, on its upper surface, a polishing pad 31p formed by evenly bonding thereon a synthetic resin, such as polyurethane having a multiplicity of pores. In the area above the first platen 31c1, there is provided a wafer carrier 31r which is capable of being vertically moved and rotatively driven in a horizontal plane by a drive mechanism 31q. A substrate 1 is held with its main surface (polish surface) directed down by a wafer chuck 31s and a retainer ring 31t provided below the wafer carrier 31r, so as to be pressed with a predetermined load onto the polishing pad 31p. Slurry (abrasive liquid) S is fed through a slurry feed pipe 31u between a surface of the polishing pad 31p and a surface of the substrate 1, to chemically mechanically polish the surface of the substrate 1. Meanwhile, in the area above the first platen 31c1, there is provided a dresser 31w capable of being vertically moved and rotatively driven in a horizontal plane by a drive mechanism 31v. On the lower surface of the dresser 31w, there is attached a base member electro-deposited with diamond particles. The polishing pad 31p has its surface periodically ground by the substrate material in order to prevent loading due to polishing grits. It is noted that the second platen 31c2 has nearly the same structure as the first platen 31c1, except that two slurry feed pipes are provided.

Figure 54:
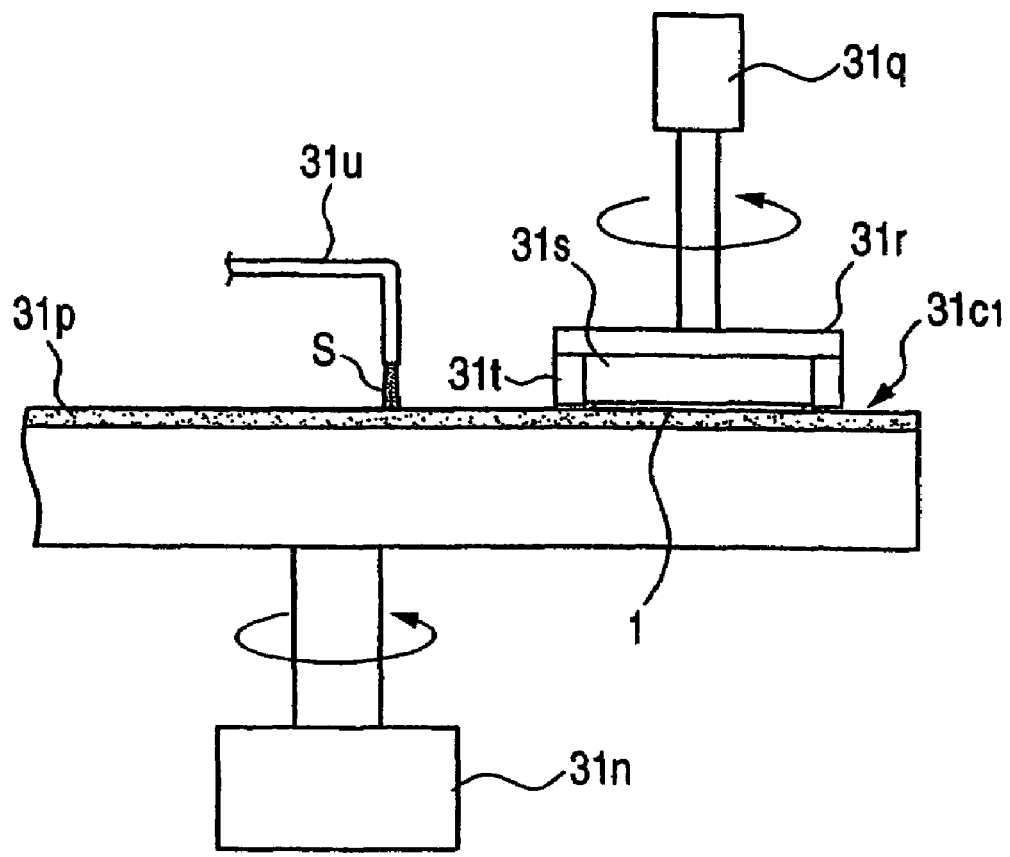
FIG. 54 is a side sectional view of the CMP apparatus showing a state of polishing a copper main-conductor film.
Figure 55:
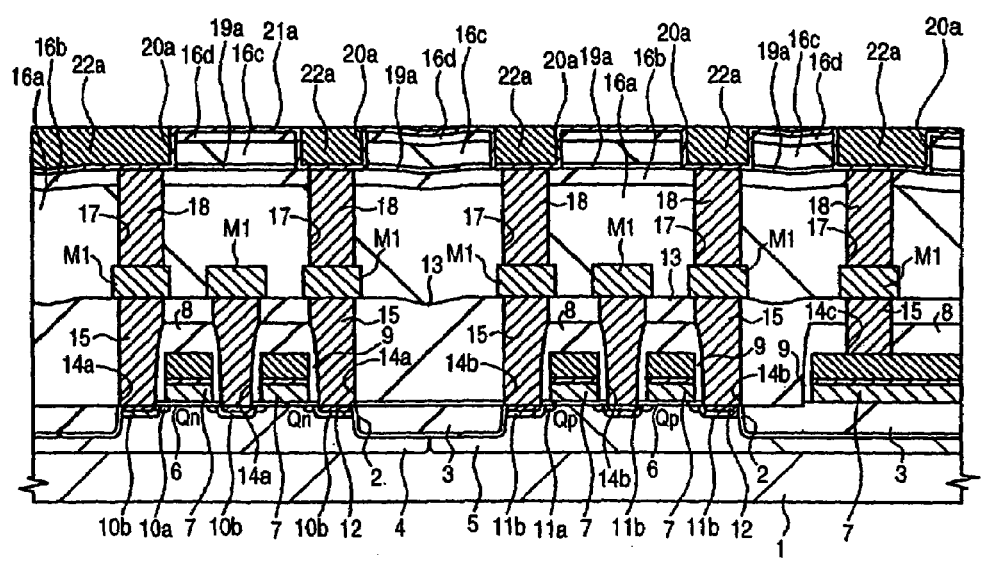
FIG. 55 is a sectional view of a semiconductor substrate showing the fabrication of a semiconductor integrated circuit device according to another embodiment of the invention.
Figure 56:
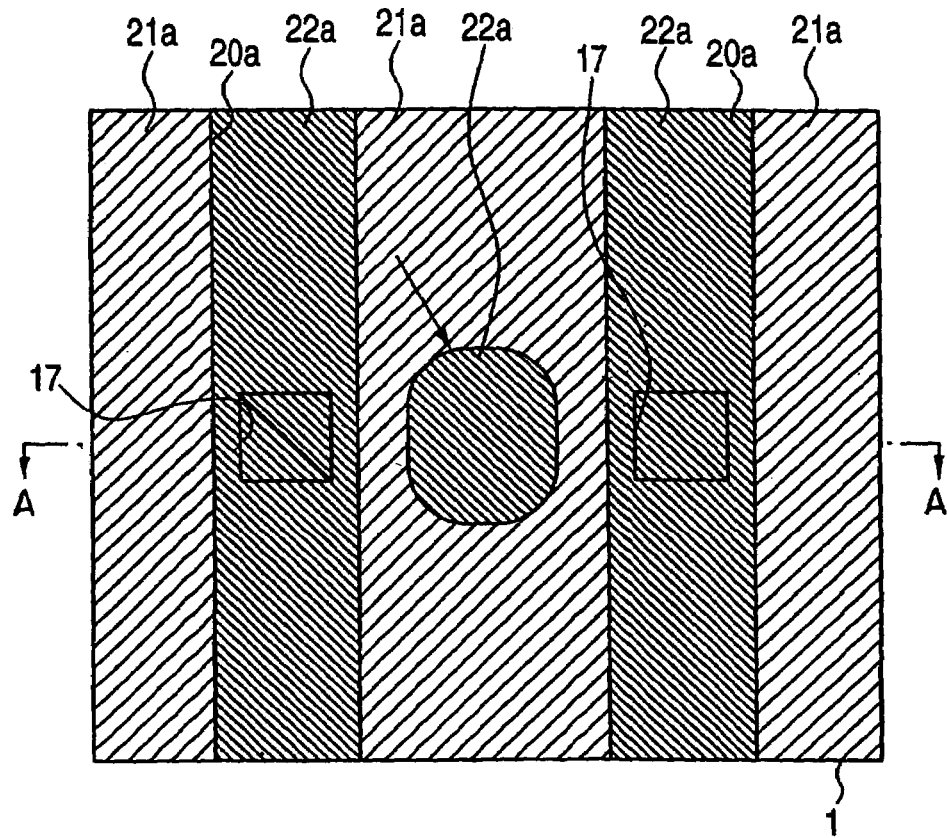
FIG. 56(a) is a plan view of the semiconductor substrate showing a step in the method of fabrication of the semiconductor integrated circuit device following the step of FIG. 55.
FIG. 56(b) is sectional view taken along line A–A' in FIG. 56(a)
Figure 56:
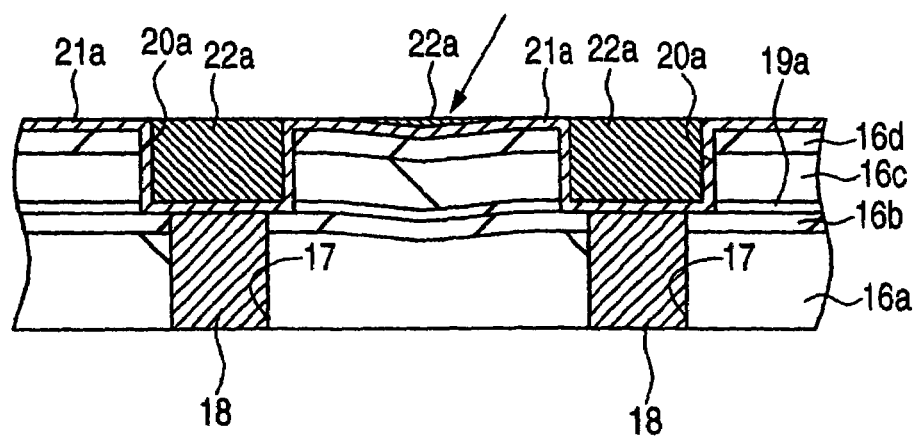

To form a copper-based buried interconnect by using the CMP apparatus 31, the substrate 1, received by the loader 31e, is transferred to the polish processing section 31a by means of the rotary arm 31g. This substrate 1 has been subjected to the same process as that explained with reference to FIGS. 23 to 25 mentioned above. As shown in FIG. 54, the substrate 1 is chemically mechanically polished using a slurry free of grits (grit-free chemical mechanical polishing) on the first platen 31c1 (first step CMP), thereby causing the copper-based main conductor film 22a outside of the interconnect trench 20a to be removed, as shown in FIG. 55.

Herein, the term "grit-free chemical mechanical polishing" refers to chemical mechanical polishing using an abrasive liquid (slurry) having grits comprising a powder of alumina, silica or the like in a content of 0.5% by weight or less. The abrasive liquid preferably has a grit content of 0.1% by weight or less, more preferably 0.05% by weight or less or 0.01% by weight or less.

Also, the abrasive liquid to be used is adjusted in its pH to fall in a copper corrosive range and in its composition to have a polish selective ratio of a main conductor film 22a to a conductive barrier film 21a of at least 5 or greater. The abrasive liquid like this is exemplified by a slurry containing an oxidizer and an organic acid. The oxidizer is exemplified by hydrogen peroxide, ammonium hydroxide, ammonium nitrate and ammonium chloride. The organic acid is exemplified by citric acid, malonic acid, boletic acid, malic acid, adipic acid, benzoic acid, phthalic acid, tartaric acid, lactic acid, succinic acid and oxalic acid. Among these, hydrogen peroxide not containing metal ingredients and not a strong acid is a suitable oxidizer for use in an abrasive liquid. Meanwhile, citric acid, generally used as a food additive, is low in toxicity, low in waste-fluid harm, has less odor and is high in water dissolution, and hence it is a suitable organic acid for use in an abrasive liquid. The present embodiment uses an abrasive liquid having pure water to which hydroxide peroxide is added in an amount of 5% by volume and citric acid is added in an amount of 3% by weight to have a grit content of less than 0.01% by weight.

If chemical mechanical polishing is effected using an abrasive liquid, as described above, oxidation occurs in a surface of the copper so as to form a thin oxide layer on the surface. When an oxide-solubilizing substance is supplied, the oxide layer turns into a solution and liquates out, thereby decreasing the thickness of the oxide layer. The portion thinned in the oxide layer is again exposed to an oxidizing substance so as to increase the thickness of the oxide layer. Repeating the reaction, chemical mechanical polishing proceeds. It is noted that the chemical mechanical polishing using such a grit-free abrasive liquid is concretely described in Japanese Patent Application No. 299937/1997 and Japanese Patent Application No. 317233/1998.

The polishing conditions, as one example, are under a load of 250 g/cm$^2$, a wafer-carrier rotation velocity of 3.0 rpm, a platen rotation velocity of 25 rpm and a slurry flow rate of 150 cc/min, wherein-the polishing pad uses a hard pad (IC1400) produced by U.S. Rodel. The end point of polishing is at a time when the main conductor film 22a has been removed so as to expose the underlying conductive barrier film 21a. The detection of an end point is based on detecting a platen or wafer-carrier rotation torque signal intensity which changes when a subject of polishing is changed from a main conductor film 22a to a conductive barrier film 21a. Meanwhile, it is satisfactory to open a part of the polishing pad in order to detect an end point depending upon a spectral change in light reflection from the substrate 1 surface, or detect an end point depending upon an optical spectral change in the slurry.

As shown in FIG. 55, by carrying out grit-free chemical mechanical polishing, the main conductor film in a portion outside of the interconnect trench 20a is almost removed to expose the underlying conductive barrier film 21a. However, as shown with magnification in FIGS. 56(a) and 56(b), an unremoved portion of the main conductor film 22a remains in a cavity (shown at the arrow) of the conductive barrier film 21a due to the underlying steps.

In order to remove the conductive barrier film 21a outside the interconnect trench 20a and the main conductor film 22a locally left on an upper surface thereof, the substrate 1 is transferred from the first platen 31c1, shown in FIGS. 52 to 54, to the second platen 31c2 to carry out chemical mechanical polishing using an abrasive liquid containing grits (slurry) (grit-used chemical mechanical polish) (second-step CMP). Herein, the term "grit-used chemical mechanical polishing" refers to chemical mechanical polishing using an abrasive liquid having grits of aluminum, silica or the like in a content greater than 0.5% by weight. The present embodiment uses an abrasive liquid of pure water to which hydrogen peroxide is added in an amount of 5% by volume, citric acid is added in an amount of 0.03% by weight and grits are added in an amount of 0.5% by weight, but the invention is not limited to this. The abrasive liquid is fed to a polishing pad 31p of the second platen 31c2 through the slurry feed pipe 31u.

Meanwhile, in the grit-used chemical mechanical polishing, the conductive barrier film 21a outside the interconnect trench 20a is removed following the removal of the locally left main conductor film 22a on the upper surface of the conductive barrier film 21a. For this reason, polishing is effected under a condition in which the polishing selective ratio of the conductor barrier film 21a to the main conductor film 22a is lower than that of the foregoing grit-free chemical mechanical polishing, to suppress the surface of the main conductor film 22a inside of the interconnect trench 20a from being polished.

The polishing conditions, as one example, are under a load of 120 g/cm$^2$, a wafer-carrier rotation velocity of 30 rpm, a platen rotation velocity of 25 rpm and a slurry flow rate of 150 cc/min, wherein the polishing pad uses IC1400 produced by Rodel. The polishing amount corresponds to the film thickness of the conductive barrier film 21a. The end point of polishing is determined by a time computed from a film thickness of and polishing rate on the conductive barrier film 21a.

Figure 57:
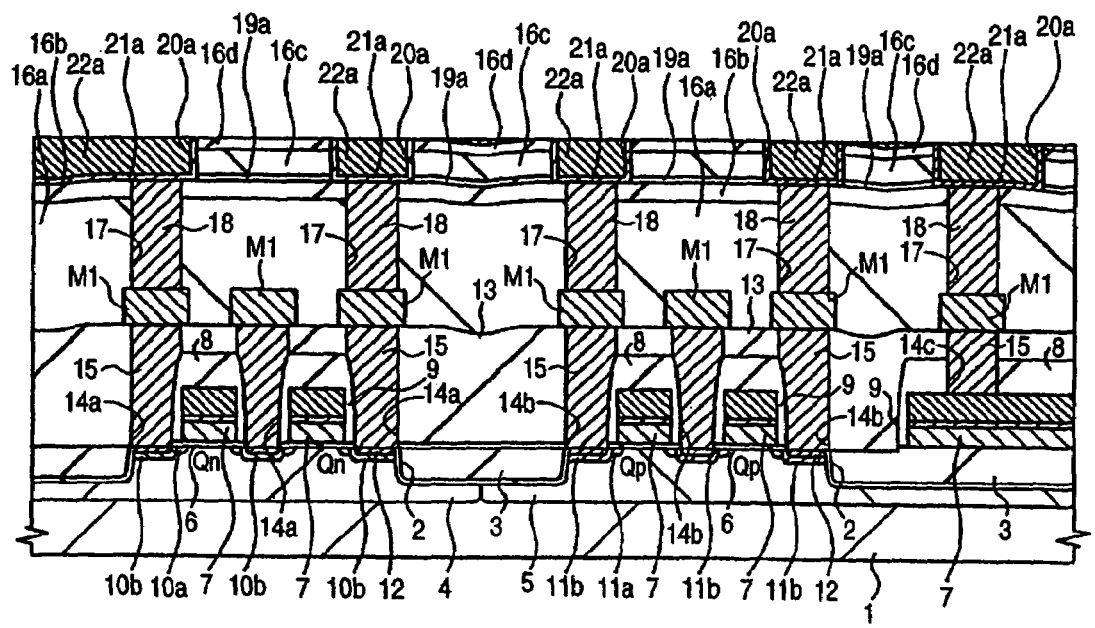
FIG. 57 is a sectional view of the semiconductor substrate showing a step in the method of fabrication of the semiconductor integrated circuit device following the step of FIG. 56(a)
Figure 58:
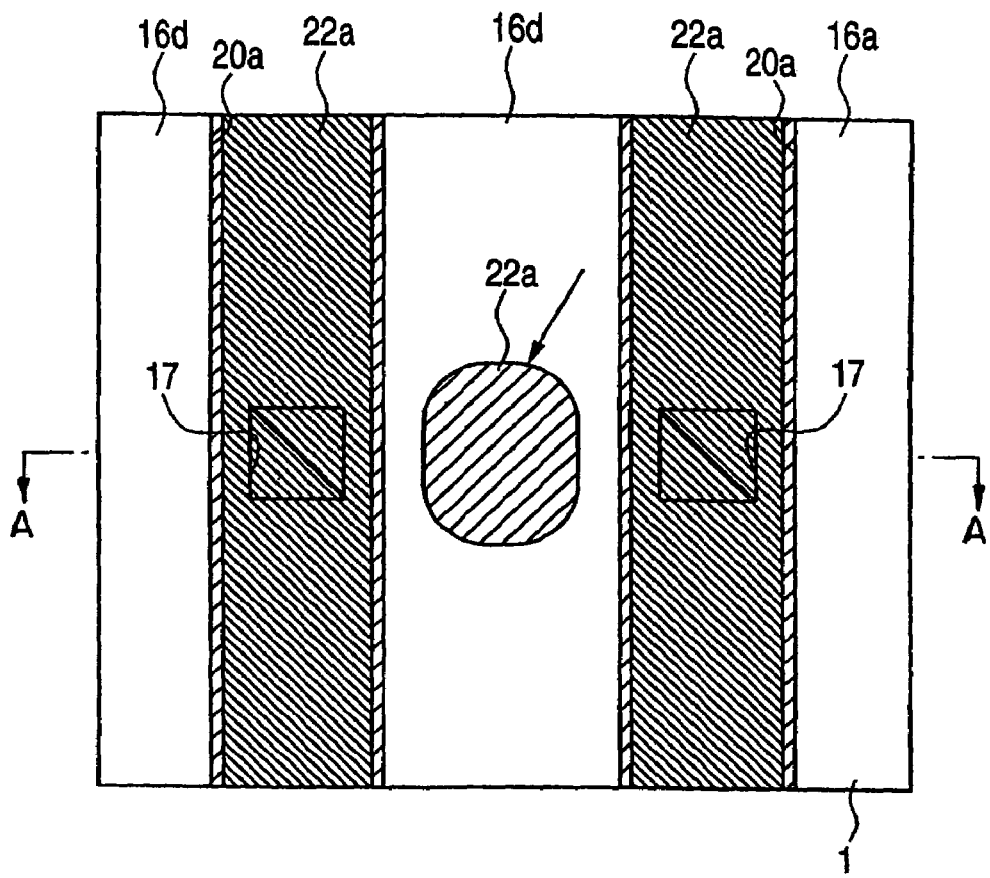
FIG. 58(a) is plan view of the semiconductor substrate showing a step of the method of fabrication of the semiconductor integrated circuit device following the step of FIG. 57.
FIG. 58(b) is a sectional view taken along line A–A' in FIG. 58(a)
Figure 58:
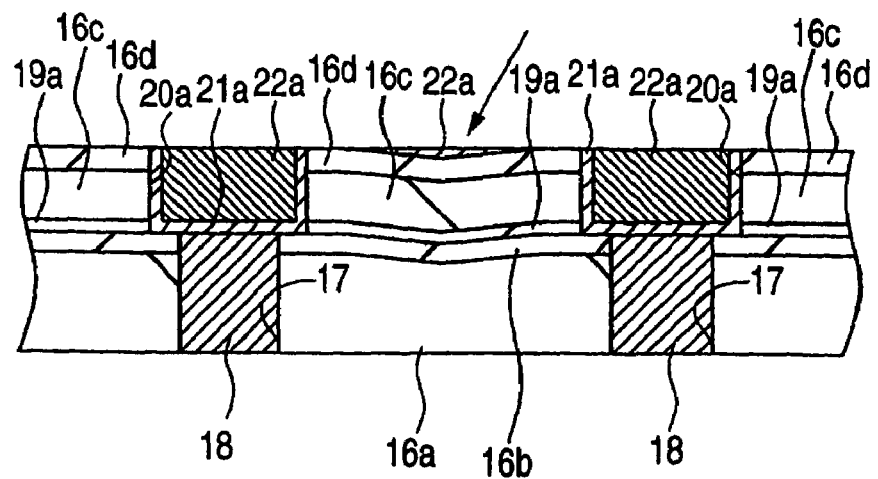

As shown in FIG. 57, the grit-used chemical mechanical polishing removes almost all of the conductive barrier film 21a outside of the interconnect trench 20a to expose the underlying insulation film 16d. However, as shown with magnification in FIGS. 58(a) and 58(b), an unremoved portion of the conductive barrier film 21a remains in a cavity of the insulation film 16d due to an underlying step (shown at the arrow) or the like.

Next, selective chemical mechanical polishing is carried out to remove the locally left conductive barrier film 21a on the insulation film 16d outside of the interconnect trench 20a, while suppressing the polishing of the main conductor film 22a inside of the interconnect trench to a possible less extent (third-step CMP). This selective chemical mechanical polishing is effected under a condition such that the polish selective ratio of the conductive barrier film 21a to the main conductor film 22a is at least 5 or greater. Also, this chemical mechanical polishing is effected under a condition such that the ratio of a polishing rate on the insulation film 16d to a polishing rate on the main conductor film 22a is greater than 1.

The selective chemical mechanical polishing generally uses an addition of an anti-corrosive agent to an abrasive liquid containing grits in an amount greater than 0.5% by weight, as was used in the grit-used chemical mechanical polishing. The anti-corrosive agent refers to an agent which forms an anti-corrosive protection film over a surface of the main conductor film 22a, thereby preventing or suppressing polishing from proceeding, and uses Benzotriazole (BTA), BTA derivatives, such as BTA carbonic acid, dodecylmer-captan, triazole, tolyltriazole or the like. Particularly, the use of BTA forms a stable protection film.

When using BTA as an anti-corrosive agent, although the concentration thereof is dependent upon the kind of slurry, a sufficient effect is available by an addition of usually 0.001–1% by weight, more preferably 0.01–1% by weight, and further preferably 0.1–1% by weight (three stages). The present embodiment uses a mixture of the abrasive liquid as was used in the second step of the grit-used chemical mechanical polishing, as an abrasive liquid, to which BTA is added as an anti-corrosive agent in an amount of 0.1% by weight. However the invention is not so limited. Meanwhile, in order to avoid a lower polishing rate due to the addition of an anti-corrosive agent, polyacrylic acid, polymethacrylic acid, an ammonium salt of these, ethylenediaminetetraacetic acid (EDTA) or the like may be added as required. It is noted that the chemical mechanical polishing using a slurry containing such an anti-corrosive agent is described in Japanese Patent Application No. 209857/1998, Japanese Patent Application No. 299937/1997 and Japanese Patent Application No. 317233/1998.

This selective chemical mechanical polishing (third-step CMP) is continuously carried out on the second platen 31c2 of the CMP apparatus shown in FIGS. 52 to 54 after completing the grit-used chemical mechanical polishing (second-step CMP). The abrasive liquid to which the anti-corrosive agent is added is fed to a surface of the polishing pad 31p through the slurry feed pipe 31u. The polishing condition, as one example, is under a load of 120 g/cm$^2$, a wafer-carrier rotation velocity of 30 rpm, a platen rotation velocity of 25 rpm and a slurry flow rate of 190 cc/min.

Figure 59:
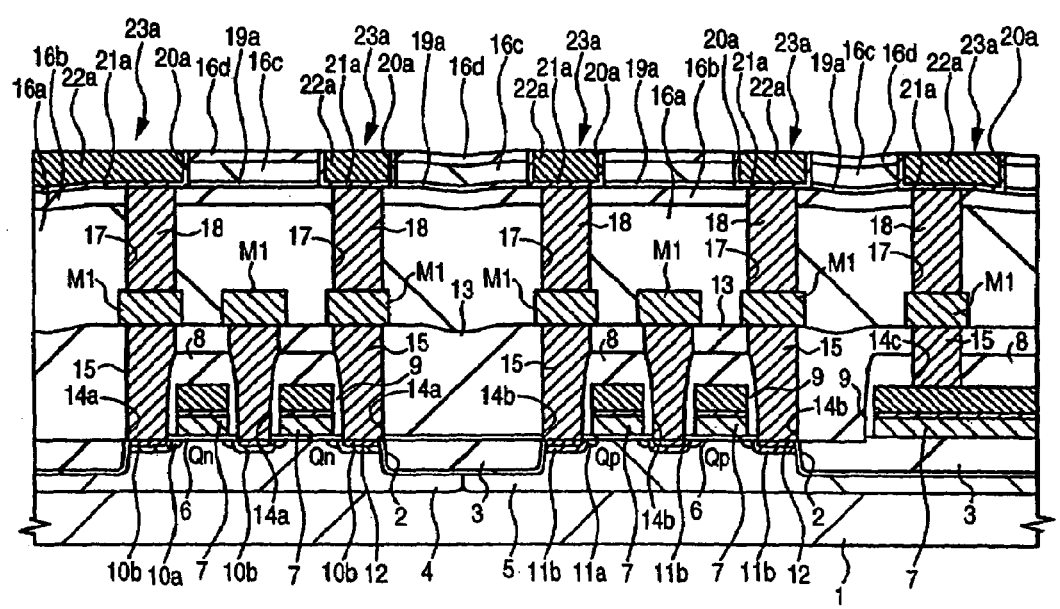
FIG. 59 is a sectional view of the semiconductor substrate showing a step in the method of fabrication of the semiconductor integrated circuit device following the step of FIG. 58(a)
Figure 60:
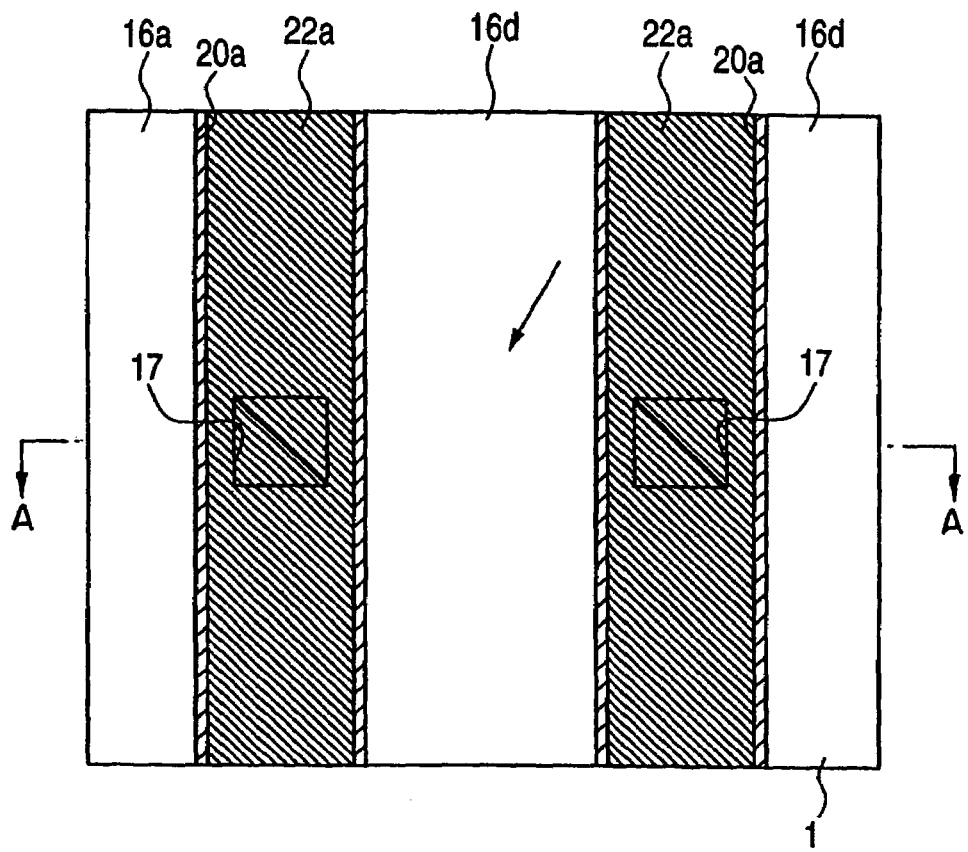
FIG. 60(a) is a plan view of the semiconductor substrate showing a step in the method of fabrication of the semiconductor integrated circuit device following the step of FIG. 59.
FIG. 60(b) is a sectional view taken along line A–A' in FIG. 60(a)
Figure 60:
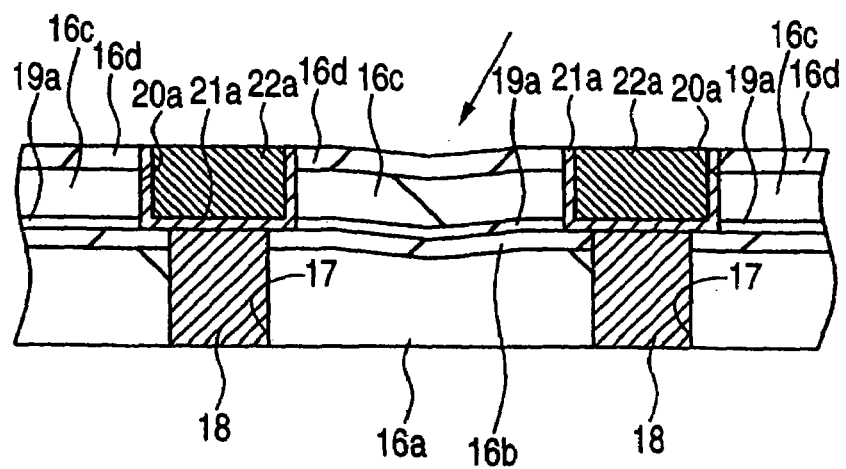

As shown in FIG. 59, and FIGS. 60(a) and 60(b), the selective chemical mechanical polishing removes all of the conductive barrier film 21a outside of the interconnect trench 20a to thereby form a buried interconnect 23a inside of the interconnect trench 20a.

On a surface of the substrate 1 in which buried interconnect 23a formation is completed, there is adhered a slurry residue containing particles of grits or the like or metal particles, such as Cu oxide. Consequently, in order to remove the slurry residue, first the substrate 1 is cleaned with pure water containing BTA in the clean station 31d shown in FIG. 52. In this case, mega-sonic cleaning may be used together, which liberates the slurry residue from the substrate 1 surface by applying a high-frequency vibration of 800 kHz or higher to the cleaning liquid. Next, in order to prevent drying of the surface, the substrate 1 held in a wet state is transferred from the polish processing section 31a to the post-cleaning section 31b. Scrub cleaning is effected using a cleaning liquid containing NH$_4$OH in an amount of 0.1% by weight in the first cleaning section 31i1, and subsequently a scrub cleaning is effected using pure water in the second cleaning section 31i2. As noted before, the post-cleaning section 31b in its entirety is covered with a shade wall 31m in order to prevent the occurrence of corrosion in the buried interconnect 23a due to illumination of light onto the substrate during cleaning.

Figure 61:
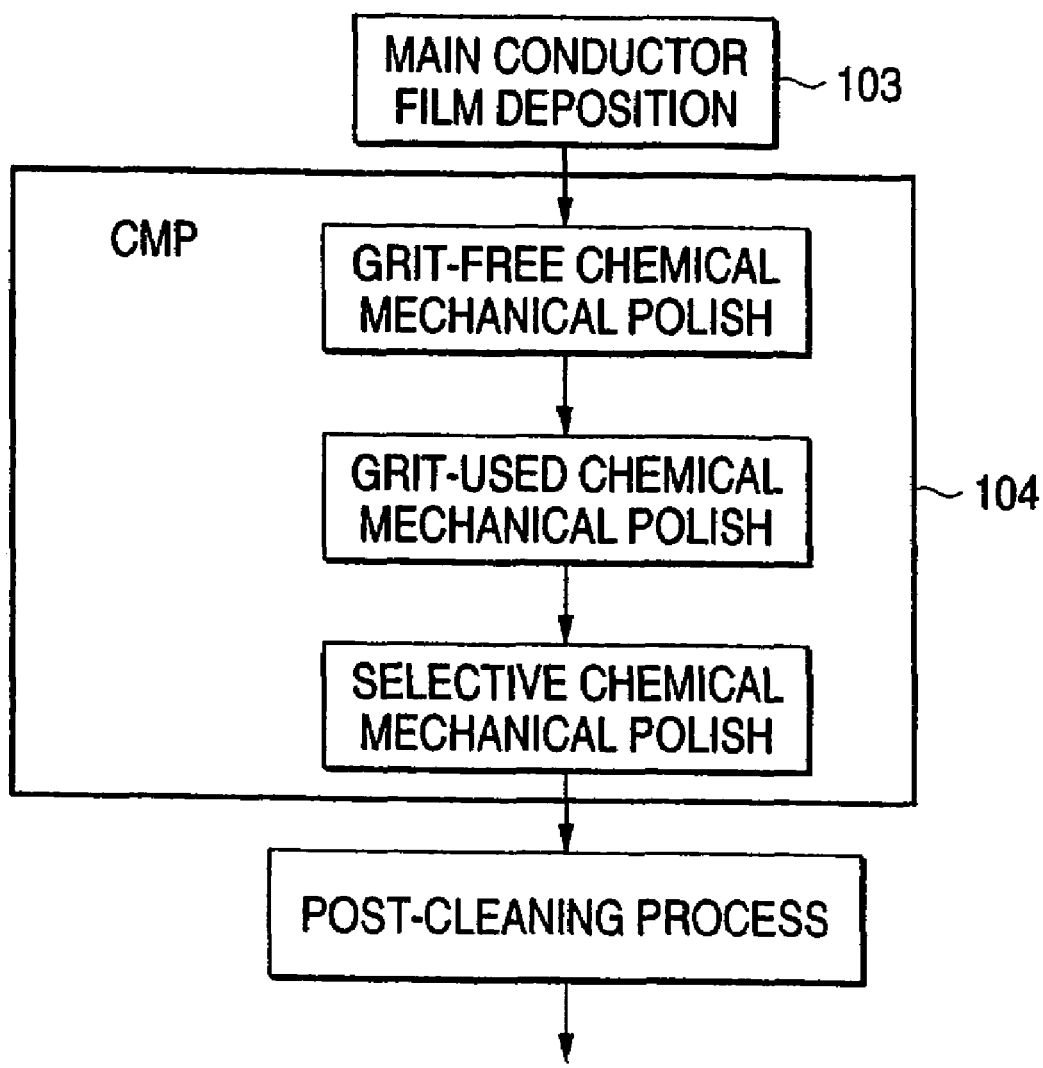
FIG. 61 is a flowchart showing the method of fabrication of the semiconductor integrated circuit device illustrated in FIG. 52 to FIG. 60(a)

The substrate 1 that has been subjected to scrub cleaning (post cleaning) is dried by the spin drier 31j and then transferred to the next process. The following processes are similar to those of the Embodiment 1. FIG. 61 is a flowchart showing a part of the buried-interconnect forming process. The other processes are the same as those of Embodiments 1 to 4.

Figure 62:
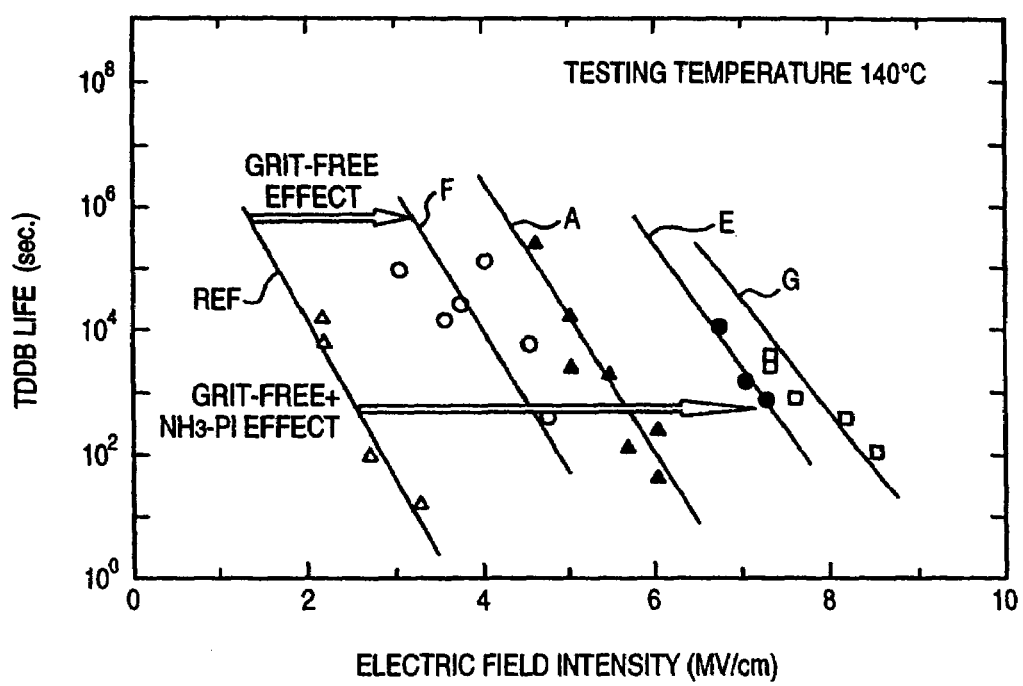
FIG. 62 is a graph showing a TDDB life.

According to the present embodiment, the TDDB life can be improved so as to be greater than that of the Embodiment 1. FIG. 62 is a graph showing a TDDB life in the present embodiment. The data in this embodiment is shown at a line E. For reference, shown at the same time are the data of no-processing (line Ref) and of grit-used chemical mechanical polishing (Embodiment 1) (line A). It is noted that the TDDB characteristic is improved, as shown at a line F, by carrying out only grit-free chemical mechanical polishing without performing an ammonia plasma process. It can be considered that the reason why the TDDB life is improved in a grit-free case in this manner is because the damage to a silicon oxide film can be reduced. In a grit-use case, slurry contains grits (alumina, etc.) having a particle size of 2 μm –3 μm (secondary particle size). The grits cause micro-scratches that damage the surface of the silicon oxide film (insulation film 16d). In the grit-free case, however, the slurry contains no grits or only a little bit of grits, which greatly reduces the damage. It can be considered that the TDDB characteristic is improved for these reasons.

Embodiment 6

The present embodiment uses, as an agent liquid, the foregoing organic acid or a mixture agent liquid of hydrogen fluoride and organic acid during an acid cleaning process (step 107 in FIG. 22) in the post-CMP cleaning process of the Embodiment 1. The other features are the same as those in Embodiments 1 to 5. In the case of using citric acid as the organic acid, brush scrub cleaning, for example, is used wherein the conditions of citric acid concentration of 5% and a cleaning time of 45 seconds are selected.

Figure 63:
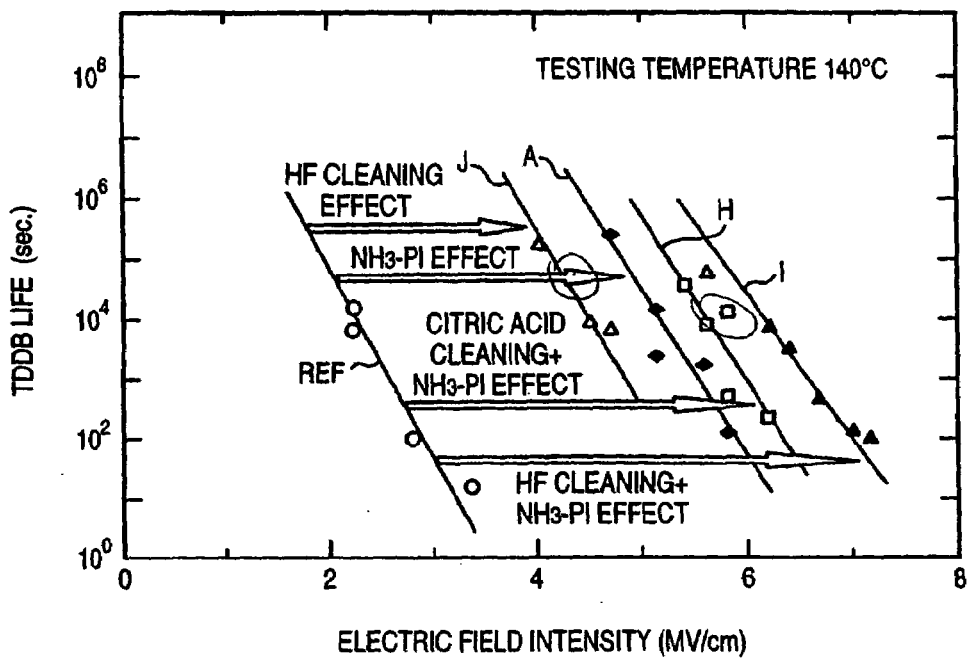
FIG. 63 is a graph showing a TDDB life.

By thus using organic acid cleaning, the damaged layer in the surface caused by CMP or the like can be removed. This improves the TDDB life. FIG. 63 is a graph showing a TDDB life in the case of the present embodiment. The data relating to use of citric acid in the present embodiment is shown at a line H, while the data relating to use of HF cleaning is shown at a line I. For reference, at the same time, data of no-processing (line Ref) and data of the present embodiment (line A) are shown. Meanwhile, when using organic acid, there is also an effect to remove only metal ions without causing damage to the underlying layer. Namely, impurities such as Fe, K and Ca can be selectively removed.

Embodiment 7

Figure 64:
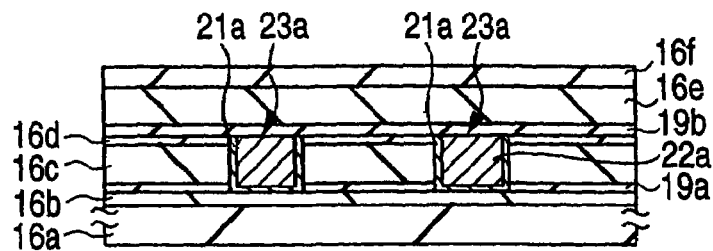
FIG. 64 is a sectional view of a semiconductor substrate showing a step in the fabrication of a semiconductor integrated circuit device according to another embodiment of the present invention.
Figure 65:
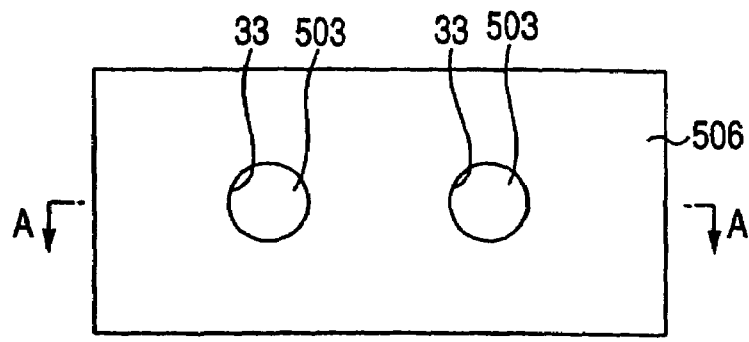
FIG. 65(a) is a plan view of the semiconductor substrate showing a step in the fabrication of the semiconductor integrated circuit device following the step of FIG. 64.
FIG. 65(b) is a sectional view taken along line A–A' in FIG. 65(a)
Figure 65:
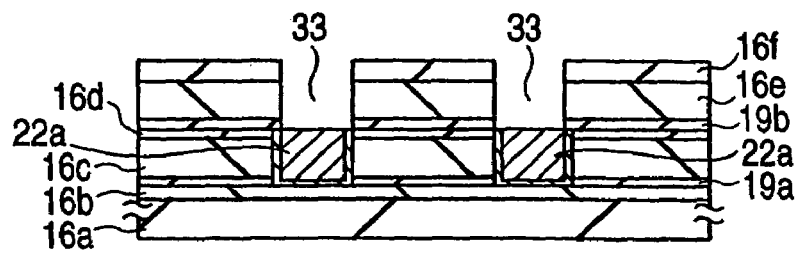
Figure 66:
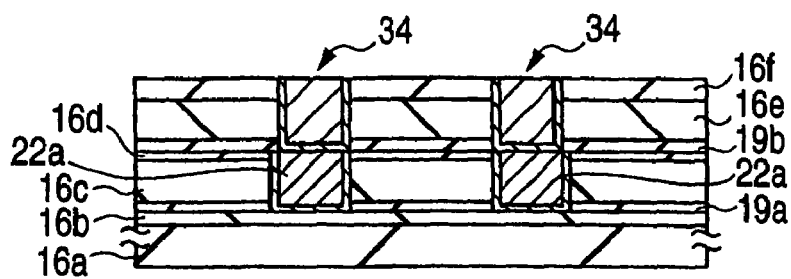
FIG. 66 is a sectional view of the semiconductor substrate showing a step in the fabrication of the semiconductor integrated circuit device following the step in FIG. 65(a)

FIG. 64 to FIG. 66 show a method of fabrication of a semiconductor integrated circuit device in an embodiment of the invention. An interconnect part only is shown in FIG. 64 to FIG. 66.

As shown in FIG. 64, a buried interconnect 23a and an insulation film 19b for a cap film are formed similarly to the Embodiment 1, followed by formation thereon of an insulation film 16e having a low dielectric constant comprising a silicon oxide film or the like and an insulation film 16f comprising a silicon oxide film or the like by a plasma CVD technique using TEOS as a material gas.

The insulation film 16e having a low dielectric constant is structured by a silicon-oxide-based insulation film having a specific dielectric coefficient (∈) of 3.0 or lower, e.g. an inorganic SOG film made of hydrogen silses quioxane as a material, an application-type insulation film such as an organic SOG film made as a material of tetra alkoxy silane+alkyl alkoxy silane, or a fluorocarbon polymer film formed by a plasma CVD technique. The use of such a low dielectric coefficient of silicon oxide film reduces the inter-level parasitic capacitance, thereby promoting the operation speed of the semiconductor integrated circuit device.

Next, when using a pattern as shown in FIG. 65(a), through-holes 33 are opened, as shown in FIG. 65(b). Photolithography and etching are used for opening through-holes 33. In the meanwhile, the insulation film 16e, which is low in dielectric constant, has a film structure having a coarse surface and possesses many Si—OH bonds. Due to this, it has been empirically revealed that the film formed in the upper layer thereof is not favorable in film quality and interfacial state. It has also been revealed that, where a conductive barrier film (titanium nitride or the like) is formed directly without processing, the TDDB characteristic is not favorable. For this reason, an ammonia plasma process, as was explained in the foregoing embodiments, is carried out on an exposed-portion of the insulation film 16 inside of the through-hole 33. Due to this, the Si—OH bonds in the surface are improved in nature and turned into Si—O—N bonds, as was explained with reference to the Embodiment 1.

Next, as shown in FIG. 66, a plug 34 is formed, for example, of titanium nitride and tungsten in the through-hole 33. During deposition of titanium nitride, Si—O—N bonds are desorbed similarly to Embodiment 1, thereby improving the interface of the titanium nitride and the low-dielectric-coefficient insulation film 16e and hence enhancing adhesion. Of course, such an in-through-hole plasma process is also applicable to an interconnect trench.

Meanwhile, in place of the ammonia plasma process, it is satisfactory to use a hydrogen plasma process or a plasma process mixed with nitrogen, argon, helium and the like. Of course, both the ammonia plasma process and the hydrogen plasma process as in the foregoing may be applied. This can improve the effect even more. The other points are the same as those of the Embodiments 1–6.

Incidentally, in an ashing process for removing a photo-resist film after opening a through-hole 33, oxidation in some cases occurs in the surface of the buried interconnect 23a at a bottom of the through-hole 33. There is a technique described in JPA-11-16912 for removing such an oxide layer.

Embodiment 8

As in the foregoing, it is considered that a barrier film for preventing copper diffusion is essentially required in putting the copper interconnect into practical use. However, as the interconnect scales down, the interconnect resistance increases due to an increase of the sectional area of a high-resistance barrier film occupying an interconnect sectional area, with a result that a problem arises in that the advantage of application of copper as an interconnect material weakens.

Figure 67:
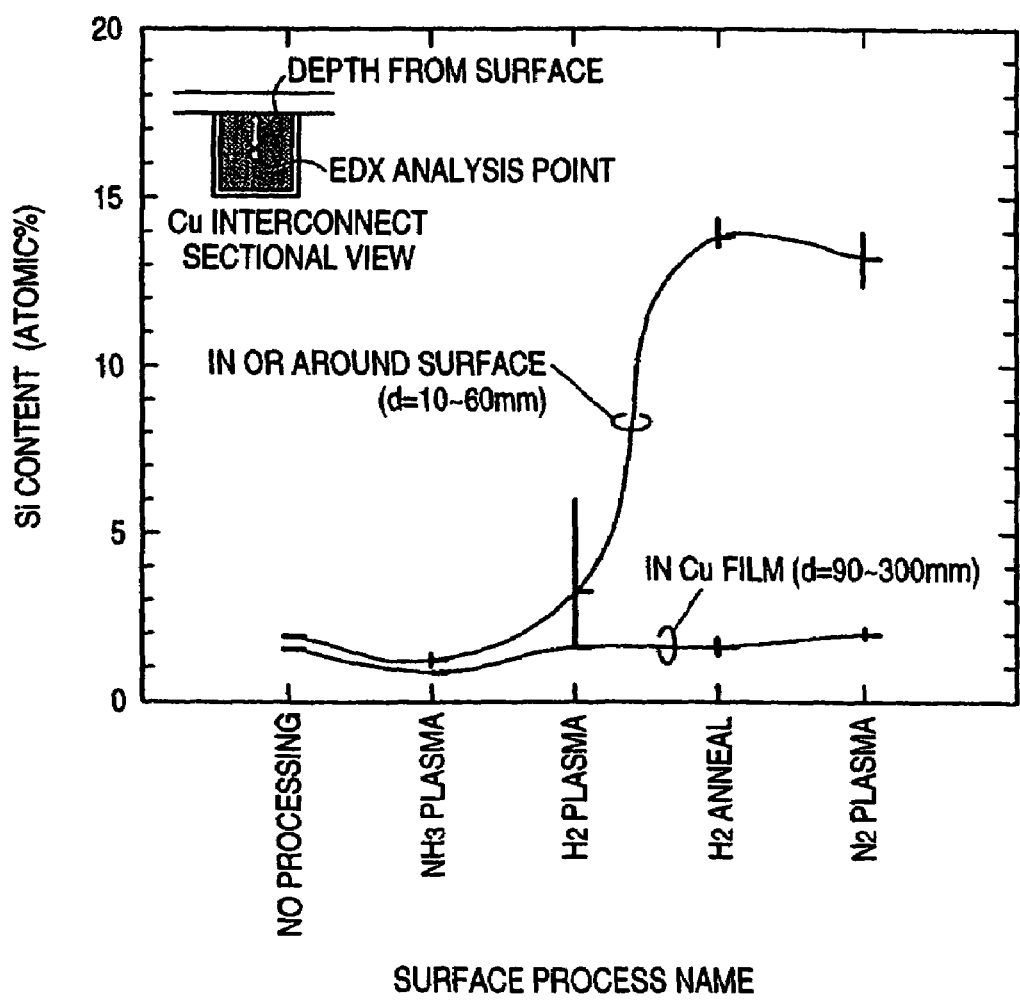
FIG. 67 is a graph showing an amount of silicon contained in a copper interconnect upon carrying out each process.

For this reason, the present inventors have again conducted an experiment and studied the copper diffusion phenomenon. As a result, the present inventors have first found a substantial mechanism on a copper diffusion phenomenon. FIG. 67 is a graph showing silicon content in a copper interconnect for each kind of a surface processing (ammonia plasma process, hydrogen plasma process, hydrogen anneal process, nitrogen plasma process) and not-processing. The inspection result has been prepared by the inspections conducted after the copper interconnect (including TiN film (barrier film)) forming process, the cleaning process (not including the deoxidizing process), the surface processing process (only each single plasma process) of various kinds, the cap-film forming process and the inter-layer-insulation-film forming process. Also, it is considered that similar results will be obtained for other impurities, such as oxygen and sulfur.

The copper silicide in various surface processes is mainly due to a set flow upon forming a cap film (silicon nitride or the like). In a hydrogen anneal process or nitrogen plasma process at this inspection time point, the content of Si is high in or around the surface (d=approx. 10 nm–60 nm) and in an interior (d=approx. 90 nm–300 nm) of a copper interconnect as compared to that of the ammonia plasma process or hydrogen plasma process. Particularly, it can be understood that it is extremely high in or around the surface. In these processes, the TDDB characteristic was poor.

On the other hand, in an ammonia plasma process or hydrogen plasma process at the inspection time point, the content of silicon is low in or around the surface (d=approx. 10 nm–60 nm) and in an interior of a copper interconnect as compared to that of the hydrogen plasma process or nitrogen plasma process. Particularly, the silicon content in or around the surface is extremely low. Namely, in these processes, there is less content of impurities in the copper interconnect and cleanness is high in the surface of the insulation film where the interconnect trench exists, and, further, there are less dangling bonds or the like in the surface of the insulation film where the interconnect trench is formed. Accordingly, the TDDB characteristic was favorable, as shown in FIG. 21. In this manner, where there exists a TiN film (conductive barrier film), the TDDB characteristic is determined only by the affects of an interface.

From such a new point of view, the present inventors have first found that, by forming not-ionized neutral Cu in a side wall and bottom of an interconnect trench (increasing copper purity), and carrying out the ammonia plasma process or hydrogen plasma process or combining these with the CMP process or cleaning process or the like, even if the film thickness of a barrier film is reduced in thickness to smaller than 10 nm or the barrier film itself is eliminated, the TDDB life of a semiconductor integrated circuit device having a Cu interconnect can be improved.

Figure 68:
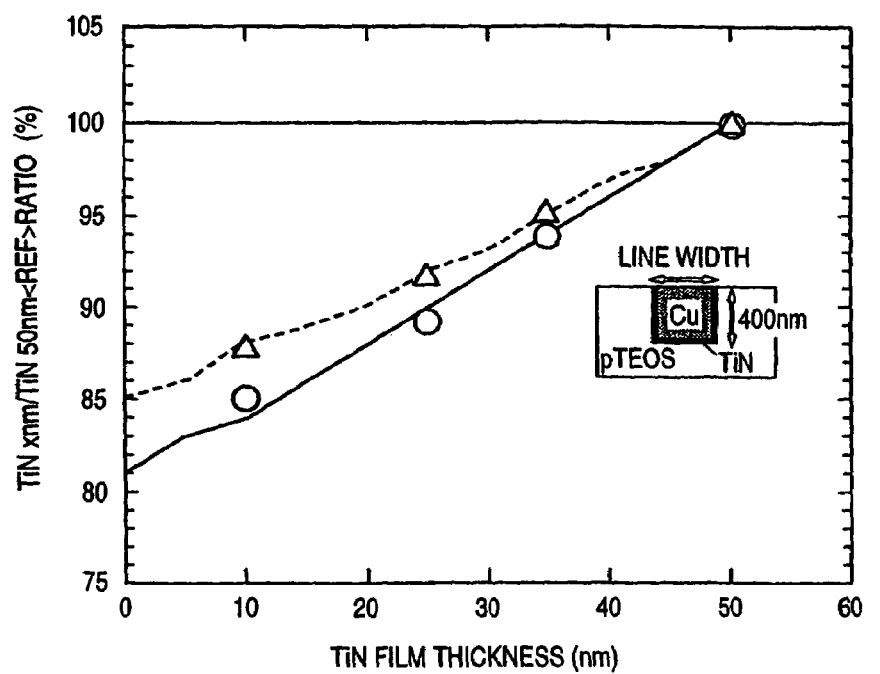
FIG. 68 is a graph showing conductive-barrier film thickness dependency in the resistance of a buried copper interconnect.

Herein, FIG. 68 shows a dependency of interconnect resistance (ratio of TiN.xnm/TiN.50 nm) on a TiN film (barrier film) thickness. The figure shows an actual measurement value and a theoretical value (calculated value) for a trench form having an interconnect width, for example, of approximately 0.4 µm and approximately 1.0 µm, and an interconnect-trench depth, for example, of approximately 0.4 µm. It is noted that the thickness of the TiN film is given by a film thickness at a bottom of the interconnect trench.

It is understood from FIG. 68 that, as the thickness of the TiN (barrier film) decreases, the interconnect resistance also decreases whereby a calculated value and an actual measurement value comes into coincidence. Consequently, as compared to an interconnect resistance for a TiN film thickness of 50 nm, where there is no TiN film, the interconnect resistance can be greatly decreased by nearly 19% for an interconnect width of nearly 0.4 µm and by nearly 15% for an interconnect width of nearly 1.0 µm. It is also understood that, even where the film thickness of the TiN film is nearly 10 nm, the interconnect resistance can be decreased by nearly 16% for an interconnect width of nearly 0.4 μm and by nearly 12% for an interconnect width of nearly 1.0 μm.

Figure 69:
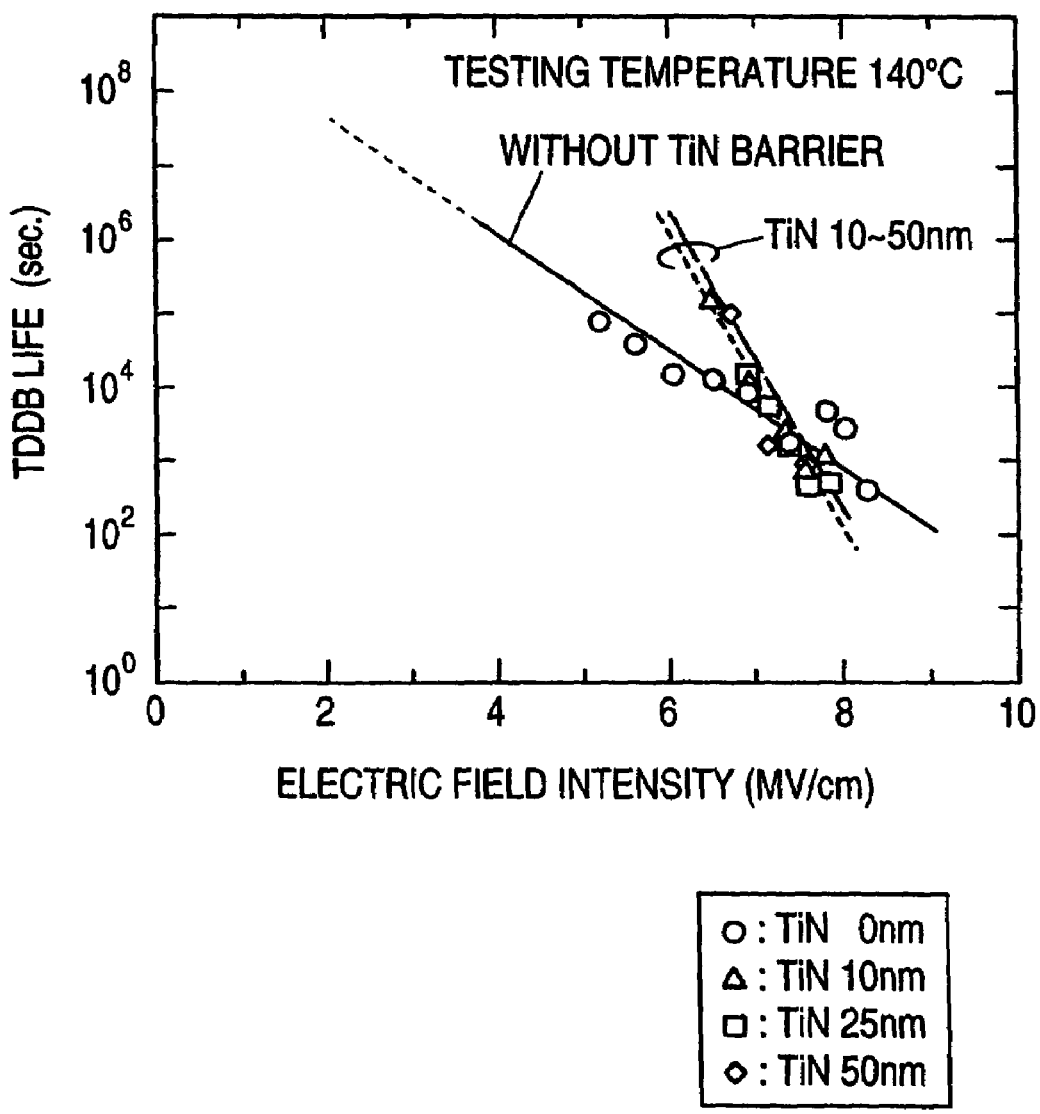
FIG. 69 is a graph showing the dependency of a TDDB characteristic on conductive-barrier film thickness.

Meanwhile, FIG. 69 shows a TiN film dependency of a TDDB characteristic where a copper interconnect is formed by a long-throw sputtering technique. It is understood from the figure that a TDDB characteristic for a TiN film thickness of 10 nm–50 nm is equivalent to the foregoing. On the other hand, it is understood that a TDDB characteristic of a sample in the absence of a TiN film is moderate in inclination as compared to a TDDB characteristic for a TiN film of nearly 10–50 nm, but fully in excess of a new system target (e.g. 0.2 MV/cm, 110° C., 10 yrs.=3×10$^8$ sec.).

Meanwhile, FIG. 70 shows a TDDB characteristic for each of a copper interconnect based on a presence or absence of a heating process in the absence of a TiN film and when a TiN film is formed to a thickness of nearly 10 nm. It is understood from the figure that, even on a sample in the absence of a TiN film, the TDDB characteristic is not deteriorated by the heating process, for example, at 400° C. for 3 hours. From the evaluation results in FIG. 69 and FIG. 70, it has been first revealed by the inventor's experiment that, even where a TiN film is absent, i.e. an interconnect is formed by copper only, it is possible to achieve sufficient reliability and form a practical Cu interconnect. It is noted that this is described in Japanese Patent Application No. 104015/2000 by the present inventors.

Figure 71:
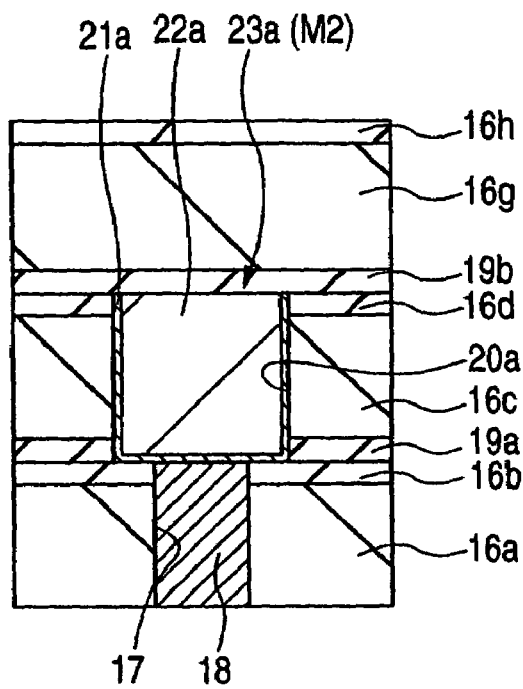
FIGS. 71(a) and 71(b) are sectional views of a copper buried interconnect layer of a semiconductor integrated circuit device according to another embodiment of the invention.
Figure 71:
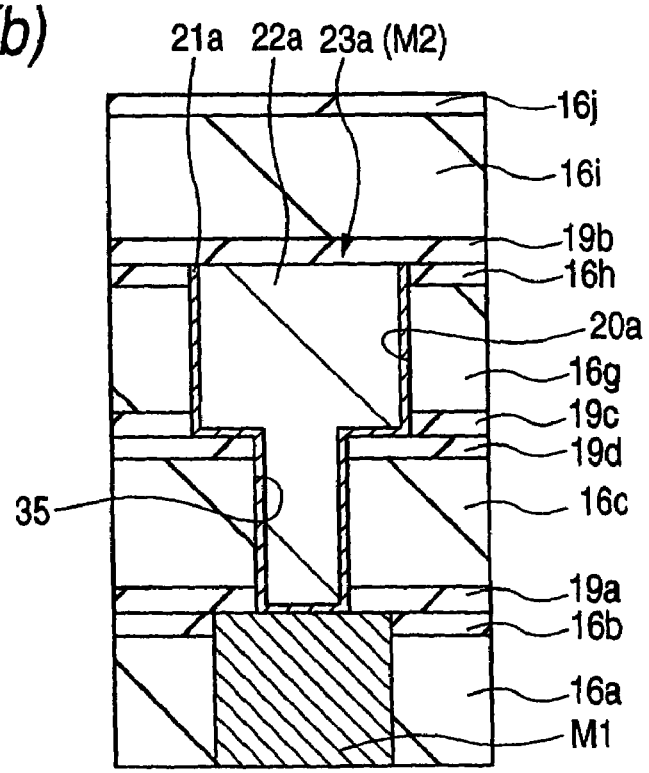
Figure 72:
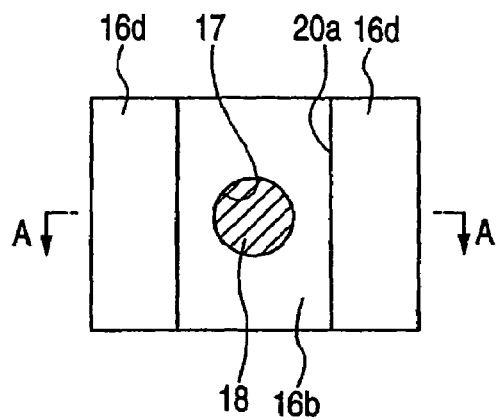
FIG. 72(a) is a plan view showing a step in the fabrication of a semiconductor integrated circuit device according to an embodiment of the invention.
FIG. 72(b) is a sectional view taken on line A–A' in FIG. 72(a)
Figure 72:
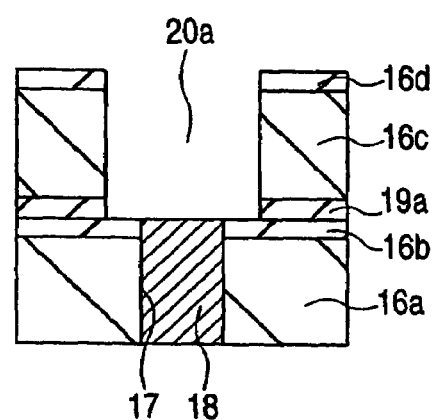
Figure 73:
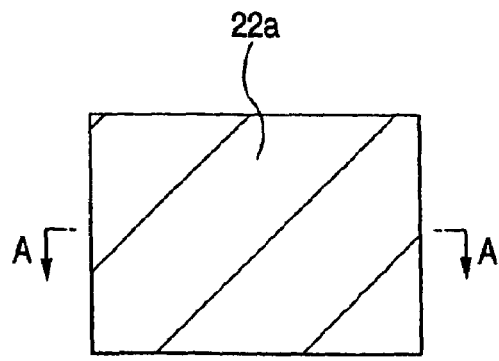
FIG. 73(a) is a plan view showing a step in the fabrication of the semiconductor integrated circuit device following the step of FIG. 72(a)
FIG. 73(b) is a sectional view taken on line A–A' in FIG. 73(a)
Figure 73:
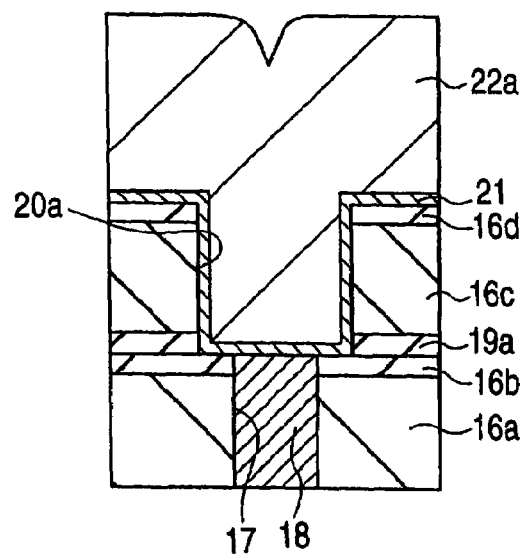
Figure 74:
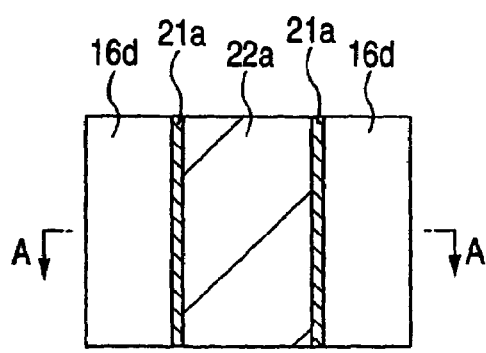
FIG. 74(a) is a plan view showing a step in the fabrication of the semiconductor integrated circuit device following the step in FIG. 73(a)
FIG. 74(b) is a sectional view taken on line A–A' in FIG. 74(a)
Figure 74:
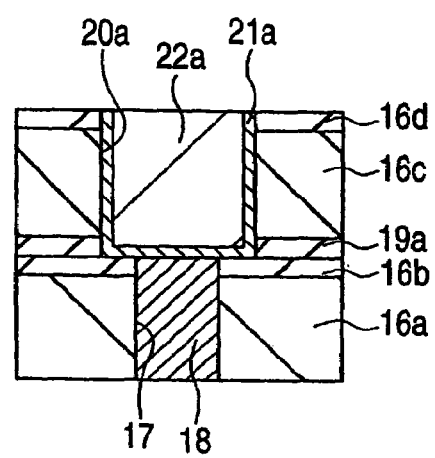
Figure 75:
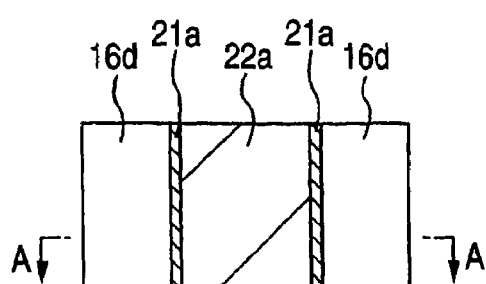
FIG. 75(a) is a plan view showing a step in the fabrication of the semiconductor integrated circuit device following the step in FIG. 74(a)
FIG. 75(b) is a sectional view taken on line A–A' in FIG. 75(a)
Figure 75:
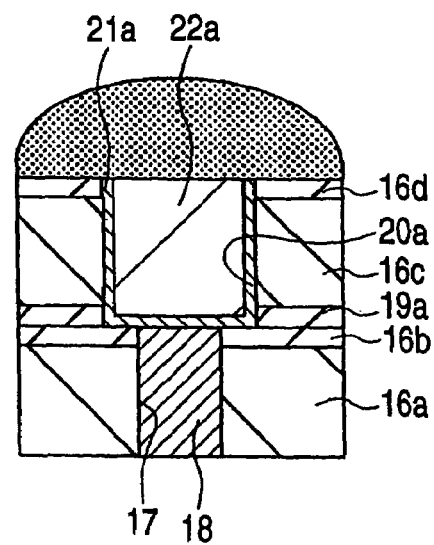
Figure 76:
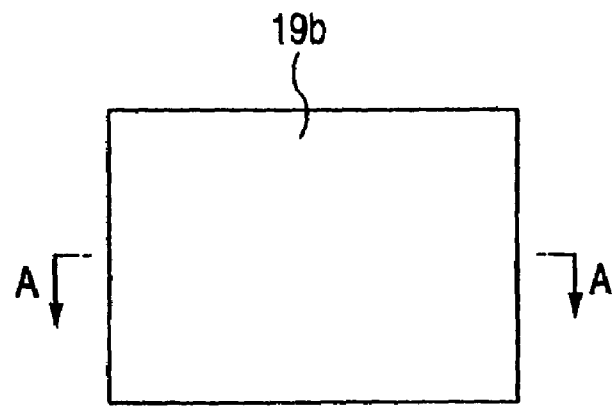
FIG. 76(a) is a plan view showing a step in the fabrication of the semiconductor integrated circuit device following the step in FIG. 75(a)
FIG. 76(b) is a sectional view taken on line A–A' in FIG. 76(a)
Figure 76:
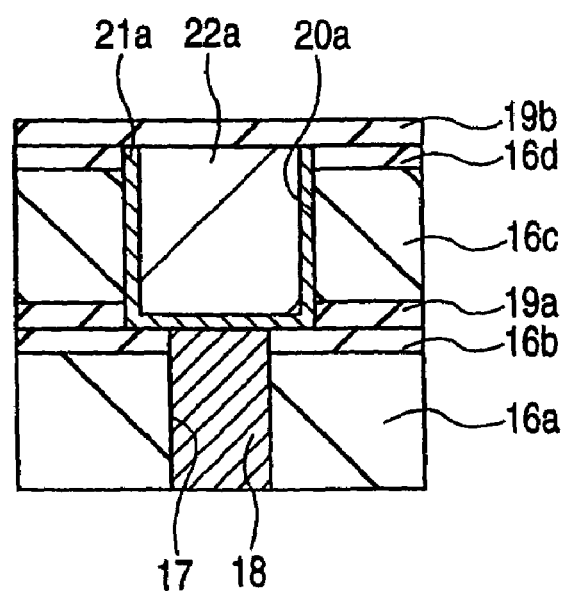
Figure 77:
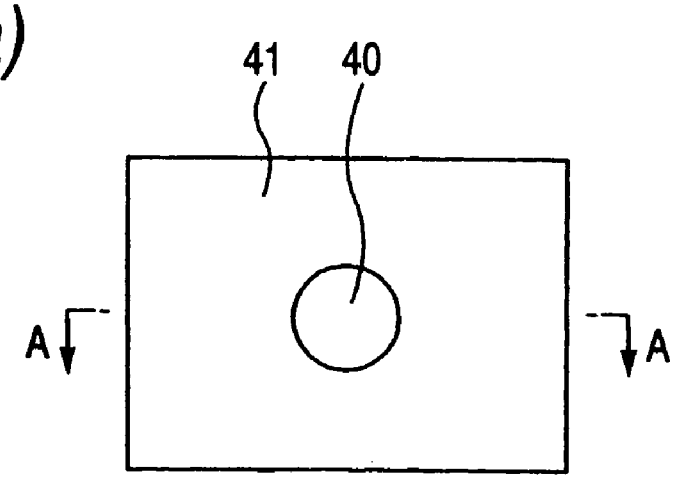
FIG. 77(a) is a plan view showing a step in the fabrication of the semiconductor integrated circuit device following the step in FIG. 76(a)
FIG. 77(b) is a sectional view taken on line A–A' in FIG. 77(a)
Figure 77:
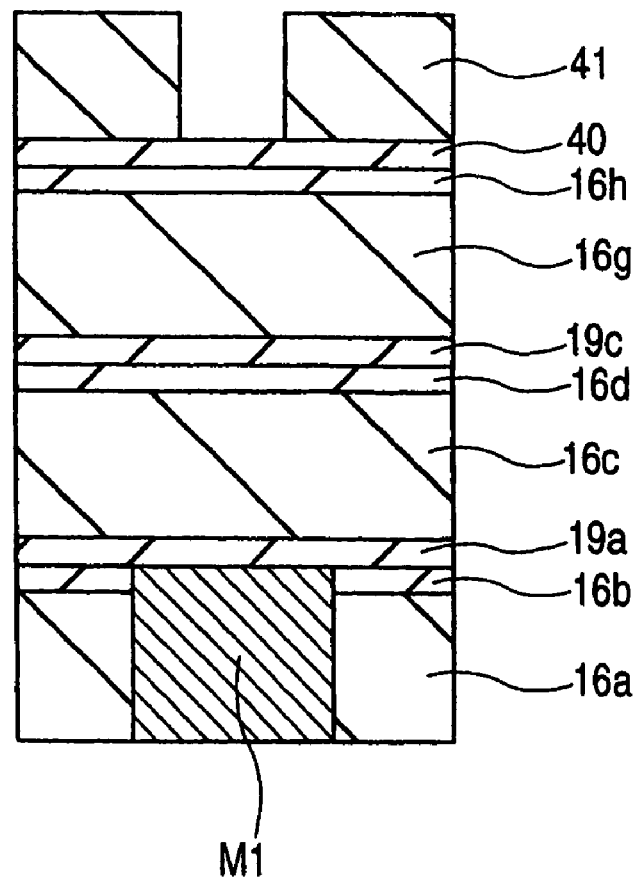
Figure 78:
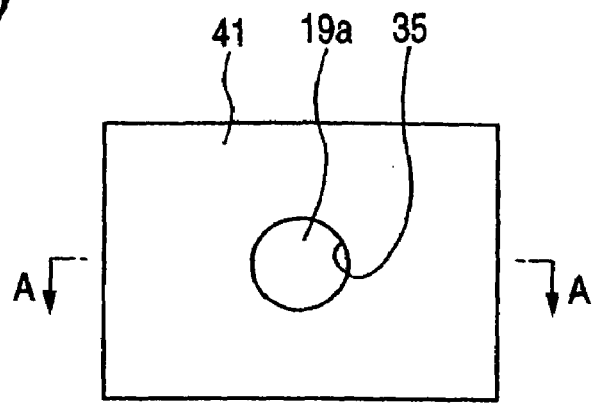
FIG. 78(a) is a plan view showing a step in the fabrication of the semiconductor integrated circuit device following the step in FIG. 77(a)
FIG. 78(b) is a sectional view taken on line A—A.
Figure 78:
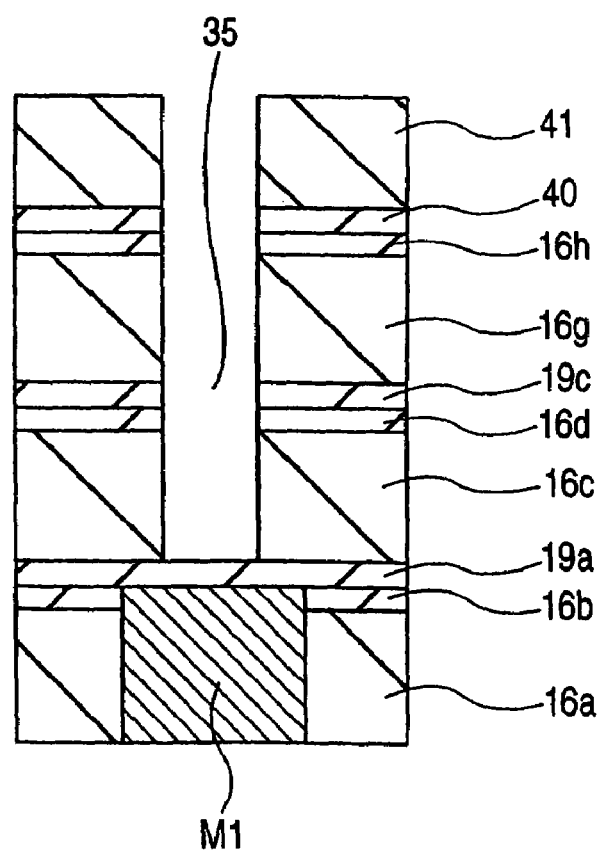
Figure 79:
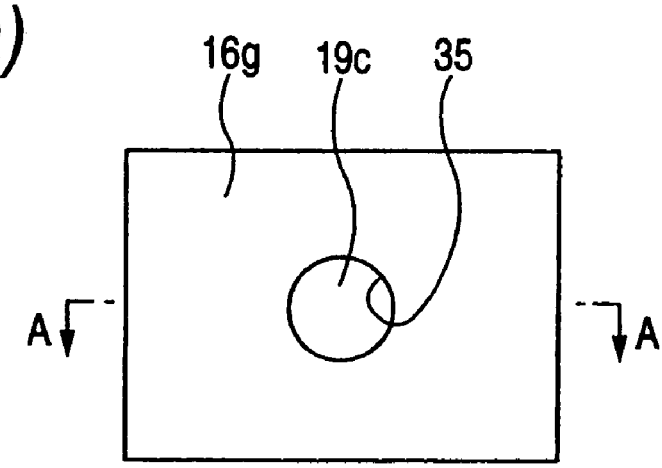
FIG. 79(a) is a plan view showing a step in the fabrication of the semiconductor integrated circuit device following the step of FIG. 78(b)
FIG. 79(b) is a sectional view taken on line A–A' in FIG. 79(a)
Figure 79:
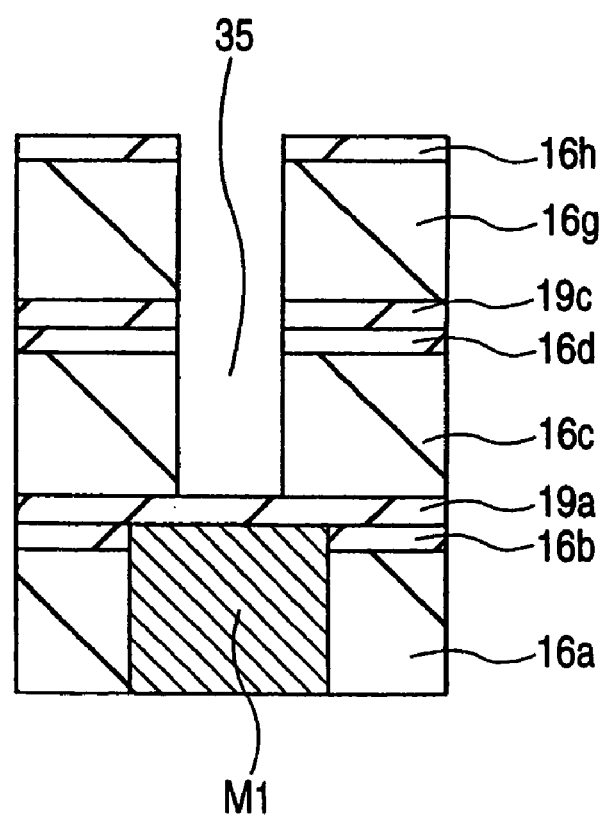
Figure 80:
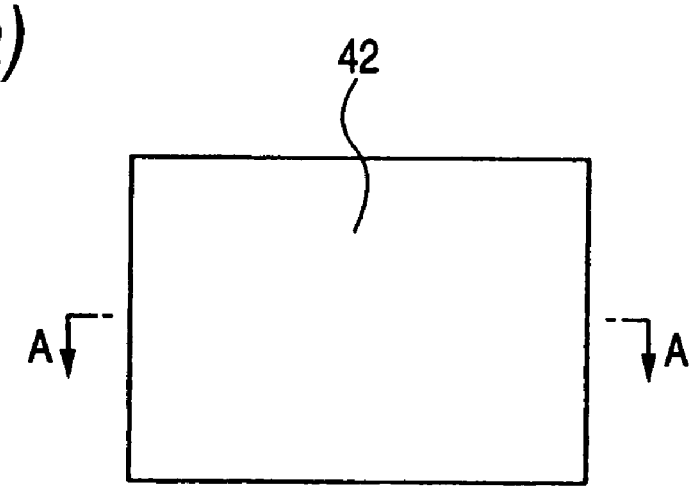
FIG. 80(a) is a plan view showing a step in the fabrication of the semiconductor integrated circuit device following the step in FIG. 79(a)
FIG. 80(b) is a sectional view taken on line A–A' in FIG. 80(a)
Figure 80:
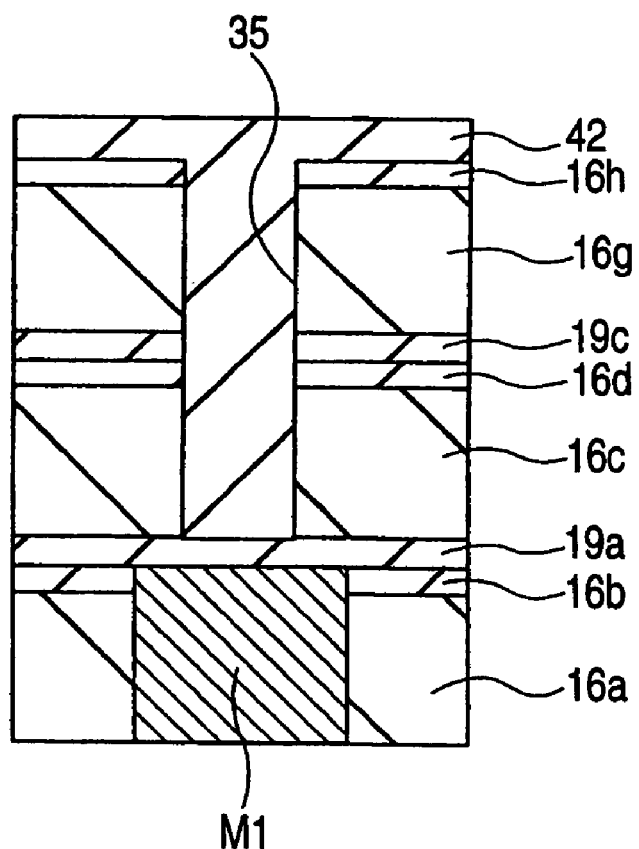
Figure 81:
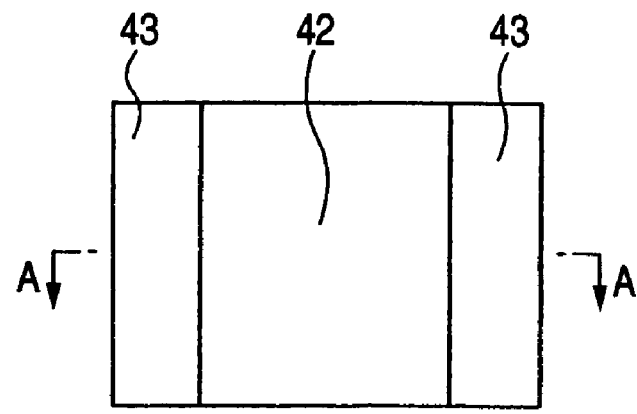
FIG. 81(a) is a plan view showing a step in the fabrication of the semiconductor integrated circuit device following the step in FIG. 80(a)
FIG. 81(b) is a sectional view taken on line A–A' in FIG. 81(a)
Figure 81:
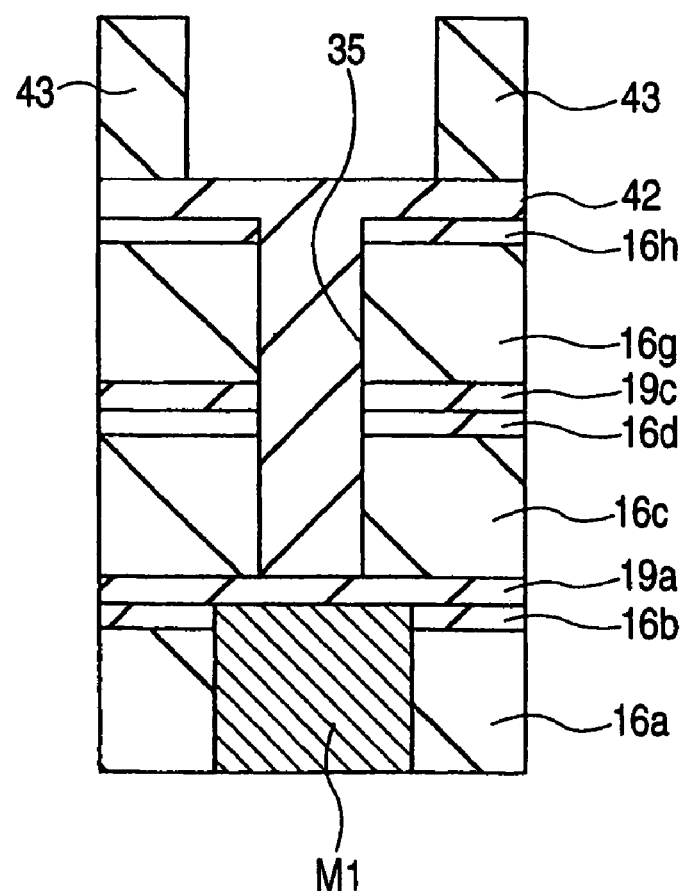
Figure 82:
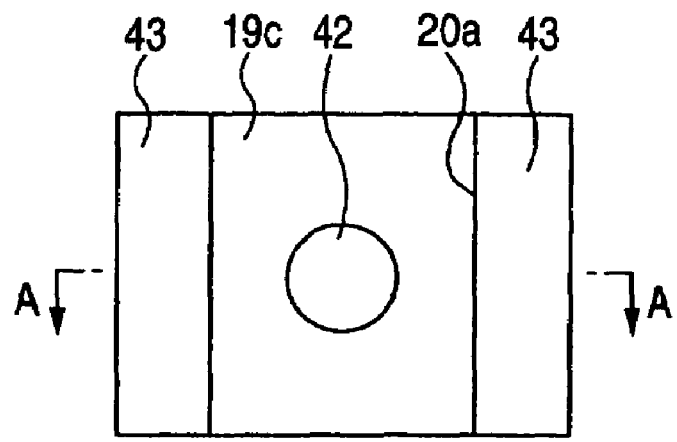
FIG. 82(a) is a plan view showing a step in the fabrication of the semiconductor integrated circuit device following the step in FIG. 81(a)
FIG. 82(b) is a sectional view taken on line A–A' in FIG. 82(a)
Figure 82:
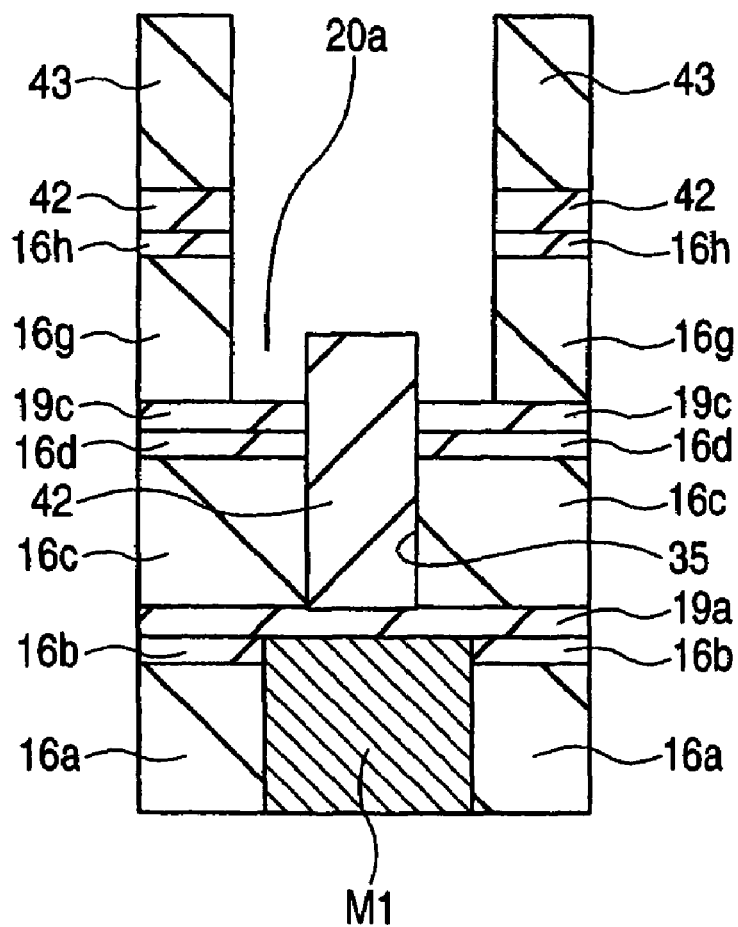
Figure 83:
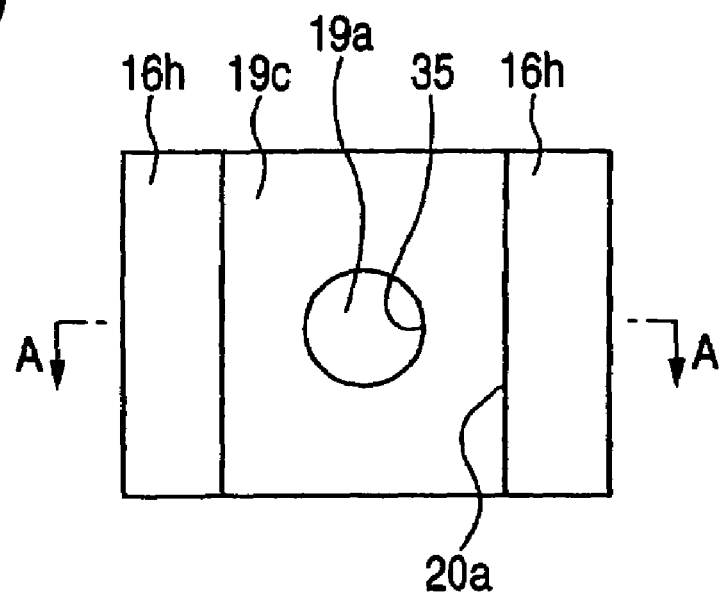
FIG. 83(a) is a plan view showing a step in the fabrication of the semiconductor integrated circuit device following the step in FIG. 82(a)
FIG. 83(b) is a sectional view taken on line A–A' in FIG. 83(a)
Figure 83:
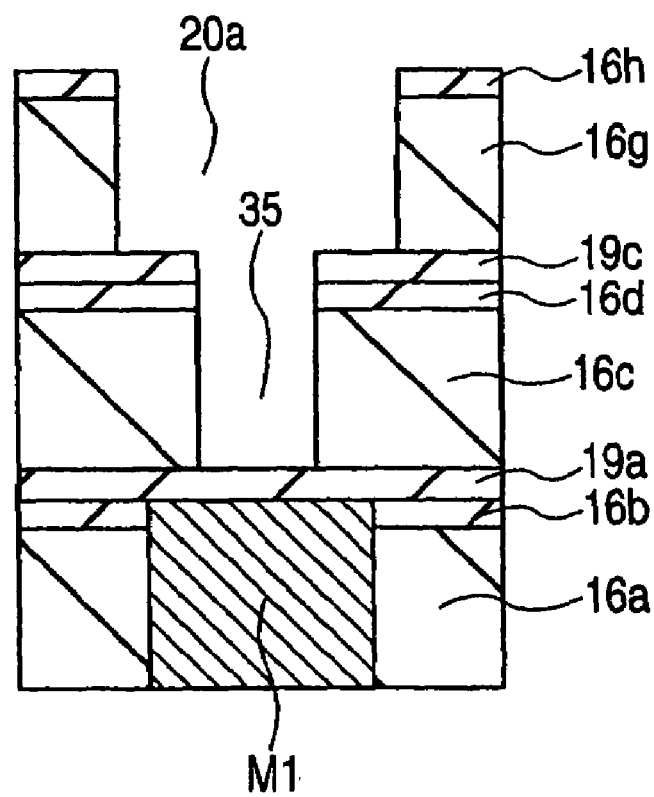
Figure 84:
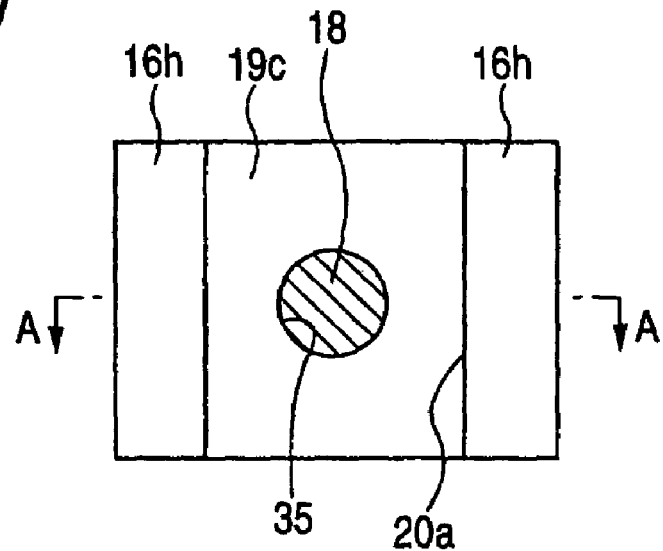
FIG. 84(a) is a plan view showing a step in the fabrication of the semiconductor integrated circuit device following the step in FIG. 83(a)
FIG. 84(b) is a sectional view taken on line A–A' in FIG. 84(a)
Figure 84:
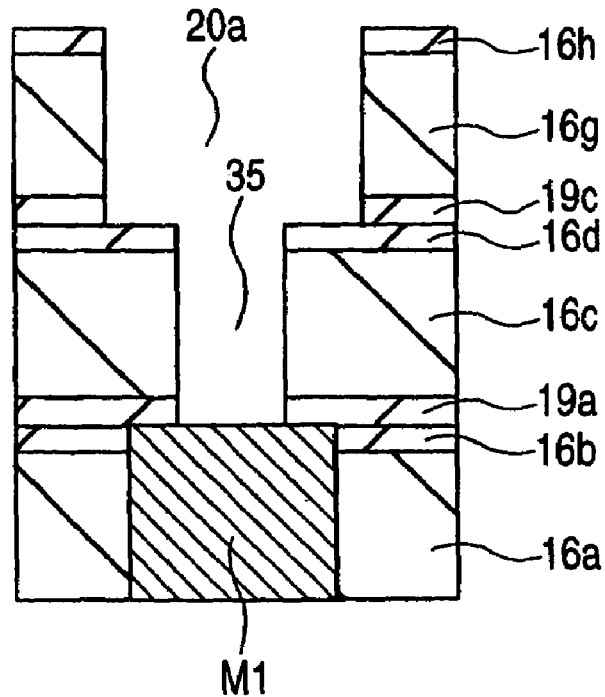
Figure 85:
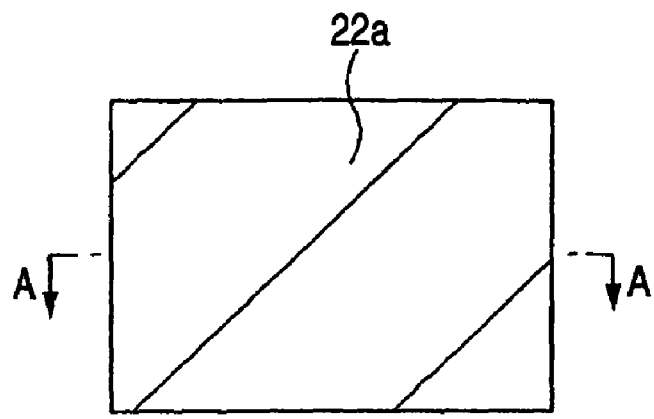
FIG. 85(a) is a plan view showing a step in the fabrication of the semiconductor integrated circuit device following the step in FIG. 84(a)
FIG. 85(b) is a sectional view taken on line A–A' in FIG. 85(a)
Figure 85:
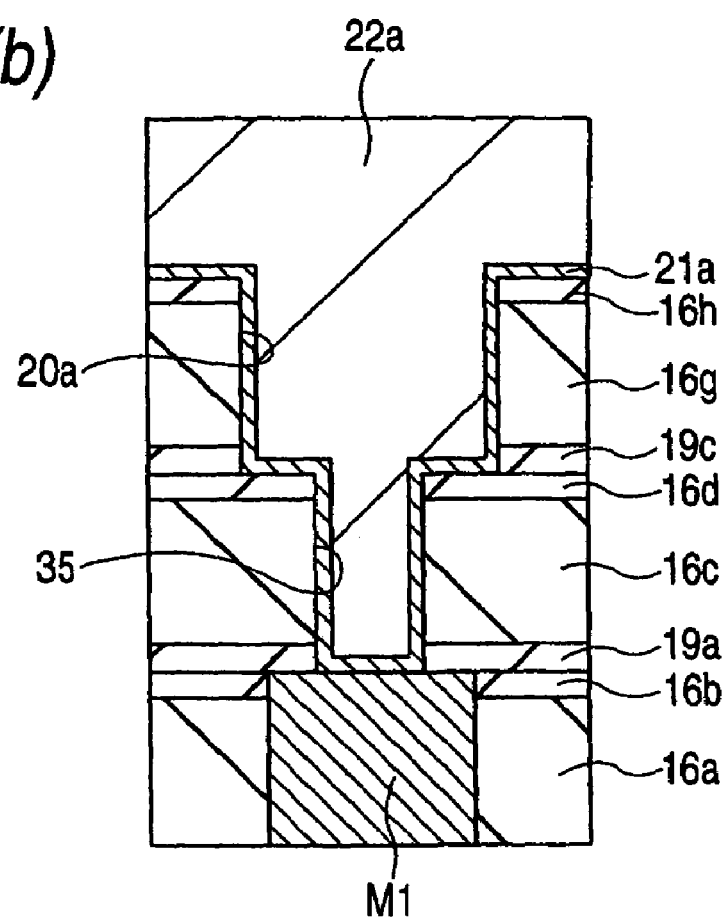

Next, concrete examples of an interconnect structure of the semiconductor integrated circuit device of the present embodiment are shown in FIGS. 71(a) and 71(b), which are sectional views showing an interconnect part of the semiconductor integrated circuit device. FIG. 71(a) shows a part formed by a single damascene technique, and FIG. 71(b) shows a part formed by a dual damascene technique.

It is noted that, in FIGS. 71(a) and 71(b), reference numerals 16g, 16i denote the same material selected from the low-dielectric-constant insulation films as that of an insulation film 16a, while reference numerals 16h, 16j denote the same material as that of the insulation film 16b. Also, FIG. 71(b) exemplifies a case in which, in insulation films 16c, 16d, there is formed a through-hole 35 exposing a part of an upper surface of a first-level interconnect M1. A film 19c is formed, for example, of silicon nitride.

The interconnect width (width of an interconnect trench 20a) and adjacent interconnect spacing (distance between the side surfaces of adjacent interconnects) is, for example, 0.4 μm or smaller. The interconnect width and adjacent interconnect spacing being considered by the present inventors is on a semiconductor integrated circuit device having an interconnect structure, for example, of 0.25 μm or smaller, or 0.2 μm or smaller. The aspect ratio of an interconnect trench 42 is, for example, 1.

Meanwhile, the thickness of a conductive barrier film 21a is, for example, smaller than 10 nm, preferably nearly 6–7 nm. In the present embodiment, even where the film thickness was, for example, 5 nm or the smaller 3 nm, or the even smaller nearly 2 nm, the TDDB characteristic have been improved. The thickness of the conductive barrier film 21a, referred to herein, signifies a surface point to be deposited having the smallest thickness. Namely, because the conductive barrier film 21a in the interconnect opening (interconnect trench 20a or through hole 35) is deposited to the smallest film thickness at the sidewall, the thickness of the conductive barrier film 21a at the sidewall is referred to. Furthermore, in such a case, there are the following two structures, for example. First, on the sidewall in the interconnect opening (including bottom corners of the trench or hole), the conductive barrier film 21a has the smallest thickness equal to the above thickness (e.g. smaller than 10 nm, preferably nearly 6 nm–7 nm, 5 nm or smaller, 3 nm or smaller or nearly 2 nm). Second, on the sidewall in the interconnect opening, the conductive barrier film 21a has the greatest thickness equal to the above thickness (e.g. smaller than 10 nm, preferably nearly 6 nm–7 nm, 5 nm or smaller, 3 nm or smaller or nearly 2 nm).

By forming the conductive barrier film 21a having a thickness of smaller than 10 nm, the conductive barrier film 21a is, in its adhesion to the insulation film 16b, 16c, 16d, 16g, 16h, superior to the copper film, thus preventing the main conductor film 22a from stripping off during CMP processing. Also, a reliable copper interconnect structure can be realized despite the fact that the interconnect resistance increases as compared to the case of not providing a conductive barrier film 21a (to be explained hereinafter). Also, the TDDB characteristic can be improved as compared to the case of not providing a conductive barrier film 21a. It is considered that, where there is no conductive barrier film 21a at all, copper bombards against the sidewall of the interconnect trench 20a so as to react with SiO2 during the formation of a main conductor film 22a with a result that a slight amount of copper occurs. From no deterioration in the TDDB characteristic even after the heating process, it can be considered that the above is due to the affects of a copper ion layer at its slight Cu/SiO$_2$ interface. Consequently, according to the present embodiment, it can be considered that a barrier film 21a that is even smaller than a slight 10 nm serves as a barrier against ionized copper, thereby improving the TDDB characteristic.

Meanwhile, the concentration of the other ingredient than copper of the main conductor film is 0.8 atomic % or less or 0.2 atomic % or less. Also, according to the result of measurement by the present inventors, the concentration of the other ingredient than copper could be reduced, for example, to 0.08 atomic % or less or to a lower 0.05 atomic %, or to an even lower 0.02 atomic % or less. The concentration value of the other ingredient than copper is a value determined at a time when the semiconductor chip is completed, i.e. at a time when the semiconductor chips are cut out of the semiconductor wafer through a wafer process, and a value calculated on the assumption that the other ingredient than copper is diffused into the interconnect by heat generated during the film-forming process for forming an insulation film or metal film after forming the copper interconnect (e.g. for tungsten or the like, heat at about 450° C. is applied during forming of a film). In an actual copper interconnect, it can be considered that the other ingredient than copper distributes in a state such that the concentration is high in an upper layer portion of the copper interconnect (portion the cap film contacts), but gradually decreases toward the center of the copper interconnect. The other ingredient than copper includes, for example, silicon, oxygen, sulfur (sulfur is considered in the case where the copper interconnect is formed by a plating technique) or an arbitrary combination of them.

It is noted that the material of an interlayer insulation film can use a silicon oxide film in place of a low-dielectric-coefficient material, such as the insulation film 16a. Also, a PSG film if used serves to prevent Cu from diffusing, thus further improving the TDDB life. Consequently, the reliability of the semiconductor integrated circuit can be improved even more.

Next, one example of a copper interconnect structure forming method by way of a single damascene process will be described with reference to FIGS. 72(a) to 76(b). Incidentally, FIGS. 72(a) to 76(a) each show a plan view in a process of fabrication of a semiconductor integrated circuit device, while FIGS. 72(b) to 76(b) each show a sectional view on line A—A in the corresponding figure. Also, FIGS. 72(a)–75(a) are plan views, wherein hatching is provided to identify a metal film for easy understanding.

As shown in FIGS. 72(a) and 72(b), first an interconnect trench is formed. A top surface of a plug 18 is exposed at a bottom of the interconnect trench 20a. Subsequently, as shown in FIGS. 73(a) and 73(b), a conductive barrier film 21a, for example, of tantalum is deposited in a depo-film thickness, for example, of nearly 30 nm by a sputtering technique or the like. On this occasion, a conductive barrier film 21a is formed to a film thickness, for example, of smaller than 10 nm, nearly 6 nm–7 nm, at a greatest thickness point or a smallest thickness point on a sidewall of the interconnect trench 20a. It is noted that, the conductive barrier film is herein made of tantalum, but it may be made of titanium nitride (TiN) or by other exemplified film materials.

Thereafter, a main conductor film 422a of copper is deposited in a depo-film thickness, for example, of nearly 300 nm on the conductive barrier film 21a by a sputtering technique. The conditions in this case, for example, are as follows. Pressure is 0.02 Pa, for example, direct-current (DC) power is 10 kW, for example, distance between a target and a substrate 1 is 300 nm–400 nm, for example, and temperature is room temperature, for example.

In this manner, the present embodiment deposits a main conductor film 22a by a sputtering technique, thereby making it possible to reduce the generation of compounds as compared to the CVD technique or plating technique. Also, the target in that case uses oxygen-free Cu having a high purity, for example, of 99.999% (5N) or higher, preferably 99.9999% (6N) or higher. This can make the concentration of copper in the main conductor film 22a being formed, for example, to 99.999% or higher, preferably 99.9999% or higher. Consequently, copper can be deposited with further higher purity.

In depositing a conductive barrier film 21a and main conductor film 22a, the usual sputtering technique is satisfactory. However, a high-directivity sputtering technique may be used, including a long-throw sputtering technique and a collimate sputtering technique. It is possible, in such a case, to improve the coverage of a metal film to an interconnect trench 20a.

Then, a hydrogen anneal process is carried out. This favorably buries the main conductor film 22a in the interconnect trench 20a. The conditions on that occasion are, for example, nearly, 475° C., 3 minutes, 26.6644×10$^2$ Pa, and 500 cm$^3$/min.

Subsequently, the main conductor film 22a and conductive barrier film 21a is removed of extra portions by a similar CMP technique to those explained with reference to the Embodiments 1–7, as shown in FIGS. 74(a) and 74(b), thereby forming a main conductor film 22a. Subsequently, an anti-corrosion process and post-cleaning process are carried out that is similar to that of the foregoing embodiment. Thereafter, as shown by the meshed hatching in FIG. 75(b), a hydrogen plasma process and ammonia plasma process are carried out on a surface of the insulation film 16d and main conductor film 22a, as explained with reference to the Embodiments 1–4.

The ammonia plasma process forms SiH bonds and SiN bonds in a surface region of the insulation film 16d and the like, with a result that the surface region of the insulation film 16d can be improved in film quality, cleanness and electrical stability, thus making it possible to improve the copper-diffusion preventive property. Also, as was explained with reference to the Embodiment 1, the adhesion can be improved to the cap film. Also, copper nitride (CuN) is formed in a surface region of the main conductor film 22a. The copper oxide acts to prohibit silicon and oxygen from bonding to resultingly prevent the formation of copper silicide and copper oxide, making it possible to improve the copper purity. It is therefore possible to prevent copper diffusion and improve the TDDB life. Also, because of the high purity of copper, the resistance of a copper interconnect in a completed semiconductor chip can be decreased according to a purpose thereof. Due to this, the semiconductor integrated circuit device can be improved in performance.

Meanwhile, as a result of SiH formation in a surface region of the insulation film 16d by carrying out the hydrogen plasma process, almost the same effect has been obtained as in the case of the ammonia plasma process. Also, according to a result of experiment by the present inventors, although, in the hydrogen plasma process, copper reacts with nearly several percent of silicon in a later cap-film forming process, leakage current could be greatly reduced as compared to the case of the hydrogen anneal process, nitrogen plasma process or no processing, thus making it possible to improve the TDDB life. Also, the resistance of the copper interconnect could be reduced as compared to the case of a hydrogen anneal process or nitrogen anneal process.

Thereafter, as shown in FIGS. 76(a) and 76(b), an insulation film 19b for a cap film is deposited similarly to the Embodiment 1 or the like. In this manner, an interconnect structure as shown in FIG. 71(a) is obtained.

Next, one example of a copper interconnect structure forming method using a dual damascene technique will be explained with reference to FIG. 77(a) to FIG. 85(b). Also, in each of FIG. 81(a) to FIG. 84(a), hatching is provided to identify a metal film for easy understanding.

First, as shown in FIGS. 77(a) and 77(b), a reflection preventing film 40 is applied onto an insulation film 16h, on which a resist pattern 41 is formed. The photoresist pattern 41, a mask pattern, for example, for forming a planar circular hole, is formed by the usual photolithography technique. Subsequently, as shown in FIGS. 78(a) and 78(b), using the photoresist pattern as a mask, the reflection preventing film 40 in a portion exposed therefrom is etch-removed by a dry etching technique. Furthermore, using an insulation film 19a as an etching stopper, the underlying insulation films 16h, 16g, 16d, 16c are etch-removed by a dry etching technique thereby forming a through-hole 35. In this stage, the insulation film 19a is exposed at the bottom of the through-hole 35.

Next, after the photoresist pattern 41 and reflection preventing film 40 are removed as shown in FIGS. 79(a) and 79(b) by an ashing technique, a reflection preventing film 42 is again applied over the entire surface of the insulation film in a manner as to be buried in the through-hole 35, as shown in FIGS. 80(a) and 80(b). Subsequently, as shown in FIGS. 81(a) and 81(b), a photoresist pattern 43 is formed on the reflection preventing film 42. The photoresist pattern 43 is, for example, a mask pattern for forming an interconnect trench in a planar strip form, which is formed by the usual photolithography technique. Thereafter, as shown in FIGS. 82(a) and 82(b), using the photoresist pattern as a mask, the reflection preventing film 42 in a portion exposed therefrom is etch-removed by a dry etching technique. Furthermore, using an insulation film 19c of silicon nitride or the like as an etching stopper, the insulation films 16h, 16g are etch-removed by a dry etching technique thereby forming an interconnect trench 20a. In this stage, the insulation film 19c is exposed at a bottom of the interconnect trench 20a.

Then, the photoresist pattern 43 and reflection preventing film 42 are removed, as shown in FIGS. 83(a) and 83(b), by an ashing technique or the like, and thereafter the insulation film 19a, 19c in a portion exposed at the bottom of the interconnect trench 20a and through-hole 35 is selectively removed, as seen in FIGS. 84(a) and 84(b). In this etching process, the etching selective ratio of the silicon oxide film and silicon nitride film is sufficiently great to perform etching under a condition that the silicon nitride film is more readily etch-removed than the silicon oxide film. This exposes a part of the insulation film 16d and first-level interconnect M1 at a bottom of the interconnect trench 20a and through hole 35. This is for providing an electrical connection between the first-level interconnect M1 and upper-level buried interconnect. This is also for reducing the interconnect capacitance by decreasing the silicon nitride film (insulation films 19a, 19c), which is higher in dielectric constant than the silicon oxide film, to the extent possible. In this manner, an interconnect trench 20a and through-hole 35 are formed.

Next, as shown in FIGS. 85(a) and 85(b), a conductive barrier film 21a, for example, of tantalum (Ta) is deposited under the same condition as the foregoing by a sputtering technique. On this occasion, a conductive barrier film 21a is formed, e.g. to smaller than 10 nm, nearly 6 nm–7 nm, in a greatest thickness point or a smallest thickness point, on a sidewall of an interconnect trench 20a and through-hole 35. It is noted that, although the conductive barrier film herein is made of Ta, the film may be made of TiN or other exemplified films, as in the foregoing.

Subsequently, a main conductor film 22a is deposited to a depo-film thickness of nearly 50 nm on the conductor barrier film 21a by a sputtering technique. The target in that case is made of oxygen-free copper having a high purity, for example, of 99.999% (5N) or higher, preferably 99.9999% (6N) or higher. This can make the concentration of copper in the main conductor film 22a being formed, for example, 99.999% or higher, preferably 99.9999% or higher. Consequently, copper with high purity can be deposited on a bottom and sidewall of the copper interconnect.

Subsequently, a main conductor film 22a of copper is formed by electroplating technique or the like thereby obtaining a design film thickness of the main conductor film 22a. The condition under which copper is buried in the through-hole 35 by the electroplating technique is, for example, a current density of 0.5–1.0 A/dm$^2$, for nearly 40 seconds. Also, the condition under which copper is buried in the interconnect trench 20a is, for example, a current density of 1.0–2.0 A/dm$^2$, nearly 140 seconds.

Figure 86:
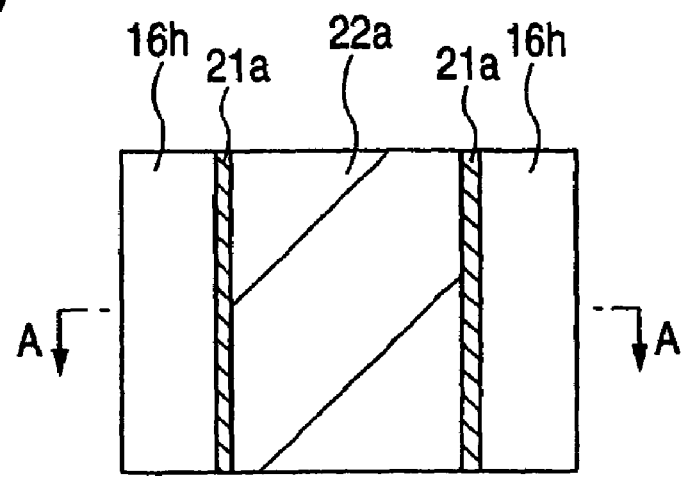
FIG. 86(a) is a plan view showing a step in the fabrication of the semiconductor integrated circuit device following the step of FIG. 85(a)
FIG. 86(b) is a sectional view taken on line A–A' in FIG. 86(a)
Figure 86:
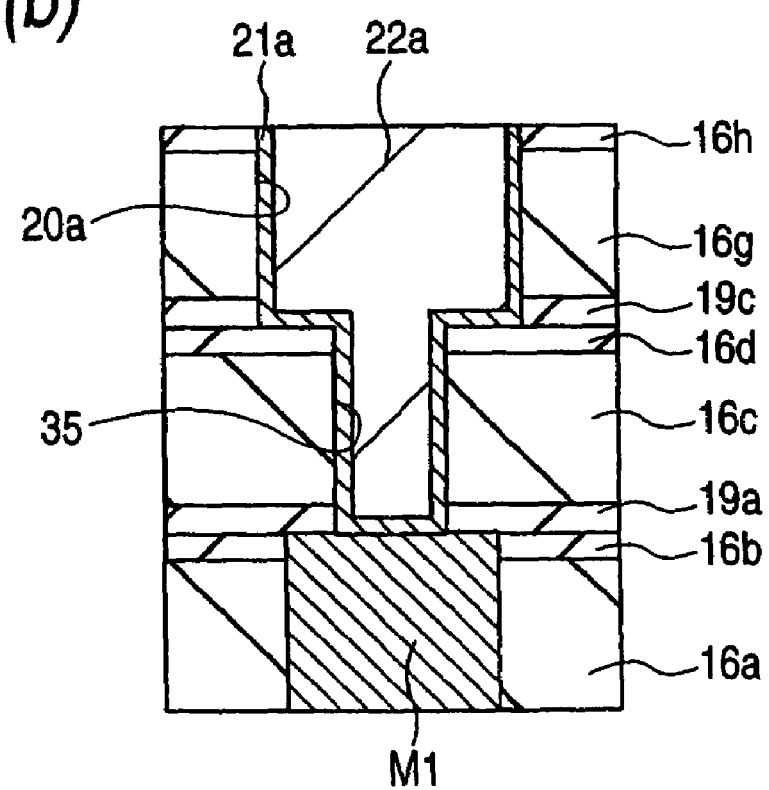
Figure 87:
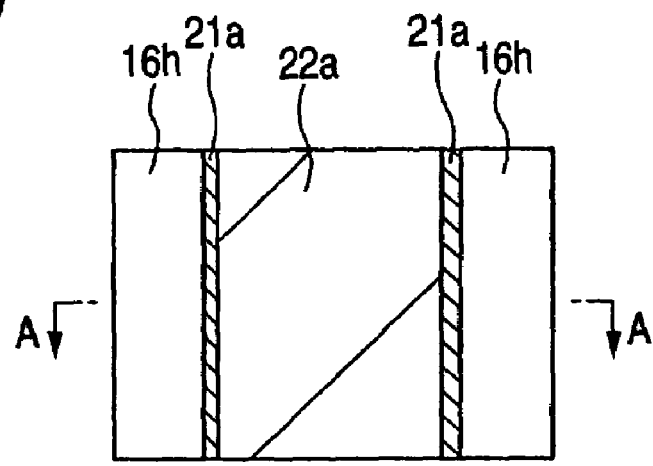
FIG. 87(a) is a plan view showing a step in the fabrication of the semiconductor integrated circuit device following the step of FIG. 86(a)
FIG. 87(b) is a sectional view taken on line A–A' in FIG. 87(a)
Figure 87:
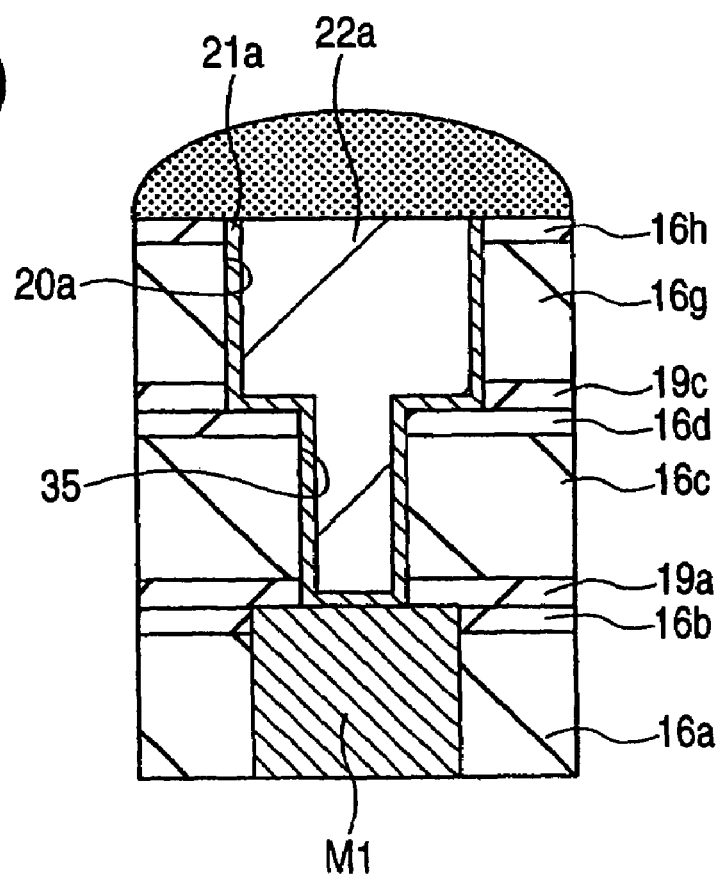

Then, a hydrogen anneal process is carried out similar to the case of the single damascene technique. This process, in some cases, may be omitted. Subsequently, the main conductor film 22a and conductive barrier film 21a is polished by a CMP technique similar to the above, as shown in FIGS. 86(a) and 86(b), thereby removing extra portions, and thereafter an anti-corrosion process and post-cleaning process similar to the above is carried out. Thereafter, as shown by meshed hatching in FIG. 87(b), an ammonia plasma process and hydrogen plasma process, as explained with reference to Embodiments 1–4, is carried out on a surface of the insulation film 16h and buried interconnect 23a. This makes it possible to obtain a similar effect to the case involving the single damascene technique.

Figure 88:
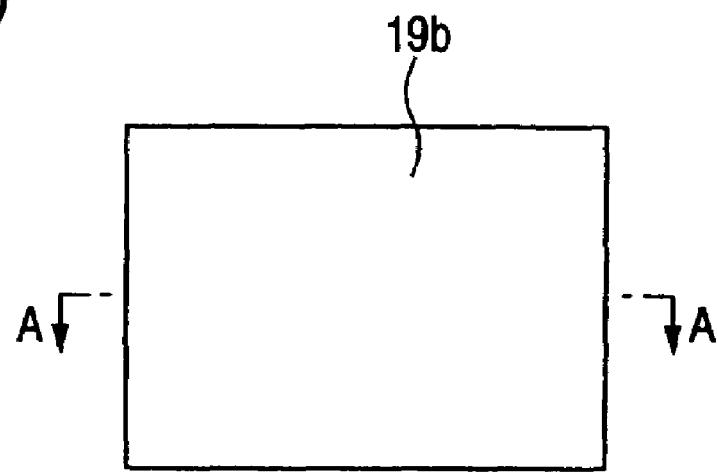
FIG. 88(a) is a plan view showing a step in the fabrication of the semiconductor integrated circuit device following the step of FIG. 87(a)
FIG. 88(b) is a sectional view taken on line A–A' in FIG. 88(a)
Figure 88:
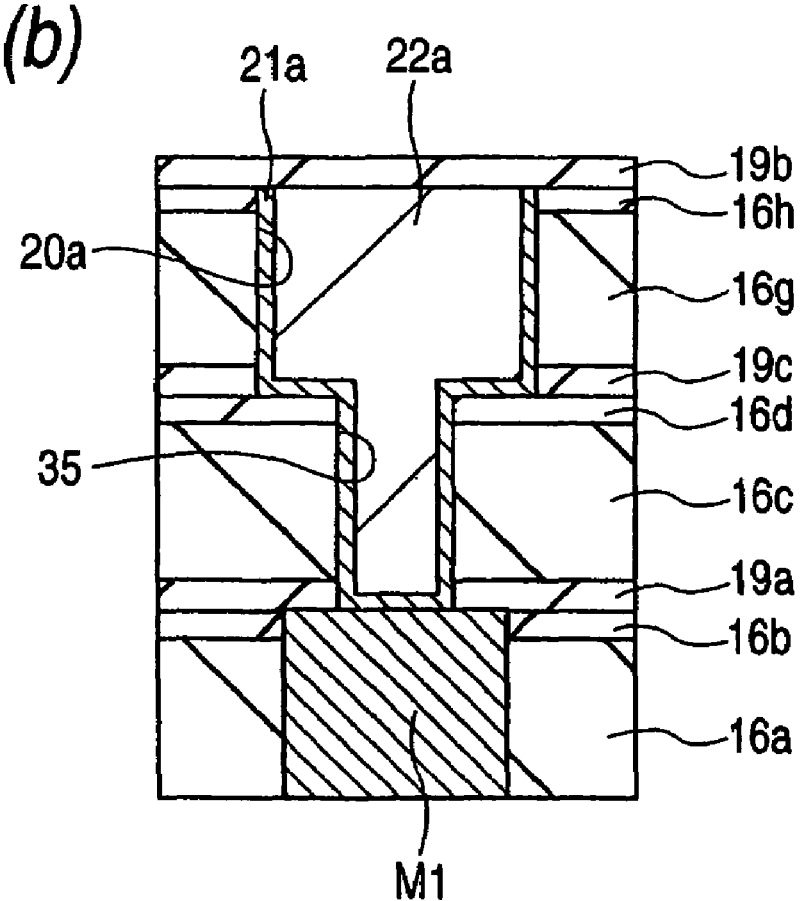

Thereafter, as shown in FIGS. 88(a) and 88(b), an insulation film 19b is deposited similarly to the Embodiment 1 or the like, thus obtaining an interconnect structure as shown in FIG. 71(b).

With the present embodiment as described above, it is possible to obtain, in addition to the effects obtained in the present embodiment, the same effects as were explained with reference to the Embodiments 1–7, and concerning the same structural parts as those of the Embodiments 1–7.

Embodiment 9

Figure 89:
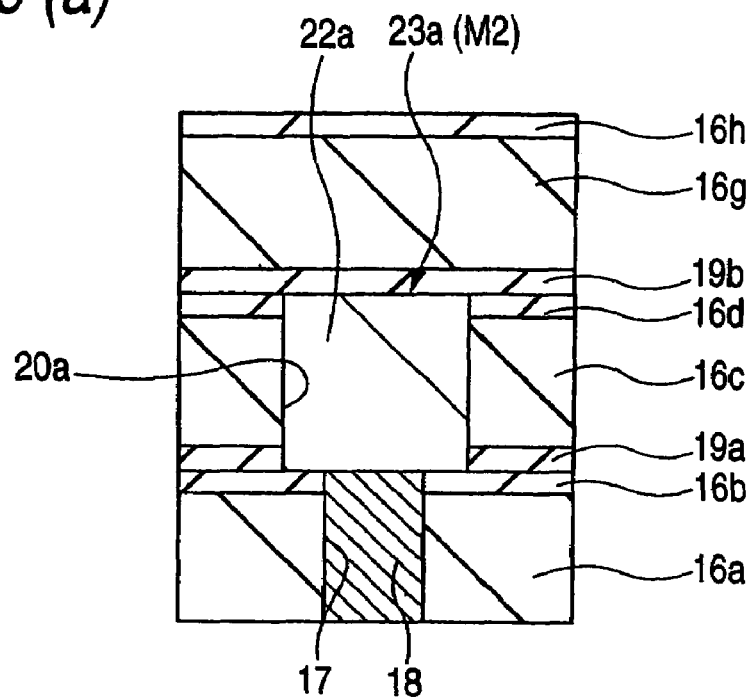
FIGS. 89(a) and 89(b) are sectional views of a copper buried interconnect layer of a semiconductor integrated circuit device according to still another embodiment of the invention.
Figure 89:
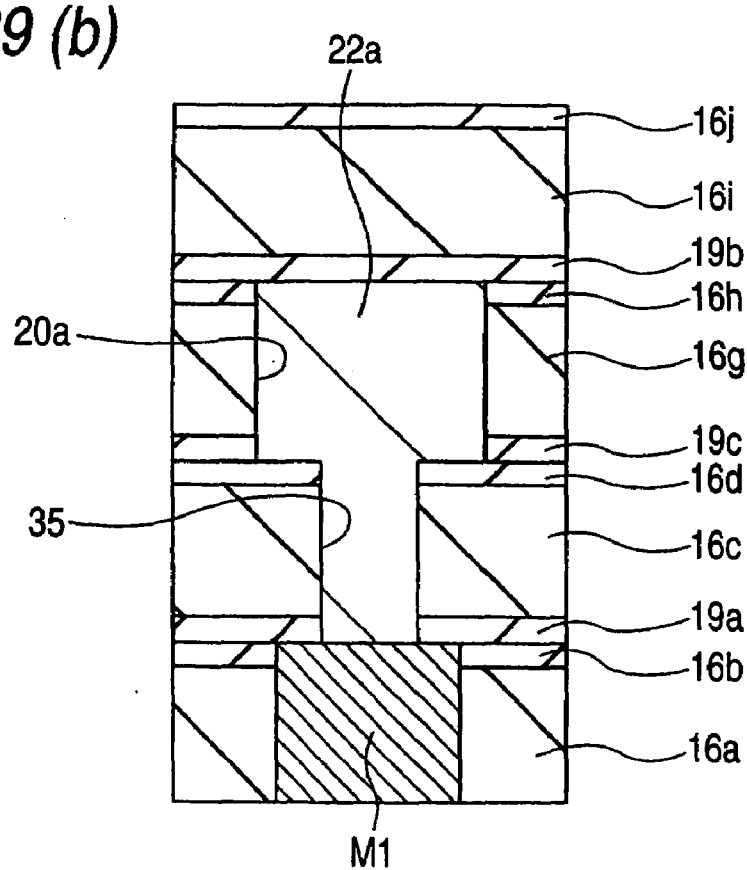

A concrete example of an interconnect structure for a semiconductor integrated circuit device of the present embodiment is shown in FIGS. 89(a) and 89(b). FIG. 89(a) shows a structure formed by a single damascene technique, and FIG. 89(b) shows a structure formed by a dual damascene technique.

In the present embodiment, a conductive barrier film is not formed. Namely, copper only is buried in the interconnect trench 20a or through-hole 35. Consequently, the buried interconnect 23a at its sidewall and bottom is in a state nearly in direct contact with the insulation films 16b–16d. Meanwhile, the concentration and distribution of another ingredient than copper of the buried interconnect 23a is the same as that explained with reference to Embodiment 8. Also, the dimensions, such as the interconnect width (width of the interconnect trench 20a) and adjacent interconnect spacing (distance between the opposed side surfaces of adjacent interconnects) are the same as those indicated with reference to FIGS. 71(a) and 71(b) in the Embodiment 8.

In the present embodiment, the TDDB life could be improved as was explained with reference to Embodiment 8. Accordingly, it is possible to improve the yield and reliability of the semiconductor integrated circuit device. Also, in the present embodiment, a conductive barrier film is not provided, but the main conductor film 22a of copper only is buried in the interconnect trench and through-hole 35, making it possible to greatly improve interconnect resistance. Meanwhile, because direct connection is provided between different-level interconnections without going through a conductive barrier film (Ta, TiN or the like) (although there is shown herein a structure directly connecting between the buried interconnect 23a and the first-level interconnect M1, there are cases where direct connection is effected between different-level copper interconnects), the contact resistance between the different-level interconnects can be greatly decreased, thus making it possible to decrease the resistance through a precise through-hole. Accordingly, even where the interconnect trench 20a and through-hole 35 are scaled down, the semiconductor integrated circuit device can be improved in performance.

The method of forming such a copper interconnect structure is similar to that explained with reference to Embodiment 8. In this case, it is preferred to carry out a hydrogen plasma process, an ammonia plasma process, a plasma process mixed with nitrogen, argon, helium and the like, or a hydrogen plasma process and ammonia plasma process, after the process of forming an interconnect opening (interconnect trench 22a and through-hole 35), as seen in FIG. 72(b) and FIG. 84(b), and before the main conductor film deposition process.

As in the foregoing, where an ammonia plasma process is carried out, SiH bonds and SiN bonds are formed (e.g. thin silicon nitride film to a thickness of smaller than 10 nm is formed) in the surface of the insulation films 16b, 16c, 16d, 16g, 16h (including the inside of the interconnect trench 22a and through-hole 35). Also, where a hydrogen plasma process is carried out, SiH bonds are formed in the surface of the insulation films 16b, 16c, 16d, 16g, 16h (including the inside of the interconnect trench 22a and through-hole 35). This can improve the film quality, the cleanness and the electrical stability in the upper surface of the insulation films 16d, 16h and surface region of the insulation films 16d, 16c, 16h, 16g in an inside of the interconnect trench 20a and through-hole 35, as was explained with reference to Embodiment 7, thus improving the diffusion preventing property of copper. Meanwhile, similar to the explanation of Embodiment 1, it is also possible to improve the adhesion between the insulation films 16d, 16h and the cap film (insulation film 19b). Incidentally, as was explained with reference to Embodiment 7, the nitride film (in this case WN film) formed in the first-level interconnect M1 may be removed by carrying out an ammonia plasma process and then lightly carrying out a dry etching process. In the case of adopting such a method, the buried interconnect 23a at its sidewall and bottom is made in a state in direct contact with a thin silicon nitride film formed in the interconnect trench 20a and through-hole 35.

In the present embodiment, it is possible to obtain the following effects, in addition to the effects obtained by the structures of the Embodiments 1–8. Namely, due to the absence of a conductive barrier film, it is possible to greatly decrease the resistance of the copper buried interconnect 23a and the contact resistance at a connect point between different-level interconnections. Therefore, the semiconductor integrated circuit device can be improved in performance.

In the above, although the invention by the present inventors was concretely explained by way of various embodiments thereof, it is needless to say that the invention is not limited to the embodiments, but may be modified in various ways within a range not departing from the gist thereof.

In the foregoing description, an example was given of the case in which continuous formation is carried out without breaking the vacuum after carrying out post-processing (plasma-processing) of the cap film. However, a cap film may be formed after once breaking the vacuum after the post-process. Although a greater effect of the invention is achieved without breaking the vacuum, a thin nitride layer is formed by an ammonia plasma process in the post process so that the formation of an oxide layer can also be suppressed by breaking the vacuum for exposure to the air. Accordingly, even where vacuum breakage is carried out, it is possible to provide the effect of the embodiment to a certain extent.

The above explanations were directed to the case in which the invention made by the present inventors is applied to the CMIS-LSI art as a background utilization field thereof. However, the invention is not limited to that art, but can be applied also, for example, to a semiconductor integrated circuit device having a memory circuit, such as a DRAM (Dynamic Random Access Memory), an SRAM (Static Random Access Memory), a flash memory (EEPROM; Electrically Erasable Programmable Read Only Memory) and an FRAM (Ferroelectric Random Access Memory), a semiconductor integrated circuit device having a logic circuit, such as a microprocessor, or a hybrid semiconductor integrated circuit device having a memory circuit and a logic circuit on the common semiconductor substrate. The invention is applicable to a method of fabrication of a semiconductor integrated circuit device, a semiconductor device, an electronic circuit device, an electronic device or a micromachine having at least a microscopic copper interconnect structure.

The effects obtained by the typical ones of the features disclosed in the present Application, if briefly explained, include the following.

(1) The present invention includes a step of carrying out a plasma process on a semiconductor substrate in a hydrogen gas atmosphere and a step of carrying out a plasma process on the semiconductor substrate in an ammonia gas atmosphere, after forming, by a polishing technique, an interconnect, including copper as a main conductor layer in an interconnect opening formed in a first insulation film on the semiconductor substrate, but before depositing a second insulation film on the first insulation film and interconnect. This makes it possible to improve the dielectric breakdown strength between the interconnects having copper in their main conductor layers.

(2) The present invention has a step of carrying out a plasma process on a semiconductor substrate in a hydrogen gas atmosphere and a step of carrying out a plasma process on the semiconductor substrate in an ammonia gas atmosphere, after forming, by a polishing technique, an interconnect, including copper as a main conductor layer, in an interconnect opening formed in a first insulation film on the semiconductor substrate, but before depositing a second insulation film on the first insulation film and interconnect. This makes it possible to prevent or suppress silicide or copper oxide from being formed on the interconnect. Accordingly, it is possible to prevent an increase in the resistance of the interconnect having copper in a main conductive layer thereof.

(3) The present invention has a step of carrying out a plasma process on a semiconductor substrate in a hydrogen gas atmosphere and a step of carrying out a plasma process on the semiconductor substrate in an ammonia gas atmosphere, after forming, by a polishing technique, an interconnect, including copper as a main conductor layer, in an interconnect opening formed in a first insulation film on the semiconductor substrate, but before depositing a second insulation film on the first insulation film and interconnect. This makes it possible to improve the adhesion between the interconnect having copper in a main conductor layer thereof and the cap film.

(4) The present invention has a step of carrying out on a semiconductor substrate a cleaning process using an alkali solution, a deoxidizing process and a cleaning process using the acid solution in sequential order, and a step of depositing a second insulation film on the first insulation film and interconnect, after forming, by a polishing technique, an interconnect, including copper as a main conductor layer, in an interconnect opening formed in a first insulation film on the semiconductor substrate. This makes it possible to deoxidize, before acid cleaning, the copper oxide formed in an interconnect-exposed region during a polishing process or the like. Accordingly, it is possible to prevent an increase in the resistance of an interconnect having copper in a main conductor layer thereof.

What is claimed is:

1. A fabrication method of a semiconductor integrated circuit device, comprising the steps of:

(a) forming a first insulation film over a major surface of a wafer;

(b) forming an interconnect groove in an upper surface of said first insulation film;

(c) depositing a metal layer containing copper as its principal component over the upper surface of said first insulation film and inside said interconnect groove;

(d) removing the metal layer outside the interconnect groove by chemical mechanical polishing so as to leave a metal interconnect in the interconnect groove;

(e) after step (d), carrying out organic acid cleaning treatment to the upper surface of said first insulation film and an upper surface of said metal interconnect;

(f) after step (e), carrying out hydrogen anneal treatment to the upper surface of said first insulation film and the upper surface of said metal interconnect;

(g) after step (f), carrying out plasma treatment in a gas atmosphere including an ammonia gas to the upper surface of said first insulation film and the upper surface of said metal interconnect; and (h) depositing an insulation copper diffusion barrier film by plasma chemical vapor deposition on the upper surface of said first insulation film and the upper surface of said metal interconnect treated by said organic acid cleaning treatment, said hydrogen anneal treatment and said plasma treatment.

2. A fabrication method of a semiconductor integrated circuit device according to claim 1, wherein said metal layer is deposited by a plating technique.

3. A fabrication method of a semiconductor integrated circuit device according to claim 1, wherein said first insulation film is an insulation film having a low dielectric constant not larger than 3.

4. A fabrication method of a semiconductor integrated circuit device according to claim 1, wherein said insulation copper diffusion barrier film is formed continuously without releasing to the air after step (g).

5. A fabrication method of a semiconductor integrated circuit device according to claim 1, wherein said insulation copper diffusion barrier film is a silicon nitride film or silicon carbide film.

6. A fabrication method of a semiconductor integrated circuit device according to claim 1, wherein citric acid is applied to the upper surface of the first insulation film and the upper surface of said metal interconnect during said organic acid cleaning treatment.

7. A fabrication method of a semiconductor integrated circuit device according to claim 1, wherein a mixture of organic acid and hydrogen fluoride is applied to the upper surface of the first insulation film and the upper surface of said metal interconnect during said organic acid cleaning treatment.

8. A fabrication method of a semiconductor integrated circuit device according to claim 1, wherein in said organic acid cleaning treatment any damaged layer in the upper surface is removed.

9. A fabrication method of a semiconductor integrated circuit device according to claim 1, further comprising the step of:

(i) carrying out a reducing process after step (d) and before step (e).

10. A fabrication method of a semiconductor integrated circuit device according to claim 9, wherein said reducing process carries out a heating process to the major surface of the wafer in a hydrogen gas atmosphere.

11. A fabrication method of a semiconductor integrated circuit device according to claim 9, wherein said reducing process carries out a hydrogen gas plasma process to the major surface of the wafer.

12. A fabrication method of a semiconductor integrated circuit device according to claim 9, wherein said reducing process carries out an ammonia gas plasma process to the major surface of the wafer.

* * * * *